United States Patent
Kang

[11] Patent Number: 6,091,623
[45] Date of Patent: Jul. 18, 2000

[54] SPLIT WORD LINE FERROELECTRIC MEMORY

[75] Inventor: Hee Bok Kang, Daejeon-si, Rep. of Korea

[73] Assignee: LG Semicon Co., Ltd., Cheongju, Rep. of Korea

[21] Appl. No.: 09/229,992

[22] Filed: Jan. 14, 1999

Related U.S. Application Data

[63] Continuation-in-part of application No. 09/210,783, Dec. 15, 1998, which is a continuation-in-part of application No. 09/187,735, Nov. 9, 1998, which is a continuation-in-part of application No. 09/055,985, Apr. 7, 1998.

[30] Foreign Application Priority Data

| Dec. 12, 1997 | [KR] | Rep. of Korea | 97-68192 |
| Apr. 22, 1998 | [KR] | Rep. of Korea | 98-14400 |
| May 13, 1998 | [KR] | Rep. of Korea | 98-17212 |
| May 26, 1998 | [KR] | Rep. of Korea | 98-19068 |

[51] Int. Cl.[7] .................................................. G11O 11/22
[52] U.S. Cl. ............... 365/145; 365/230.03; 365/185.23
[58] Field of Search .............................. 365/145, 230.03, 365/185.23, 149

[56] References Cited

U.S. PATENT DOCUMENTS

| 4,433,390 | 2/1984 | Carp et al. | 364/900 |
| 4,873,664 | 10/1989 | Eaton, Jr. | 365/145 |
| 4,888,630 | 12/1989 | Paterson | 357/23.5 |
| 4,928,095 | 5/1990 | Kawahara | 340/784 |
| 5,148,401 | 9/1992 | Sekino et al. | 365/230.03 |
| 5,371,699 | 12/1994 | Larson | 365/145 |
| 5,373,463 | 12/1994 | Jones, Jr. | 365/145 |
| 5,608,667 | 3/1997 | Osawa | 365/145 |
| 5,638,318 | 6/1997 | Seyyedy | 365/145 |
| 5,680,344 | 10/1997 | Seyyedy | 365/145 |
| 5,706,245 | 1/1998 | Kim | 365/230.06 |
| 5,753,946 | 5/1998 | Naiki et al. | 365/145 |
| 5,768,182 | 6/1998 | Hu et al. | 365/145 |
| 5,815,430 | 9/1998 | Varhaeghe et al. | 365/145 |
| 5,903,492 | 5/1999 | Takashima | 365/145 |
| 5,917,746 | 6/1999 | Seyyedy | 365/145 |

*Primary Examiner*—David Nelms
*Assistant Examiner*—Tuan T. Nguyen
*Attorney, Agent, or Firm*—Fleshner & Kim, LLP

[57] ABSTRACT

SWL(Split Word Line) ferroelectric memory, is disclosed, which has no plate lines, including a cell array having a plurality of split wordlines and a plurality of bitlines for storing a data, an SWL driver for driving each of the split wordlines in the cell array, a plurality of sense amplifier blocks for sensing the data on each of the bitlines in the cell array, and an input/output bus controller for interfacing the sense amplifier blocks and data buses for outputting the data in each of the sense amplifier blocks and inputting the data intended to write.

18 Claims, 54 Drawing Sheets

E : electric field
P : polarity ferroelectric capacitor reference voltage

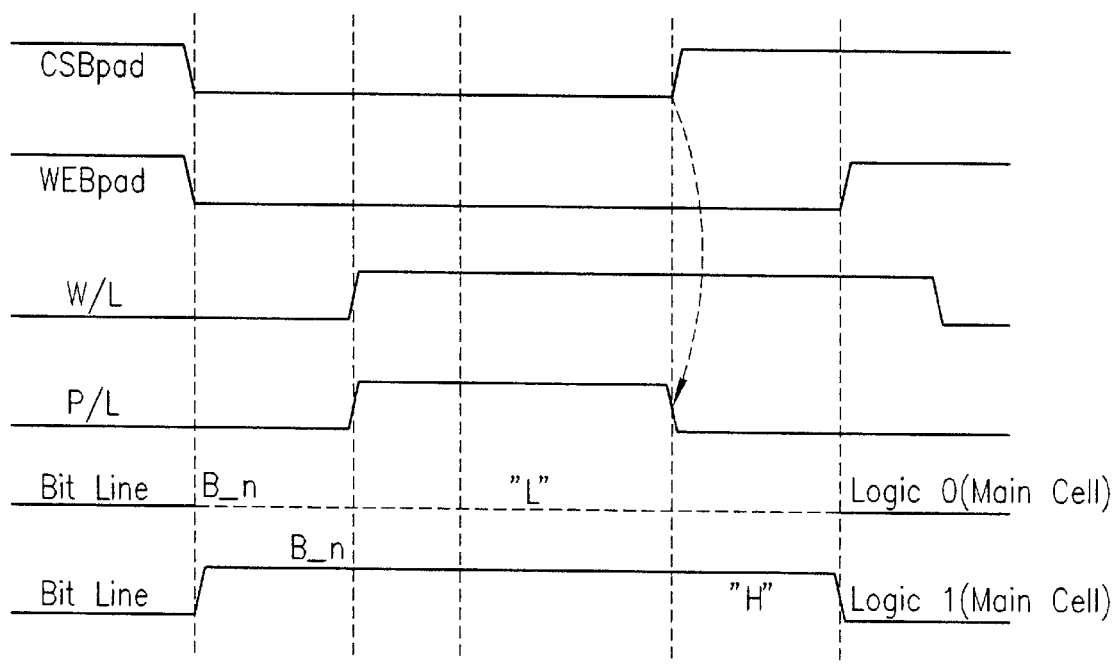

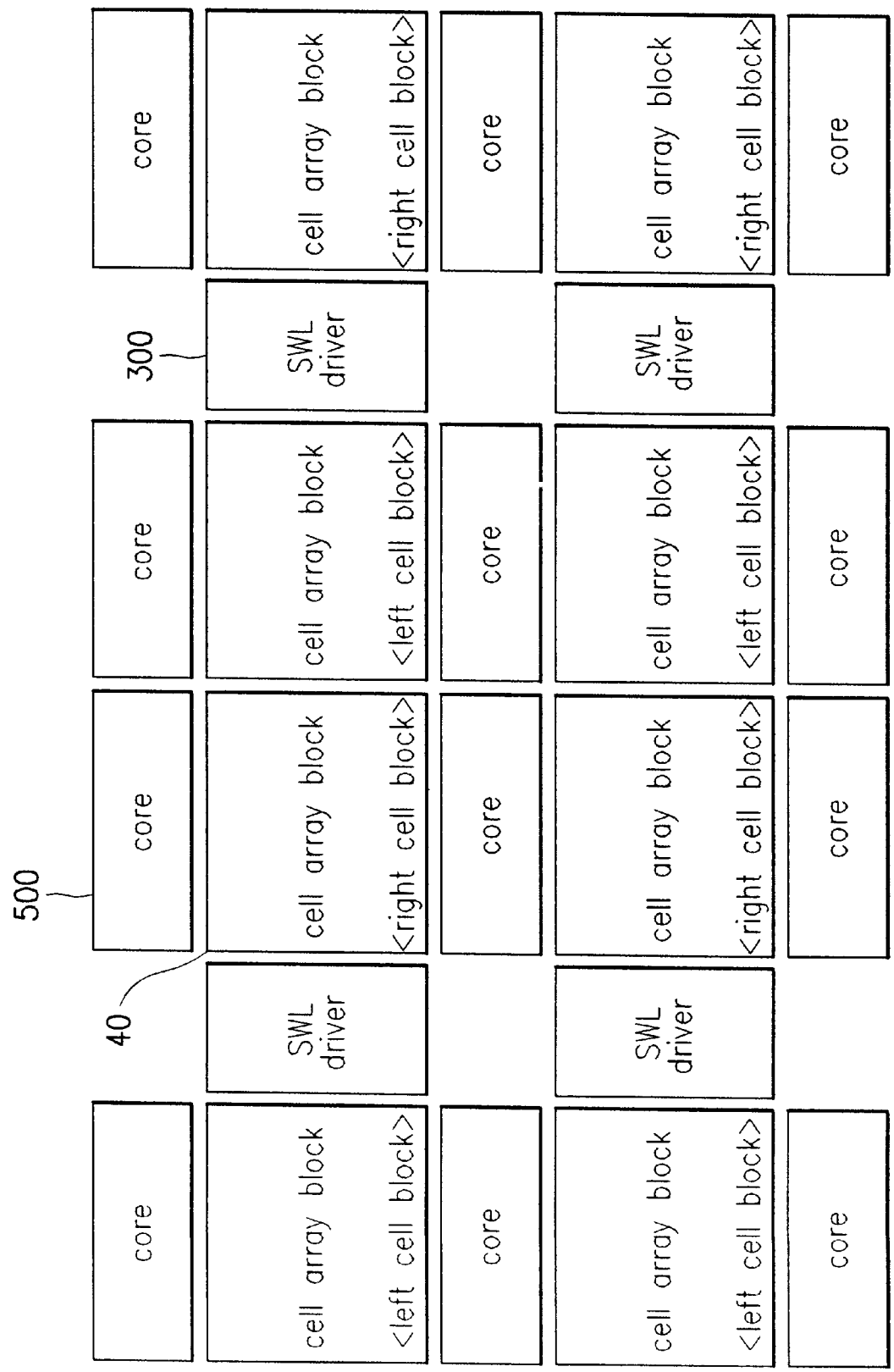

SPLIT WORD LINE FERROELECTRIC MEMORY

This application is a continuation-in-part (CIP) prior of application Ser. No. 09/210,783, filed Dec. 15, 1998, which is a CIP of application Ser. No. 09/187,735, filed Nov. 9, 1998 which is a CIP of application Ser. No. 09/055,985, filed Apr. 7, 1998.

BACKGROUND OF THE INVENTION

1. Field of the Invention

The present invention relates to a non-volatile ferroelectric memory, and more particularly to an SWL(Split Word Line) ferroelectric memory without plate lines and a circuit for driving the same.

2. Discussion of the Related Art

Ferroelectric random access memory(FRAM) having a data processing speed as fast as DRAM which is generally used as a semiconductor memory and for conserving data even at turn off of power is paid attention as a memory of the next generation. Alike the DRAM, the FRAM uses capacitors as memory cells, but with capacitors of a ferroelectric substance for utilizing the characteristic of a high residual polarization of the ferroelectric substance in which data is not cleared off even after clearing off of an electric field applied thereto.

FIG. 1a illustrates a general hysteresis loop of a ferroelectric substance, and FIG. 1b illustrates a structure of a unit capacitor in a background art ferroelectric memory.

Referring to FIG. 1a, it can be known that a polarization induced by an electric field is, not vanished, but remained of a certian portion("d" or "a" state) even after clear off of the electric field due to existence of a spontaneous polarization. These "d" and "a" states may be matched to "1" and "0", for being utilized as a memory cell. In other words, referring to FIG. 1b, the state in which a positive voltage is applied to a node 1 is a state of "c" in FIG. 1a, the state in which no voltage is applied to the node 1 is a state of "d". Opposite to this, if a negative voltage is applied to the node 1, the state moves from "d" to "f". If no voltage is applied to the node 1, the state moves to "a", and, if a positive voltage is applied again, the states moves to "c" via "b". At the end, even if there is no voltage applied on both ends of a capacitor, a data can be stored in stable states of "a" and "b". On the hysteresis loop, "c"–"d" state is a state of logic value "1", and "a"–"f" state is a state of logic value "0".

In reading a data from the capacitor, the "d" state is canceled to read the data stored in the capacitor. In a background art, a sense amplifier is used for reading a data using a voltage generated in a reference voltage generator and a voltage generated in a main cell arry. In a ferroeletric reference cell, two modes of "1" polarity and "0" polarity are used for generating a reference voltage on a reference bit line. Accordingly, the sense amplifier compares a bit line voltage on a main cell and a reference bit line voltage on a reference cell, to read information in the main cell. By rewriting the read data within the same cycle, the canceled data can be recovered.

A background art FRAM will be explained with reference to the attached drawings. There are IT/IC FRAM having a transistor and a capacitor in a unit cell and 2T/2C FRAM having two transistors and two capacitors. FIG. 2 illustrates a background art 1T/IC FRAM cell array.

Referring to FIG. 2, the background art 1T/IC FRAM cell array is provided with a plurality of wordlines W/L arranged in one direction spaced at fixed intervals, a plurality of platelines P/L arranged between wordlines in parallel thereto, and a plurality of bitlines B1, - - - , Bn arranged in a direction vertical to each of the wordlines W/L and the platelines P/L spaced at fixed intervals. Each of the transistors in a unit memory cell has a gate electrode connected to one of the wordlines W/L, a source electrode connected an adjacent bitline B/L, and a drain electrode connected to a first electrode of the capacitor and a second electrode of the capacitor connected to an adjacent plateline P/L.

A driving circuit and operation of the aforementioned background art 1T/1C FRAM will be explained. FIGS. 3a and 3b together illustrate a circuit for driving the background art 1T/1C FRAM, FIG. 4a illustrates timings of signals provided for explaining a writing on the background art 1T/1C FRAM cell, and FIG. 4b illustrates timings of signals provided for explaining a reading from the background art 1T/1C FRAM cell.

The circuit for driving the background art 1T/1C FRAM is provided with a reference voltage generating part 1 for generating a reference voltage, a reference voltage stabilizing part 2 having a plurality of transistors Q1~Q4 and a capacitor C1 for stabilzing a reference voltage on two adjacent bitlines B1 and B2 because the reference voltage from the reference voltage generating part 1 can not be provided to a sense amplifier directly, a first reference voltage storage part 3 having a plurality of transistors Q6~Q7 and capacitors C2~C3 for being in storage of a logic value "1" and a logic value "0" in adjacent bit lines, a first equalizing part 4 having a transistor Q5 for equalizing adjacent two bitlines, a first main cell array part 5 having a plurality of transistors Q8, Q9, - - - , and ferroelectric capacitors C5, C6, - - - , connected to wordlines W/L and platelines P/L for storing data, a first sense amplifier part 6 having a plurality of transistors Q10~Q15 and P-sense amplifiers PSA for sensing a data in a cell selected by the wordline from the plurality of cells in the main cell array part 5, a second main cell array part 7 having a plurality of transistors Q26, Q27, - - - , and capacitors C7, C8, - - - , connected to wordlines and platelines different from one another for storing data, a second reference voltage storage part 8 having a plurality of transistors Q28~Q29 and capacitors C9~C10 for being in storage of a logic value "1" and a logic value "0" in adjacent bit lines, and a second sense amplifier part 9 having a plurality of transistors Q16~Q25 and N-sense amplifiers NSA for sensing a data in the second main cell array part 7.

The operation of the aformementioned background art 1T/1C FRAM will be explained. A writing mode and a reading mode will be explained, separately.

Referring to FIG. 4a, in the writing mode, upon enabling a CSBpad signal, a chip enable signal, from "high" to "low" externally, a writing mode enable signal WEBpad also transits from "high" to "low", to begin the writing mode. And, address decoding is begun, to transit from "low" to "high" on a selected line to select a cell. During the wordline is held at "high", a corresponding plateline P/L is applied of an interval of "high" signal and an interval of "low" signal in a sequence. And, for writing a logic "1" or "0" on the selected cell, "high" or "low" signal is applied to a corresponding bitline synchronous to the writing enable signal. Namely, if "high" signal is applied to the bitline for writing a logic value "1" the logic value "1" is written on the ferroelectric capacitor within an interval of the wordline being "high" at a time when the plateline signal is "low", and for writing logic value "0", if a "low" signal is applied to the bitline, a logic value "0" is written in the ferroelectric capacitor when the plateline signal is "high". Thus, either a logic value "1" or a logic value "0" is written.

The reading operation is carried out as follows.

Referring to FIG. 4b, when CSBpad signal, a chip enable signal, is enabled from "high" to "low" externally, before selection of a corresponding wordline, all bitlines are equalized to "low" by an equalizer signal. That is, in FIG. 3, when "high" signal is applied to the equalizer part 4 and "high" signal is applied to transistors Q19 and Q20, grounding the bitlines through the transistors Q19 and Q20, the bitlines are equalized to "low". Transistors Q5, Q19 and Q20 are turned off, disabling corresponding bitlines, and address is decoded for transiting a corresponding wordline from "low" to "high", to select a corresponding cell. Then, a "high" signal is applied to a plateline of the selected cell, to cancel data corresponding to a logic value "1" stored in an FRAM. If the FRAM is in storage of a logic value "0", a data corresponding to it will not be canceled. A cell with a canceled data and a cell with a data not canceled provide signals different from each other according to the aforementioned hysteresis loop principle. Data provided through bitline is sensed by the sense amplifier of a logic value "1" or "0". That is, referring to FIG. 1, since the case of a canceled data is a case when a state is changed from "d" to "f", and the case of a data not canceled is a case when a state is changed from "a" to "f", if the sense amplifier is enabled after a certain time, in the case of the canceled data, the data is amplified to provide a logic value "1", and, in the case of the data not canceled, the data is amplified to provide a logic value "0". After the sense amplifier amplifies and provides a signal, since the cell should be recovered of an original data, during "high" is applied to a corresponding line, the plateline is disabled from "high" to "low".

However, in the background art 1T/1C FRAM, in which the reference cell is operative more than the main memory cell, the reference cell degrades rapidly, providing an unstable reference voltage. And, regulating of the reference voltage by using a voltage regualting circuit is also not stable as it influced from an external power characteristic and noise. The one that is suggested considering all practically applicable solutions(an extent of development of substitutional electrode materials, a device packing density, a stability of ferroelectric thin film, an operational reliability and etc.,) in place of the background art 1T/1C FRAM having the aforementioned problems, is the 2T/2C FRAM.

FIG. 5 illustrates an array of the background art 2T/2C FRAM cells, FIG. 6a illustrates timings of different signals provided for explaining a writing on the background art 2T/2C FRAM cell, and FIG. 6b illustrates timings of different signals provided for explaining a reading from the background art 2T/2C FRAM cell.

Referring to FIG. 5 the array of the background art 2T/2C FRAM cells is provided with a plurality of wordlines W/L arranged in one direction spaced at fixed intervals, a plurality of platelines P/L arranged parallel to the wordlines between each of the wordlines W/L, and a plurality of bitlines and bitbarlines B1, BB1, B2, BB2 arranged in succession and in a direction vertical to each of the wordlines W/L and the platelines P/L spaced at fixed intervals. And, gate electrodes of the two transistors in a unit memory cell are connected to an adjacent wordline W/L in common, source electrodes of the transitors are connected to an adjacent bitline B and bitbarline BB respectively, and drain electrodes of the transistors are connected to first electrodes on two capacitors respectively, while second electrodes of the capacitors are connected to an adjacent plateline P/L in common.

A driving circuit and operation of the array of the background art 2T/2C FRAM cells will be explained.

Different from the array of the background art 1T/1C FRAM cells, the array of the background art 2T/2C FRAM cells writes and reads a logic value "1" or "0". That is, referring to FIG. 6a, in a writing mode, when a CSBpad signal, a chip enable signal, is transited from "high" to "low" externally, the array is enabled, and, on the same time, a writing mode enable signal WEBpad is also transits from "high" to "low", to provide "high" and "low" or "low" and "high" signals to the bitline and the bitbarline according to a logic value intended to write. Then, an address decoding is begun to transit a wordline of a seclected cell from "low" to "high", to select the cell. Within an interval in which the wordline is held at "high", a corresponding plateline P/L is applied to a fixed interval of "high" signal and a fixed interval of "low" signal in successon. That is, for writing a logic value "1", "high" signal is applied to a bitline B-n and "low" signal is applied to a bitbarline BB-n, and for writing a logic value "0", "low" signal is applied to a bitline B-n and "high" signal is applied to a bitbarline BB-n. Thus, either a logic value "1" or a logic value "0" is written.

The operation for reading a data from the cell will be explained.

Referring to FIG. 6b, when a CSBpad signal, a chip enable signal, is transited from "high" to "low" externally, a read mode is enabled. That is, a write mode enable signal WEBpad is transisted from "low" to "high", finishing the write mode and enabling a read mode. Before selection of a required wordline, all bitlines are equalized to "low" by an equalizer signal identical to the operation of the 1T/1C FRAM shown in FIG. D3. After completion of the equalizing to "low", address is decoded to transit a signal on the required wordline from "low" to "high", selecting a wanted cell. And, "high" signal is applied to a plateline of the selected cell to cancel a data on the bitline or the bitbarline. That is, if a logic value "1" is written, a data in a capacitor connected to the bitline will be canceled, and if a logic value "0" is written, a data in a capcitor connected to the bitbarline will be canceled. Thus, depending on the data canceled of the data on the bitline or on the bitbarline, a value different from each other is provided according to the hysteresis loop principle. When the data provided through either bitline or the bitbarline is sensed by the sense amplifier, the data value will be either logic "1" or logic "0". After the sense amplifier amplifies and provides the data, since the cell should have the data recovered, during the required wordline is applied of "high", the plateline is disabled from "high" to "low".

The background art FRAMs and circuits for driving the same have the following problems.

First, despite of the advantage of data conservation even after power turn off, the cell plate line required separately in the FRAM causes a complicated lay-out as well as a complicated fabrication process, that is a disadvantage in a mass produciton.

Second, the reception of control signals of the wordlines and the plateline different from each other in data reading and writing coming from the use of a separate plateline degrades an efficiency as a memory device due to a difference of signal paths.

Third, the use of one reference cell in reading a few hundreds of main memory under a state properties of the ferroelectric film is not perfectly secured, resulting in much more operation of the reference cell, causes a rapid degradation of the reference cell, that leads to have an unstable reference voltage.

Fourth, the generation of a reference voltage by means of a voltage regulating circuit is not stable because the reference voltage is influenced from external power source characteristic and may be deteriorated by external noises.

Fifth, with the use of CSBpad(chip selection signal) only in enabling a ferroelectric memory, a fast access can not be achieved.

SUMMARY OF THE INVENTION

Accordingly, the present invention is directed to an SWL ferroelectric memory and a circuit for driving the same that substantially obviates one or more of the problems due to limitations and disadvantages of the related art.

An object of the present invention is to provide an SWL ferroelectric memory and a circuit for driving the same which is not provided with cell plateline.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the SWL ferroelectric memory includes a cell array having a plurality of split wordlines and a plurality of bitlines for storing a data, an SWL driver for driving each of the split wordlines in the cell array, a plurality of sense amplifier blocks for sensing the data on each of the bitlines in the cell array, and an input/output bus controller for interfacing the sense amplifier blocks and data buses for outputting the data in each of the sense amplifier blocks and inputting the data intended to write.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIG. 4a illustrates a timing diagram for explaining a write on the background art 1T/1C FRAM cell;

FIG. 7 illustrates a system block diagram of an array of SWL ferroelectric memory cells in accordance with a preferred embodiment of the present invention;

DETAILED DESCRIPTION OF THE PREFERRED EMBODIMENT

Reference will now be made in detail to the preferred embodiments of the present invention, examples of which are illustrated in the accompanying drawings. FIG. 7 illustrates a block diagram of an overall system of a ferroelectric memory in accordance with a preferred embodiment of the present invention, schematically.

Referring to FIG. 7, the ferroelectric memory chip of the present invention, at large, includes SWL drivers each 300 for driving split word lines, cell arrays for storing data, and cores 500 each having a sense amplifier block for sensing data and an input/output bus controller for interfacing an external dataline with the sense amplifier block. The cell arrays 400 are arranged on left and right sides of an SWL driver with the SWL driver at the center, and the cores 500 are arranged between cell arrays in up and down direction.

Figure 1A:
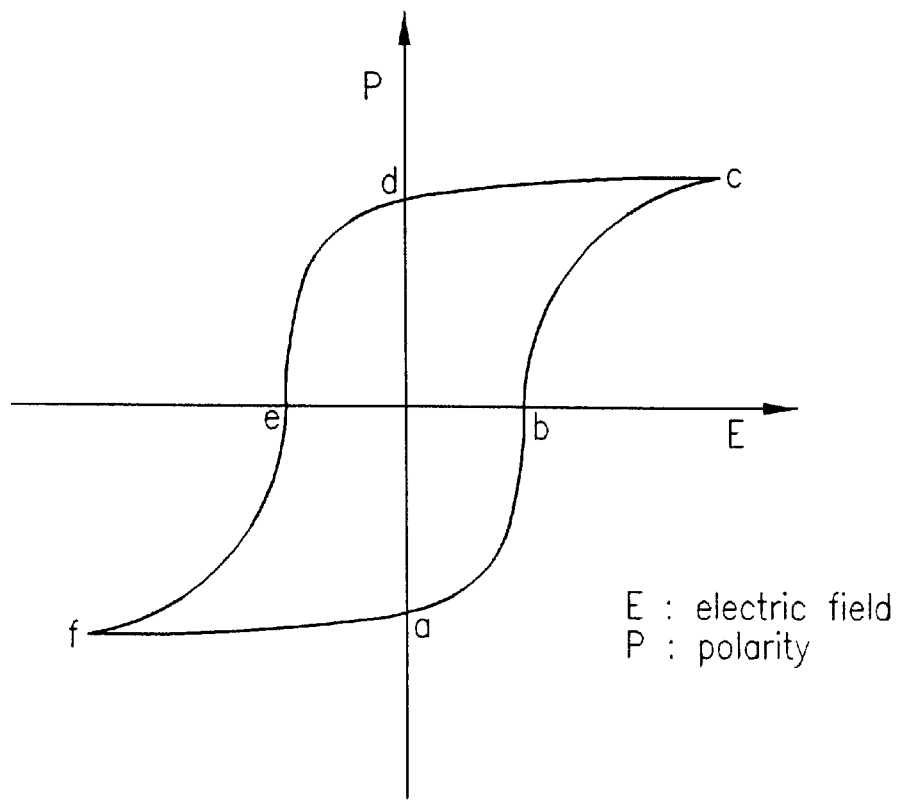
FIG. 1a illustrates a general hysteresis loop of a ferroelectric substance.
Figure 1B:
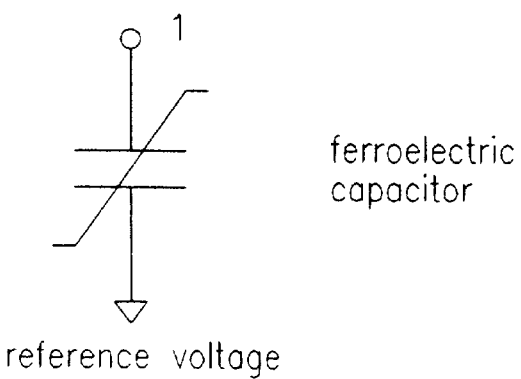
FIG. 1b illustrates a structure of a unit capacitor in a background art ferroelectric memory.
Figure 2:
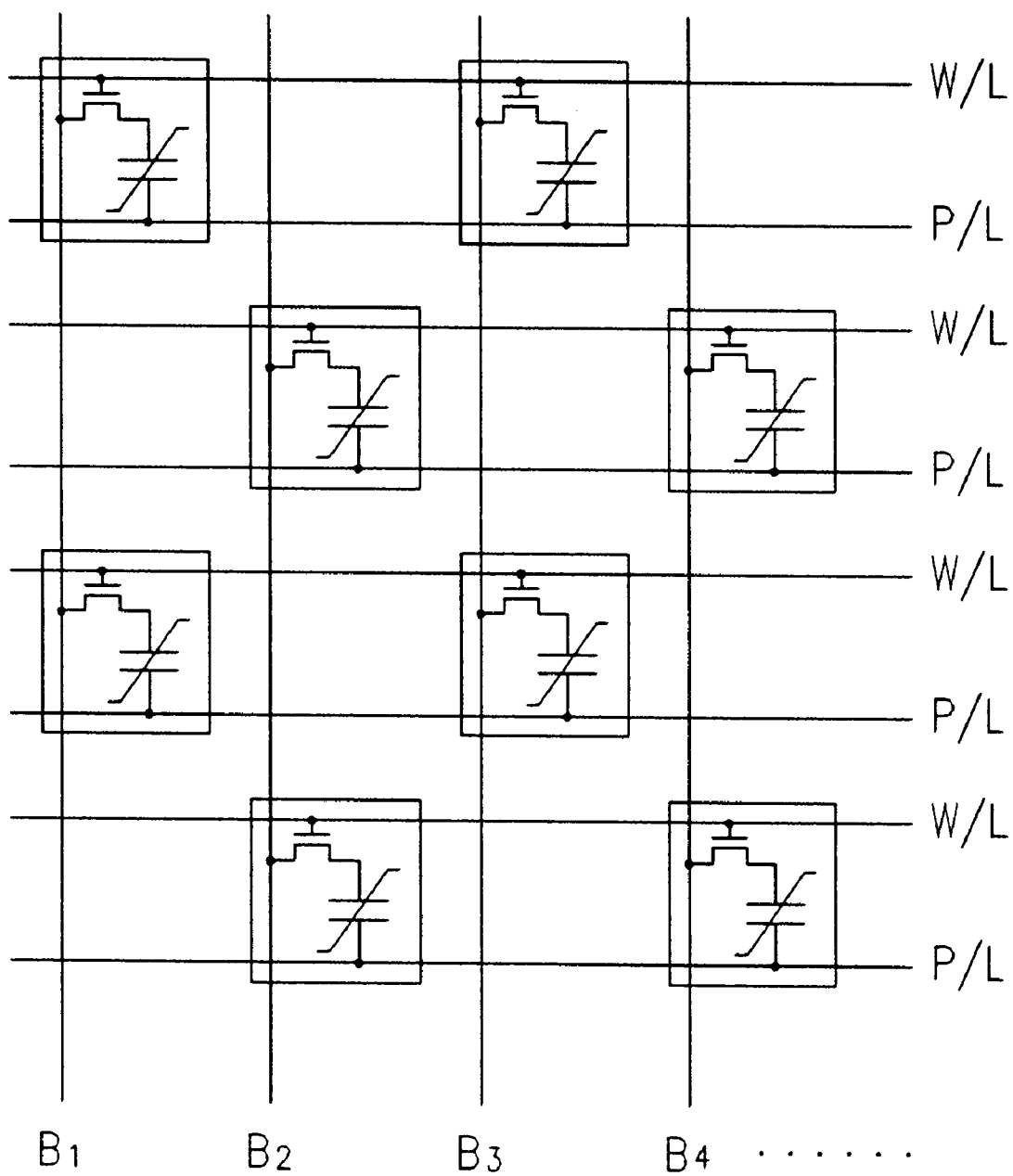
FIG. 2 illustrates a background art 1T/1C FRAM cell array.
Figure 3A:
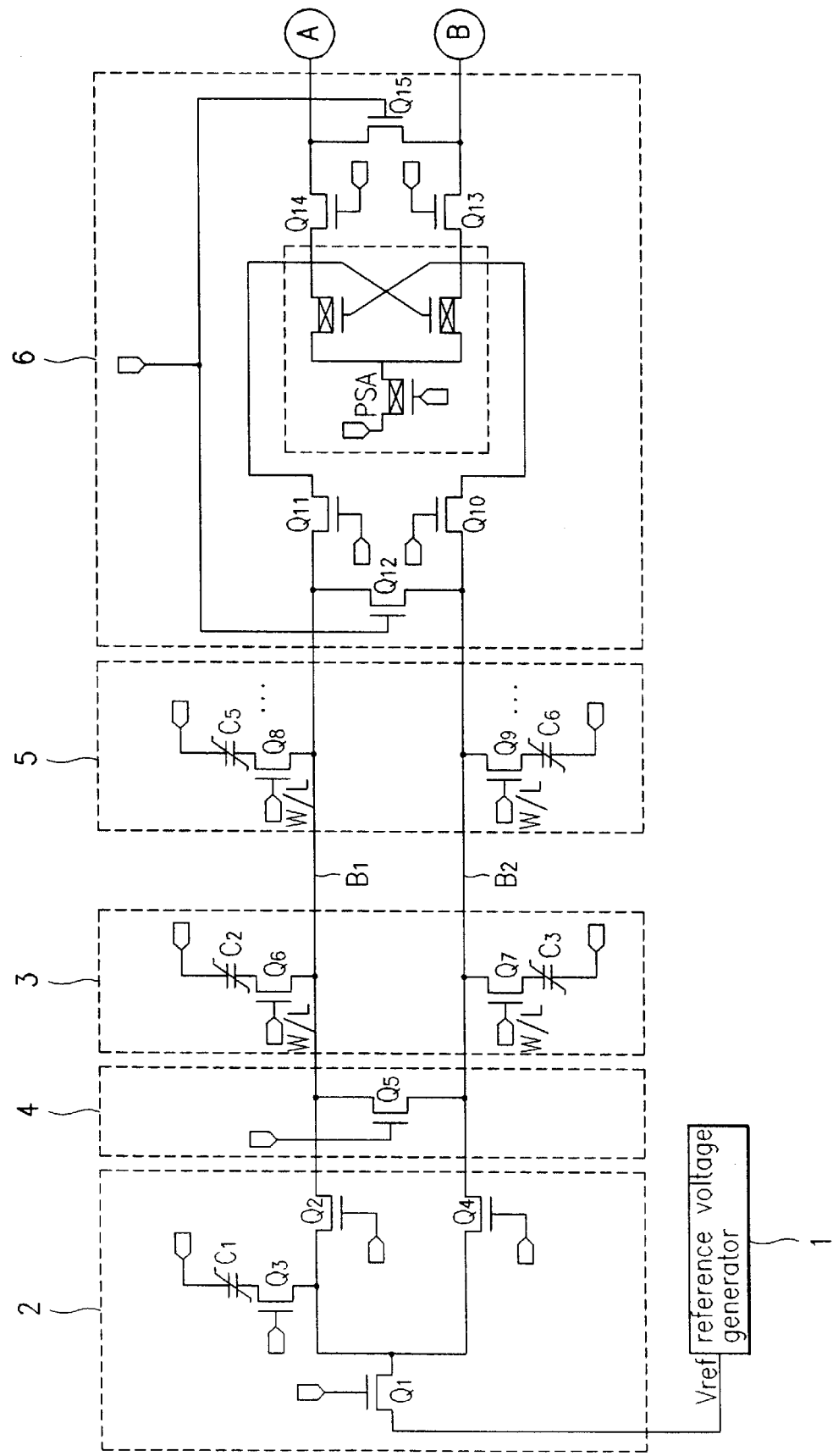
FIGS. 3a and 3b together illustrate a circuit for driving the background art 1T/1C FRAM.
Figure 3B:
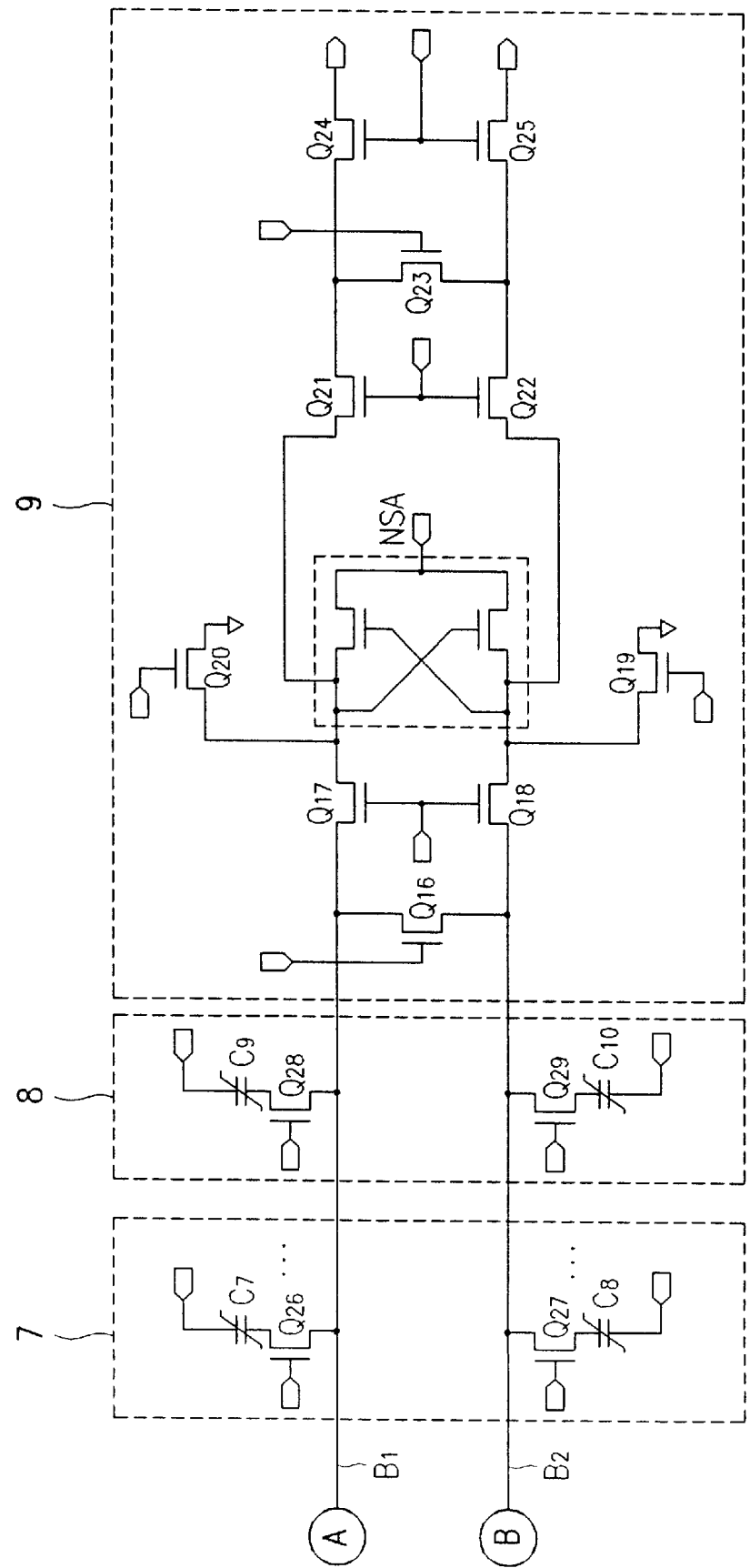
Figure 4B:
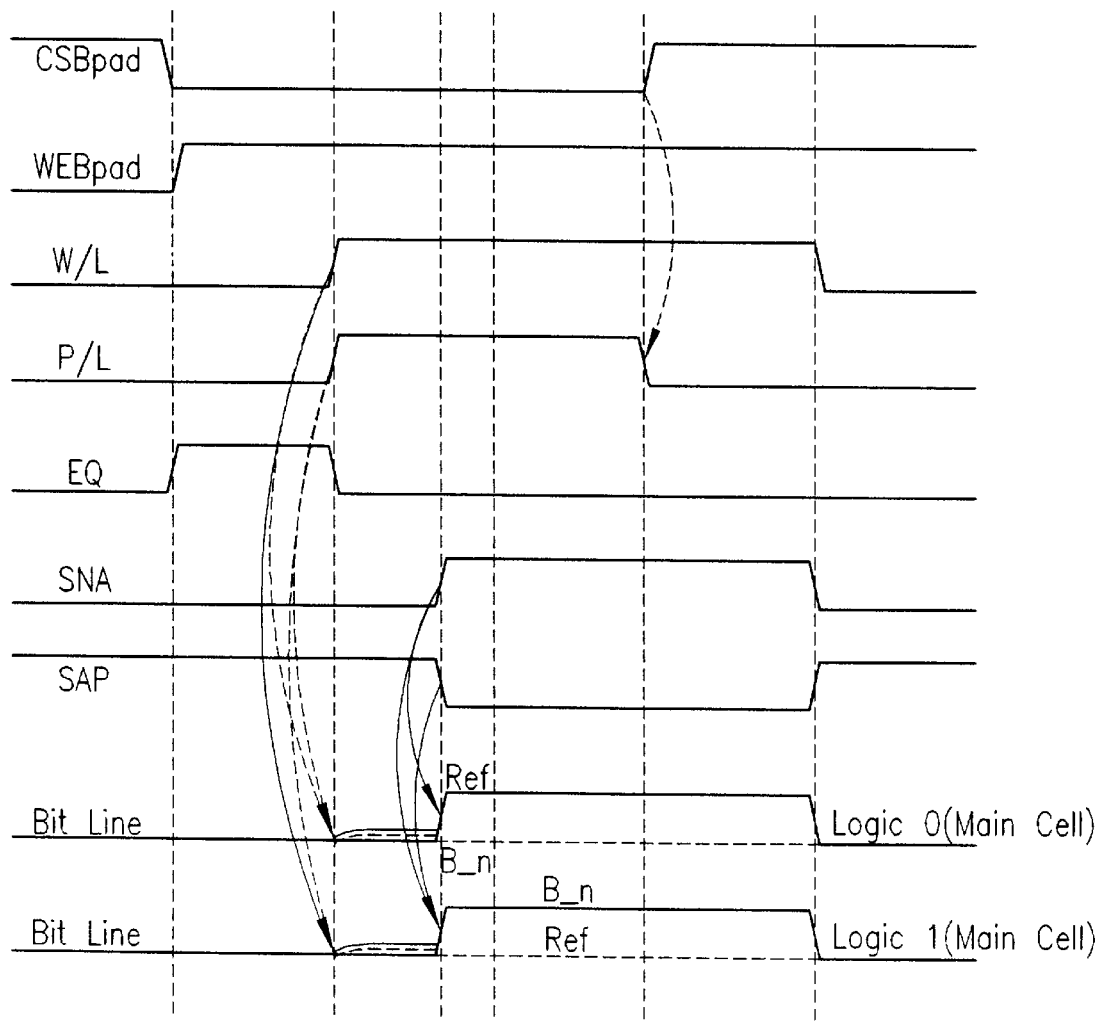
FIG. 4b illustrates a timing diagram for explaining a read from the background art 1T/1C FRAM cell.
Figure 5:
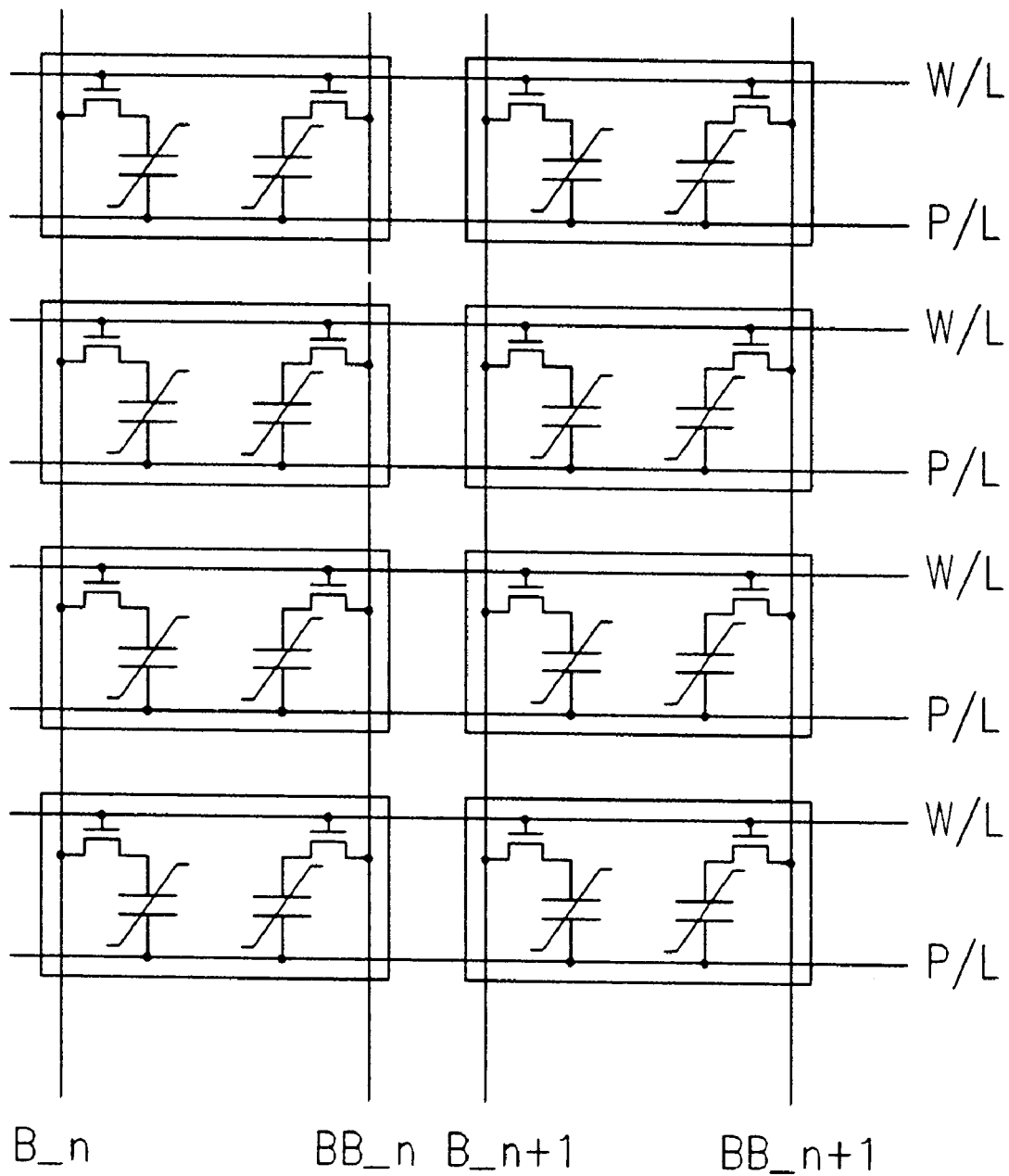
FIG. 5 illustrates an array of a background art 2T/2C FRAM cells.
Figure 6A:
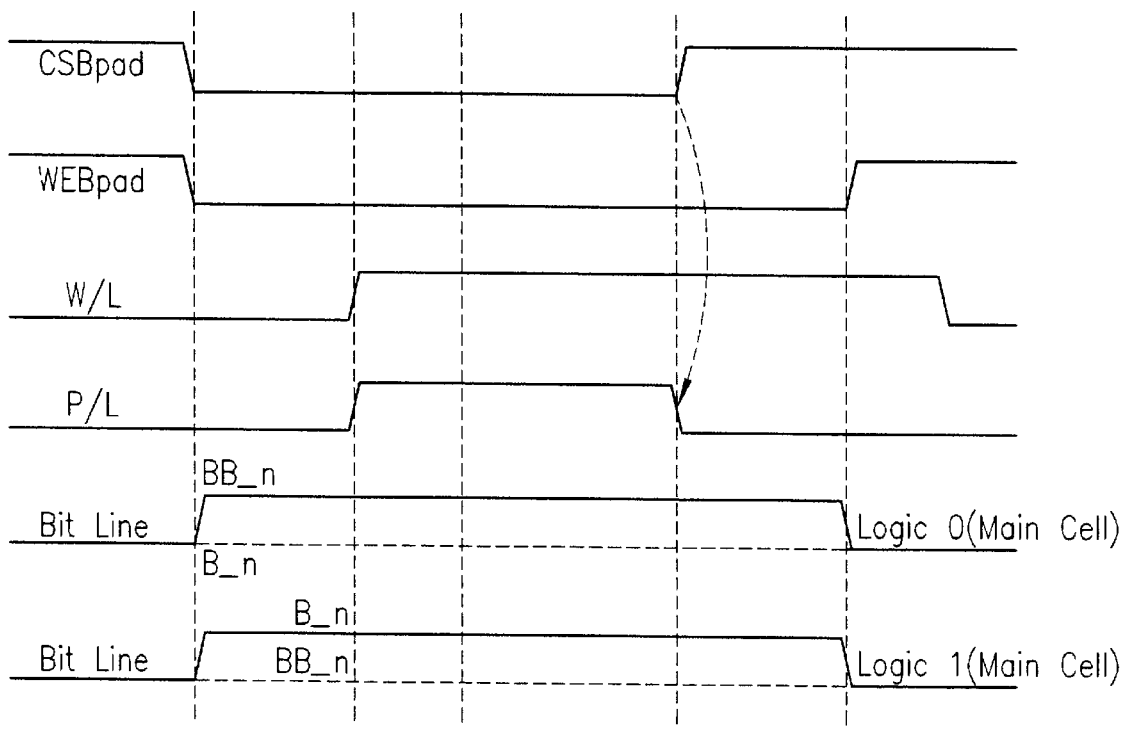
FIG. 6a illustrates a timing diagram for explaining a write on the background art 2T/2C FRAM cell.
Figure 6B:
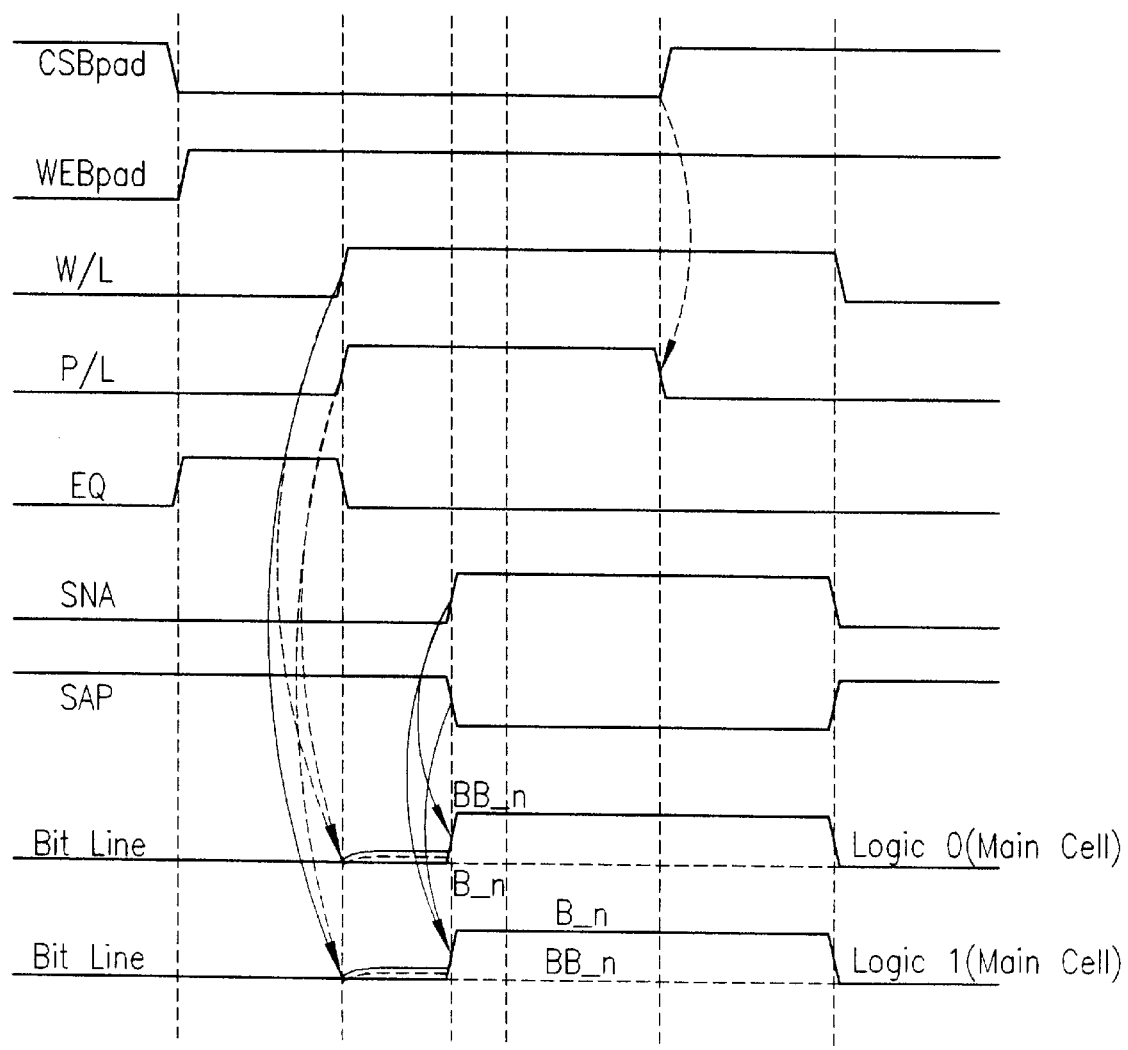
FIG. 6b illustrates a timing diagram for explaining a read from the background art 2T/2C FRAM cell.
Figure 8:
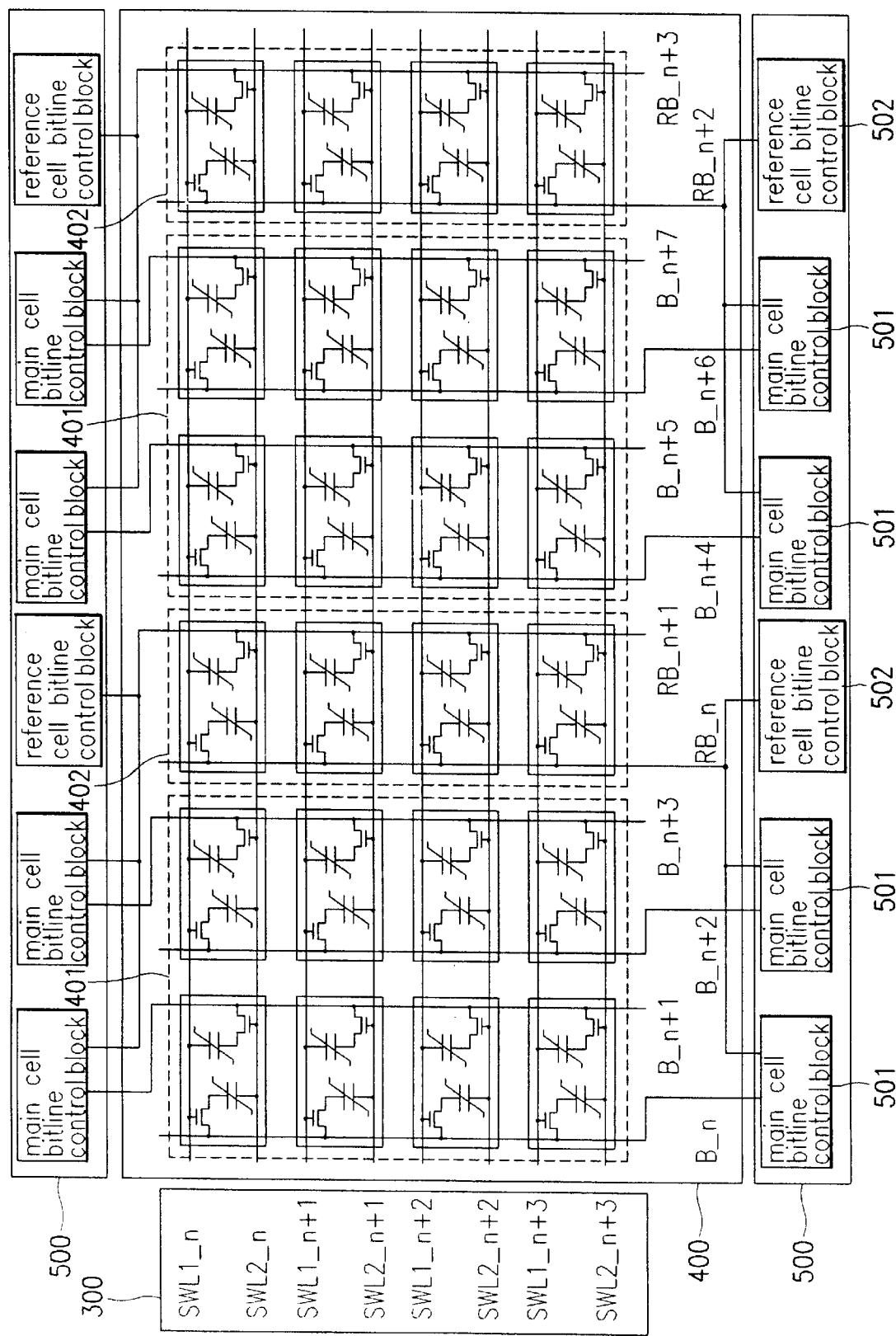
FIG. 8 illustrates a circuit system of an array of SWL ferroelectric memory cells in accordance with a first embodiment of the present invention.

The SWL memory will be explained in more detail. FIG. 8 illustrates a circuit of a sub-block array of SWL ferroelectric memory cells in accordance with a first embodiment of the present invention.

Referring to FIG. 8, the SWL ferroelectric memory cell array in accordance with a first embodiment of the present invention includes a plurality of split wordlines(hereafter called "SWL") SWL1-n, SWL2-n, - - - , SWL2-n+3 arranged in one direction at fixed intervals, and a plurality of bitlines Bit-n, Bit-n+1, - - - , RBit-n, RBit-n+1 arranged in one direction vertical to each of the SWLs at fixed intervals. A unit cell is formed in every pair of adjacent two SWLs and adjacent two bitlines. That is, the unit cell includes a first transistor having a gate electrode connected to a first SWL of one pair of SWLs and a source electrode connected to a first bitline of one pair of bitlines, a second transistor having a gate electrode connected to a second SWL of one pair of SWLs and a source electrode connected to a second bitline of one pair of bitlines, a first capacitor having a first electrode connected to a drain electrode of the first transistor and a second electrode connected the second SWL, and a second capacitor having a first electrode connected to a drain electrode of the second transistor and a second electrode connected to the first SWL. The cell array actually includes a main cell region 401 for writing a data and a reference cell region 402 for being in storage of a reference value for reading a data. Therefore, a plurality of bitlines for main cells form a main cell sub-block and one pair of reference cell bitlines RBit-n, Rbit-n+1 for every main cell sub-block form a reference cell sub-block, and a plurality of the main cell sub-blocks and a plurality of the reference cell sub-blocks form one cell array, which are provided in a multiple number. As shown, the main cell sub-blocks may be arranged in four column units and the reference cell sub-blocks may be arranged in two column units, other than this, the main cell sub-blocks may be arranged in 2n column units(n is a natural number greater than 2) and the reference cell sub-blocks may be arranged in two column units as necessary. And, the core 500 has a main cell bitline controlling block 501 and a reference cell bitline controlling block 502, and the main cell bitline controlling block 501 has a sense amplifier block for reading data on the main memory cell and a write control circuit. The main cell bitline control blocks 501 and the reference cell bitline control blocks 502 at bottom respectively control an odd numbered column B_n, B_n+2, RB_n of the cell arrays. And, the main cell bitline control blocks 501 and the reference cell bitline control blocks 502 at top respectively control an even numbered column B_n+1, B_n+3, RB_n+1 of the cell arrays.

Figure 9:
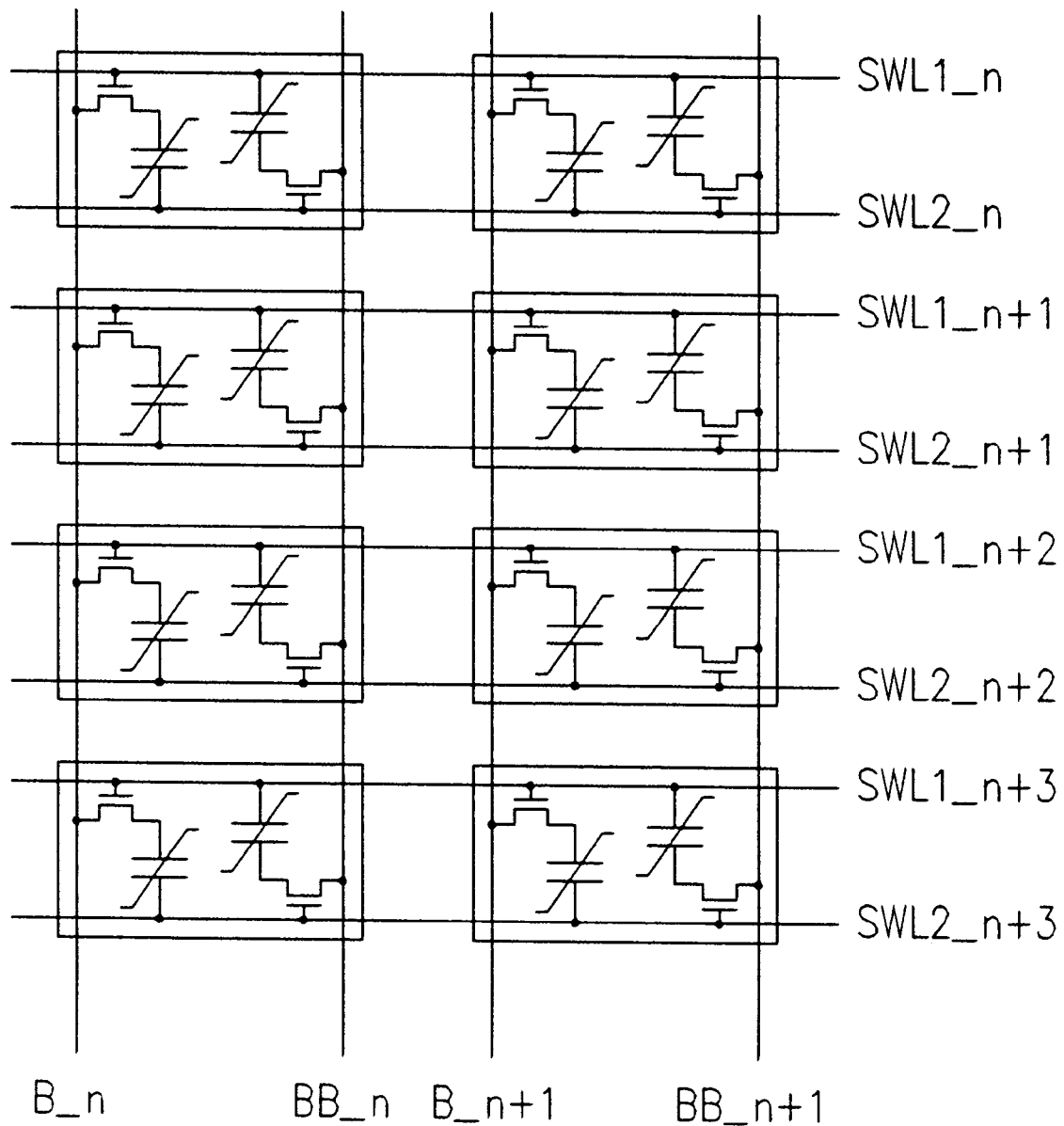
FIG. 9 illustrates a circuit system of an array of SWL ferroelectric memory cells in accordance with a second embodiment of the present invention.

FIG. 9 illustrates a system of an SWL ferroelectric memory cell array in accordance with a second embodiment of the present invention.

Referring to FIG. 9, the SWL ferroelectric memory cell array in accordance with a second embodiment of the present invention includes a plurality of split wordlines (hereafter called "SWL") SWL1-n, SWL2-n, - - - , SWL2-n+3 arranged in one direction at fixed intervals, and a plurality of bitlines B-n, B-n+1 and bitbarlines BB-n, BB-n+1 arranged alternatively in one direction vertical to each of the SWLs at fixed intervals. A unit cell is formed in every pair of adjacent two SWLs and a pair of adjacent bitline B and bitbarline BB. That is, the unit cell includes a first transistor having a gate electrode connected to a first SWL of one pair of SWLs and a source electrode connected to the bitline B, a second transistor having a gate electrode connected to a second SWL of one pair of SWLs and a source electrode connected to the bitbarline BB, a first capacitor having a first electrode connected to a drain electrode of the first transistor and a second electrode connected the second SWL, and a second capacitor having a first electrode connected to a drain electrode of the second transistor and a second electrode connected to the first SWL. The SWL ferroelectric memory cell array in accordance with the second embodiment of the present invention is similar to the SWL ferroelectric memory cell arrays in accordance with the first embodiment of the present invention, except that the second embodiment has the even numbered bitlines B in the first embodiment replaced with bitbarlines BB and all the reference cell sub-blocks in the first embodiment replaced with main cells.

Figure 10:
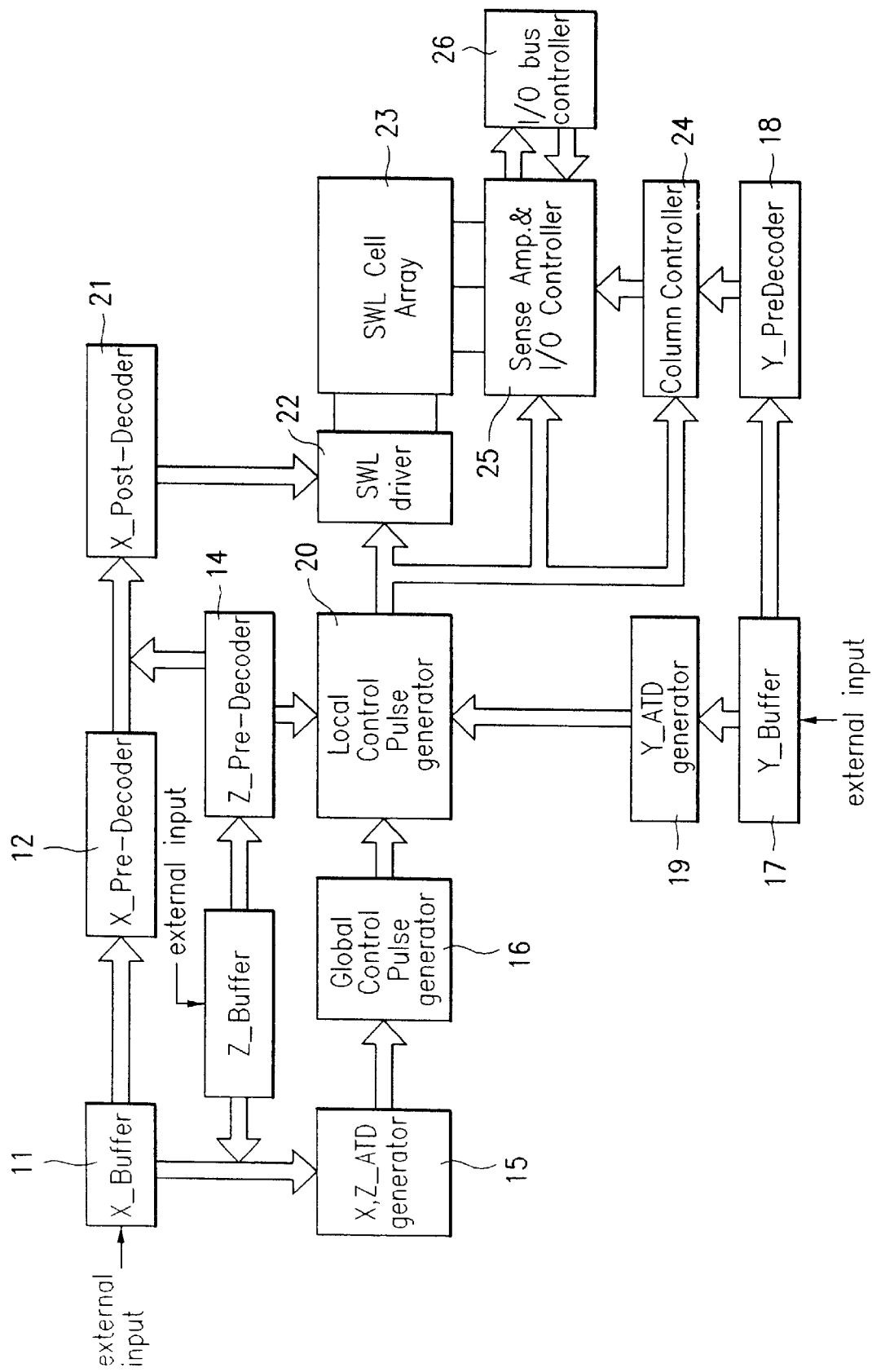
FIG. 10 illustrates a system block diagram of a circuit for driving an SWL ferroelectric memory in accordance with the present invention.

A circuit for driving a ferroelectric memory in accordance with the present invention will be explained. FIG. 10 illustrates a block diagram of a circuit for driving a ferroelectric memory in accordance with the present invention. The circuit is adapted to drive any of the first and second embodiment ferroelectric memory of the present invention.

Referring to FIG. 10, the circuit for driving a ferroelectric memory in accordance with the present invention includes an X-buffer 11 for buffering an X address of X-, Y- and Z-addresses, an X-pre-decoder 12 for pre-decoding a signal from the X-buffer 11, Z-buffer 13 for buffering a Z address of X-, Y- and Z-addresses, a Z-pre-decoder 14 for pre-decoding a signal from the Z-buffer 13, an X, Z-ATD generator 15 for detecting address transition points of the X-address and Z-address signals from the X-buffer 11 and the Z-buffer 13, a global control pulse generator 16 for receiving a signal from the X, Z-ATD generator 15 and an external CSB-pad signal, generating a power-up sensing signal for itself, and providing a basic pulse for memory control according to the X, Z-ATD signal, the CSBpad signal and the power-up sensing signal, a Y-buffer 17 for buffering a Y address of X-, Y- and Z-addresses received externally, a Y-pre-decoder 18 for pre-decoding a signal from the Y-buffer 17, a Y-ATD generator 19 for detecting an address transition point of the Y-address signal from the Y-buffer 17, a local control pulse generator 20 for compounding a signal from the global control pulse generator 16, a Z-pre-decoding signal from the Z-pre-decoder 14 and a signal from the Y-ATD generator 19 into a pulse required in each memory block, an X-post decoder 21 for compounding the X-pre-decoding signal and the Z-pre-decoding signal from the X-pre-decoder 12 and the Z-pre-decoder 14 to select a cell block, an SWL driver 22 for compounding signals from the X-post decoder 21 and the local control pulse generator 20 to drive split wordlines on each of SWL cell blocks 23, a column controller 24 for compounding signals from the Y-pre-decoder 18 and the local control pulse generator 20 to select a bitline(or a bitbarline), a sense amp & I/O controller 25 for compounding a signal from the local control pulse generator 20 and a signal from the column controller 24 to control operation of the sense amplifier and input/output, and an I/O bus controller 26 for interfacing an external data bus, the sense amplifier and the I/O controller 25.

Figure 11:
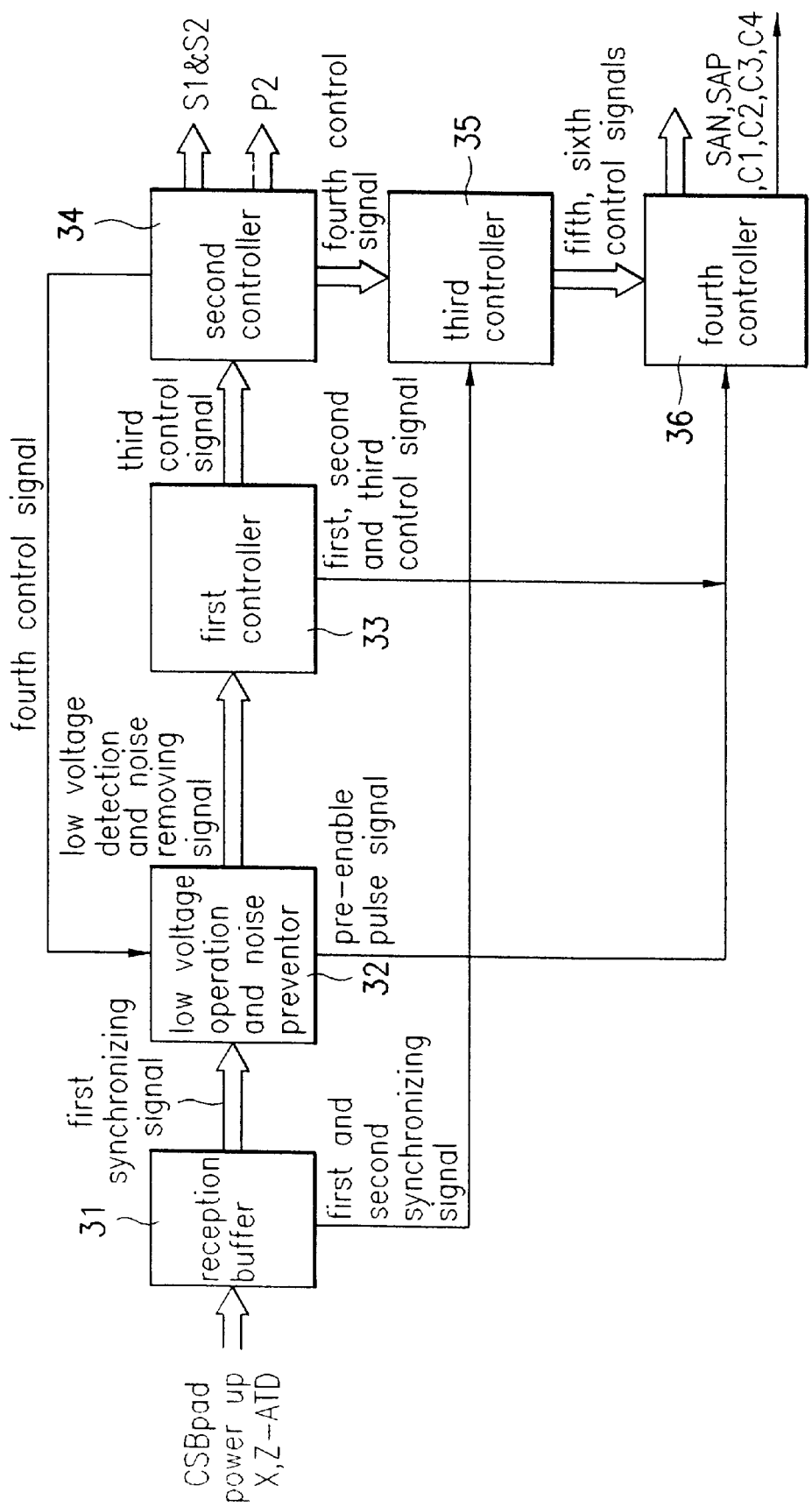
FIG. 11 illustrates a system block diagram of a global control pulse generator in accordance with a first preferred embodiment of the present invention.

The global control pulse generator will be explained in more detail. FIG. 11 illustrates a block diagram of a global control pulse generator in accordance with a first preferred embodiment of the present invention.

Referring to FIG. 11, the global control pulse generator 16 in accordance with a first preferred embodiment of the present invention includes a reception buffer 31 for receiving a signal containing at least a CSBpad signal of the CSBpad signal, the X, Z-ATD signal from the X, Z-ATD generator 15 and the power-up detecting signal and providing first, and second synchronizing signals; a low voltage operation and noise preventor 32 for providing a low voltage detecting signal for stopping operation at a low voltage, a noise canceling signal for filtering a noise in the first synchronizing signal, a pre-activating pulse for pre-charging the bitlines and the like in response to the first synchronizing signal from the reception buffer 31 and a feed back signal(a fourth control signal from a second controller); a first controller 33, when a normal power supply voltage is supplied from the low voltage operation and noise preventor 32, for receiving a signal having the noise removed therefrom and providing a first control signal for controlling an enable time point of the sense amplifier, a second control signal for controlling a column selection enable time point and a bitline pull-up of a reference cell, and a third control signal for providing a signal for the SWL driver and other control signals; a second controller 34 for receiving the third control signal from the first controller 33, generating a basic waveform generating signal S1 for the SWL1 and a basic waveform generating signal S2 for the SWL2 in a pair of SWLs for the SWL driver, a fourth control signal which is a basic pulse signal for controlling enabled time periods of the signals S1 and S2 and a pulse signal P2 having a driving capability improved from the fourth control signal, and providing the fourth control signal to the low voltage operation and noise preventor 32 as a feed back signal and the pulse signal P2 to the local control pulse generator 20; a third controller 35 for receiving the first, and second synchronizing signals from the reception buffer 31 and the fourth control signal from the second controller 34 and providing a fifth control signal for controlling to be synchronous to the SCBpad signal if all signal except the basic waveform generating signal S1 for the SWL1 and the basic waveform generating signal S2 for SWL2 is disabled and a sixth control signal for interrupting a disabled state of the CSBpad signal if the CSBpad signal is disabled under a state that the basic waveform generating signal S1 for the SWL1 and the basic waveform generating signal S2 for SWL2 are enabled and sustaining the enabled state until completion of normal operations of the basic waveform generating signal S1 for the SWL1 and the basic waveform generating signal S2 for SWL2; and a fourth controller 36 for receiving the fifth, and sixth control signals from the third controller 35, the first, second and third control signals from the first controller 33 and the pre-activating pulse from the low voltage operation and noise preventor 32 and providing an enable signal SAN for an n-MOS device and an enable signal SAP for p-MOS device in the sense amplifier, a control signal C1 for connecting a bitline on a main cell block and a first I/O node on the sense amplifier to each other, a control signal C2 for connecting a bitline on a reference cell block and a second I/O node on the sense amplifier to each other, a control signal C3 for controlling low voltage pre-charges of a bitline on a main cell, a bitline on a reference cell and a node on the sense amplifier, and a control signal C4 for controlling an enable time point of a column selection and a bitline pull-up of a reference cell.

Figure 12:
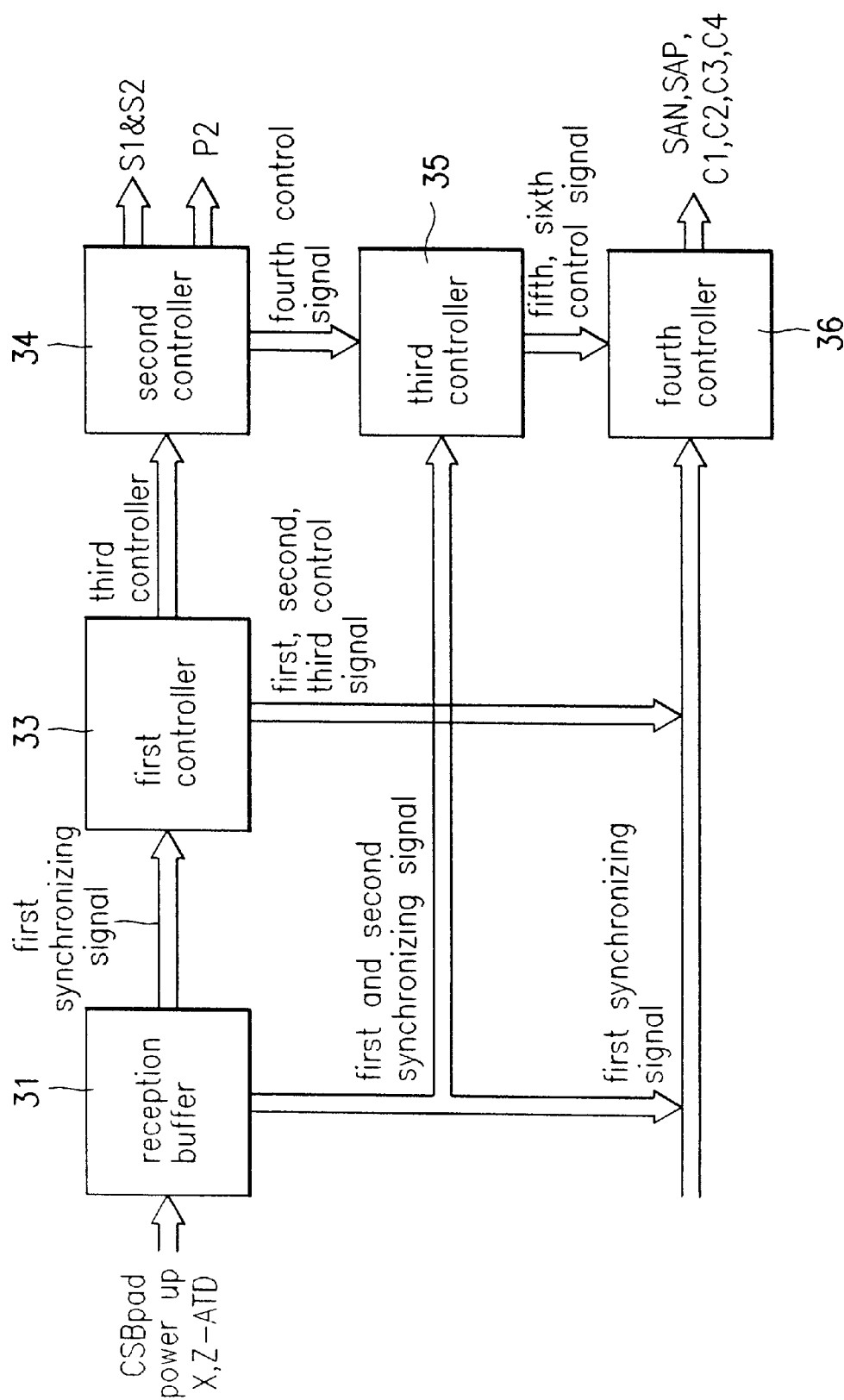
FIG. 12 illustrates a system block diagram of a global control pulse generator in accordance with a second preferred embodiment of the present invention.

In the meantime, if the externally applied signals(the CSBpad signal, the A, Z-ATD signal and the power-up detecting signal) to the global control pulse generator in the first embodiment are stable, the low voltage operation and noise preventor may be dispensed, which will be explained with reference to a second embodiment. FIG. 12 illustrates a block diagram of a global control pulse generator in accordance with a second preferred embodiment of the present invention.

Referring to FIG. 12, the global control pulse generator in accordance with a second preferred embodiment of the present invention includes a reception buffer 31 for receiving a signal containing at least a CSBpad signal of the CSBpad signal, the X, Z-ATD signal from the X, Z-ATD generator 15 and the power-up detecting signal and providing first, and second synchronizing signals; a first controller 33 for receiving the first synchronizing signal from the reception buffer 31 and providing a first control signal for controlling an enable time point of the sense amplifier, a second control signal for controlling a column selection enable time point and a bitline pull-up of a reference cell, and a third control signal for providing a signal for the SWL driver and other control signals; a second controller 34 for receiving the third control signal from the first controller 33, generating a basic waveform generating signal S1 for the SWL1 and a basic waveform generating signal S2 for the SWL2 in a pair of SWLs for the SWL driver, a fourth control signal which is a basic pulse signal for controlling enabled time periods of the signals S1 and S2 and a pulse signal P2 having a driving capability improved from the fourth control signal, and providing the pulse signal P2 to the local control pulse generator 20; a third controller 35 for receiving the first, and second synchronizing signals from the reception buffer 31 and the fourth control signal from the second controller 34 and providing a fifth control signal for controlling to be synchronous to the SCBpad signal if all signal except the basic waveform generating signal S1 for the SWL1 and the basic waveform generating signal S2 for SWL2 is disabled and a sixth control signal for interrupting a disabled state of the CSBpad signal if the CSBpad signal is disabled under a state that the basic waveform generating signal S1 for the SWL1 and the basic waveform generating signal S2 for SWL2 are enabled and sustaining the enabled state until completion of normal operations of the basic waveform generating signal S1 for the SWL1 and the basic waveform generating signal S2 for SWL2; and a fourth controller 36 for receiving the fifth, and sixth control signals from the third controller 35, the first, second and third control signals from the first controller 33 and the first synchronizing signal from the reception buffer 31 and providing an enable signal SAN for an n-MOS device and an enable signal SAP for p-MOS device in the sense amplifier, a control signal C1 for connecting a bitline on a main cell block and a first I/O node on the sense amplifier to each other, a control signal C2 for connecting a bitline on a reference cell block and a second I/O node on the sense amplifier to each other, a control signal C3 for controlling low voltage pre-charges of a bitline on a main cell, a bitline on a reference cell and a node on the sense amplifier, and a control signal C4 for controlling an enable time point of a column selection and a bitline pull-up of a reference cell.

In the meantime, though not shown, the low voltage operation and noise preventor in the global control pulse generator of the first embodiment may be a low voltage operation preventor which prevents operation at a low voltage or a noise remover which only has a function of noise removal.

Figure 13:
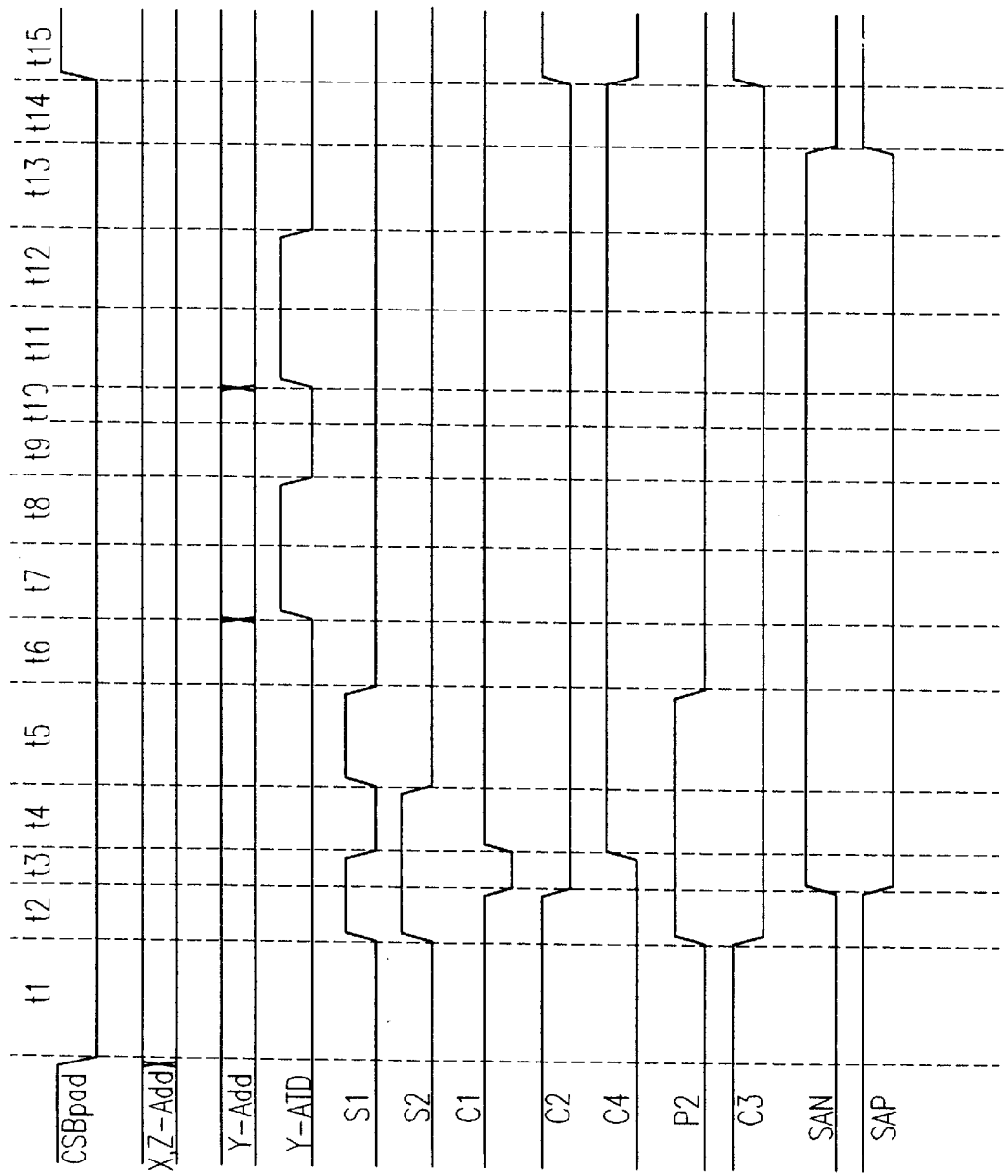
FIG. 13 illustrates an operation timing diagram of the first embodiment global control pulse generator in accordance with the present invention.

A method for driving the aforementioned global control pulse generator in the SWL ferroelectric memory will be explained. FIG. 13 illustrates an operation timing diagram of the first embodiment global control pulse generator in accordance with the present invention, FIG. 14 illustrates an operation timing diagram of the second embodiment global control pulse generator in accordance with the present invention, FIG. 15 illustrates an operation timing diagram of the third embodiment global control pulse generator in accordance with the present invention, and FIG. 16 illustrates an operation timing diagram of the fourth embodiment global control pulse generator in accordance with the present invention.

The operation of the global control pulse generator of the present invention more or less differs depending on cell array systems, X, Z-address toggle, or Y-address toggle. The operation of the global control pulse generator is as shown in FIG. 13 which is the first embodiment, in a case when the cell array system is as shown in FIG. 8 and the Y-address is toggled. Because the chip is enabled when the chip enable signal CSBpad signal applied externally is at "low", the chip will be brought into an enabled state when the CSBpad signal is turned from "high" to "low". Therefore, a disabled interval at a "high" state is required for conducting a new read or write. As shown in FIG. 13, one complete cycle of operation is divided from t1 interval to t15 interval, for convenience of explanation of signal behaviors. First, it is assumed that the CSBpad signal is enabled at "low" from a beginning point of the t1 interval to an end point of the t4 interval and disabled at "high" from a beginning point of the t15 interval. And, it is assumed that there are no transition in X and Z addresses, a Y address transits at a beginning point of t7 interval and a beginning point of t11 interval respectively during the CSBpad signal is at an enabled state. A Y-ATD senses a change of a Y address to generate a high pulse from t7 to t8 intervals and t11 to t12 intervals, respectively. S1 and S2 are pulses for use in formation of basic waveforms for wordlines SWL1 and SWL2 for an SWL cell. First, the CSBpad signal is transited from "high" to "low" at t1 interval to enable the chip, when X-, Y- and Z-addresses are kept the states before t1. Y-ATD signal is transited to "high" from t7 to t8 interval if the Y-address is transited at a t7 beginning time point. If Y-address is transited at a t11 beginning time point, the Y-ATD signal is transited to "high" from t11 to t12 intervals. The S1 signal is held at "low" until t1 interval, at "high" from t2 to t3 intervals at "low" in t4 interval, at "high" in t5 interval, and at "low" from t6 to t15 intervals. S2 is held at "high" from t3 to t4 intervals, otherwise held at "low". C1 signal which is a basic signal for controlling signal flow between a main cell bitline and one I/O terminal on the sense amplifier is held at "low" only in t3 interval, and held at "high" otherwise, to cut-off signal flow between the main cell bitline and one I/O terminal on the sense amplifier only in t3 interval. C2 signal which is a basic signal for controlling a signal flow between a reference cell bitline and the other I/O terminal on the sense amplifier provides a pulse which held at "low" from t3 interval to t14 interval, to cut-off the signal flow between a reference cell bitline and the other I/O terminal on the sense amplifier from t3 interval to t14 interval. C4 signal which controls signal transmission between a main cell bitline and external data bus and pull-up of a reference cell bitline is held at "high" from t4 to t14 and transited to "low" again at a time point at which the CSBpad signal is disabled(an end point of the t14 interval), to allow control of signal transmission between a main cell bitline and external data bus and pull-up of a reference cell bitline only from t4 to t14 intervals. P2 signal is held at high in intervals from t2 to t5 in which the S1 and S2 are held at high for protecting the S1 and S2 signals from external interference, and is transited to "low" at t6 beginning time point, again. C3 signal which pre-charges a low voltage on the main cell bitline and the reference cell bitline before the S1 and S2 are enabled is, while held at "high" as before until t1 interval, transited to "low" at t2 beginning time point, held at "low" to an end of t14 to disable the pre-charge, and transited to "high" again in intervals other than these(a time point at which the CSBpad signal is disabled). SAN signal(a preliminary signal for producing an SAN_C signal which is a signal for controlling transistors with NMOSs for operating the sense amplifier in the sense amplifier and I/O controller) is held at "low" as before, and transited to "high" at t3 beginning point and to "low" at a time point when the CSBpad signal is disabled. SAP signal(a preliminary signal of an SAP_P signal which controls transistors with PMOSs for operating the sense amplifier in the sense amplifier and I/O controller) behaves opposite to the SAN signal; held at "high" until t2 interval, a previous state, transited to "low" at t3 beginning point, and transited to "high" at a time point when the CSBpad signal is disabled. Thus, under a state when the CSBpad signal is enabled, if Y-address is transited to occur Y-ATD, in case it is a write mode, a logic "0" is written on a relevant cell in intervals both the S1 and S2 are at "high", i.e., from t2 interval to t3 interval, and logic "1" is written on the cell in intervals only one of the S1 and S2 signals is at "high", i.e., from t4 interval to t5 interval.

Figure 14:
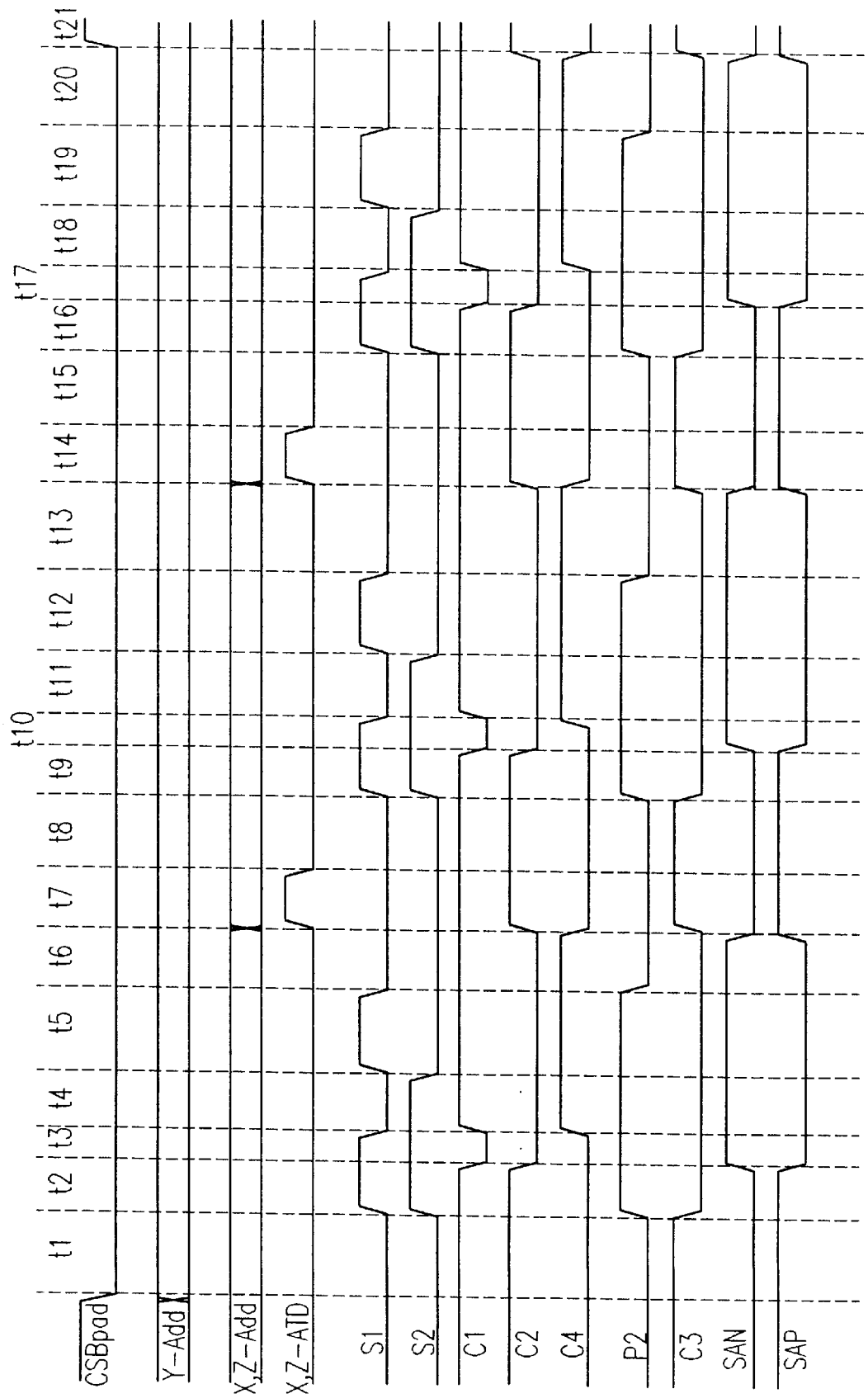
FIG. 14 illustrates an operation timing diagram of the second embodiment global control pulse generator in accordance with the present invention.

The operation of the global control pulse generator is as shown in FIG. 14 which is the second embodiment, in a case when the cell array system is as shown in FIG. 8 and the X, Z-address are toggled. One complete cycle of operation is divided from t1 interval to t21 interval, and both X, Z-addresses are transited at beginning points of t7 and t14 intervals. Because the operation of the global control pulse generator in a case of the X, Z-address toggle is also similar to the operation of the operation of the global control pulse generator in the case of the Y-address toggle, portions of which operations are different will only be explained. While Y-ATD signal is transited to "high" at a time point when a Y-address is transited in FIG. 13, as it is assumed in the second embodiment of the present invention that both X, Z-addresses are transited at beginning points of t7 and t14 intervals, X, Z-ATD signals are held at "high" in t7 interval and t14 interval and at "low" in rest of the intervals. When the X, Z-addresses are transited, the global control pulse generator compounds X, Z-ATD signals with CSBpad signal in using them. Therefore, if the X, Z-ATD signals are present at "high" (t7 and t 14), the global control pulse generator senses that the CSBpad signal is enabled again in the interval. Accordingly, the global control pulse generator provides all signals again, to enable normal accesses to the X, Z-addresses. Both the S1 and S2 signals are begun after a certain interval(t1) from a transit of the CSBpad signal to "low" and also begun after a certain interval (t8 and t15) from a time point transits of the X, Z-ATD signals to "low". That is, the S1 signal is held at "high" in t2–t3 intervals, t5 interval, t9–t10 intervals, t16–t17 intervals and t19 interval, and held at "low" in rest of the intervals. And, the S2 signal is held at "high" in t2–t4 intervals, t9–t11 intervals and t16–t18 intervals, and held at "low" in rest of the intervals. C1 signal is transited and held at "low" for one interval(t3, t10 and t17) of intervals in which both the S1 and S2 signals are at "high" (t1–t3, t9–t10 and t16–t17), and transited to "high" again. C2 signal is transited from "high" to "low" at a time point when the C1 signal is transited to "low" as above, and transited from "low" to "high" at a time point when the X, Z-ATD signal is transited to "high". C4 signal is transited from "high" to "low" at a time point when the C1 signal is transited to "high", and transited from "high" to "low" at a time point when the X, Z-ATD signal is transited to "high". P2 signal is transited from "low" to "high" at a time point when both the S1 and S2 signals are transited to "high", and transited from "low" to "high" at a time point when the X, Z-ATD signals are transited to "high". SAN and SAP signals are transited to opposite states at a time point of the C2 signal transit. Accordingly, a logic "0" is written on a relevant cell in intervals both the S1 and S2 signals are at "high", i.e., intervals of t1–t3, t9–t10 and t16–t17. And, a logic "1" is written in a relevant cell in intervals only one of the S1 and S2 signals are at "high", i.e., in intervals of t4–t5, t1–t12 and t18–t19.

Figure 15:
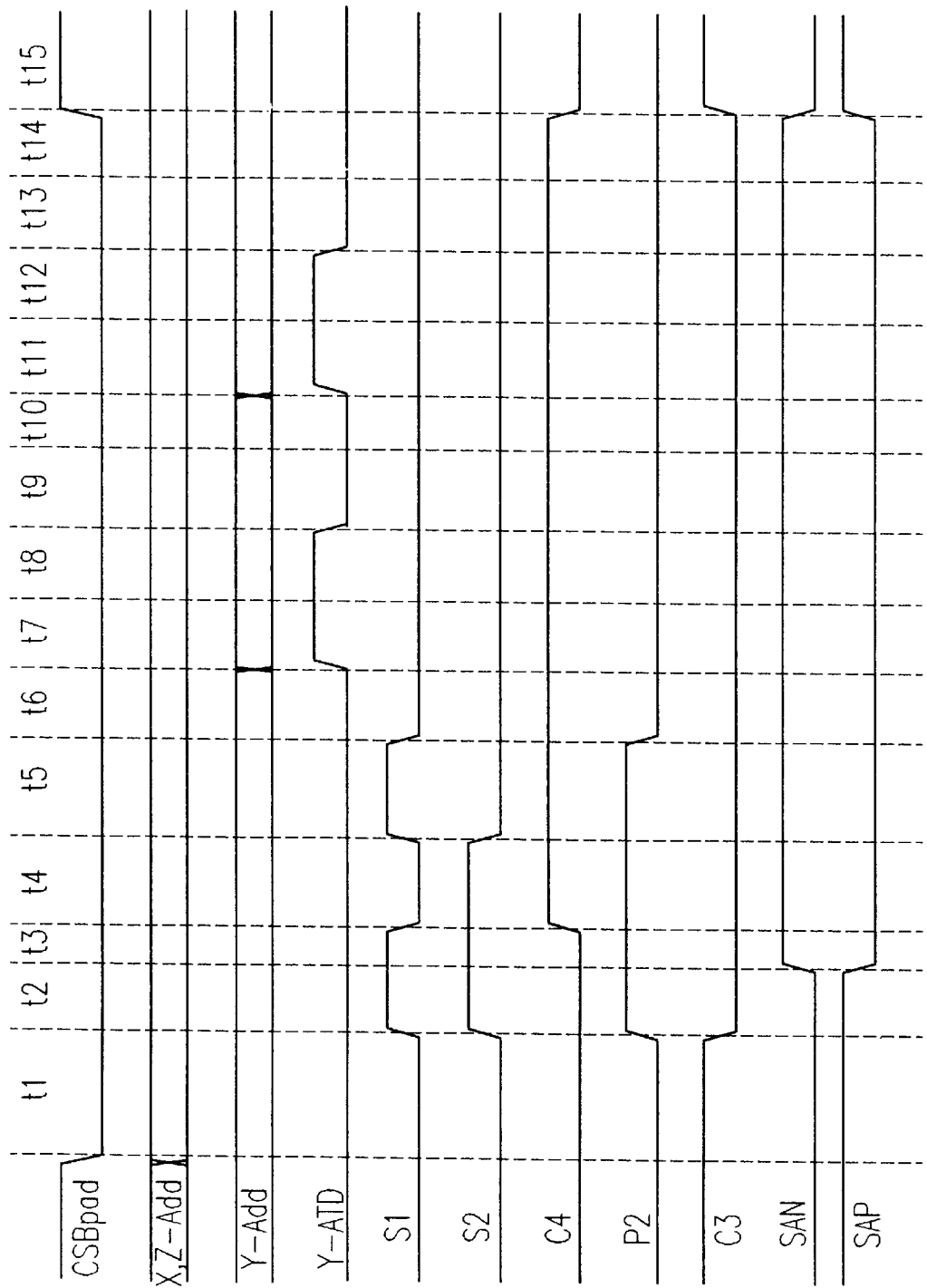
FIG. 15 illustrates an operation timing diagram of the third embodiment global control pulse generator in accordance with the present invention; and, FIG. 16 illustrates an operation timing diagram of the fourth embodiment global control pulse generator in accordance with the present invention.
Figure 16:
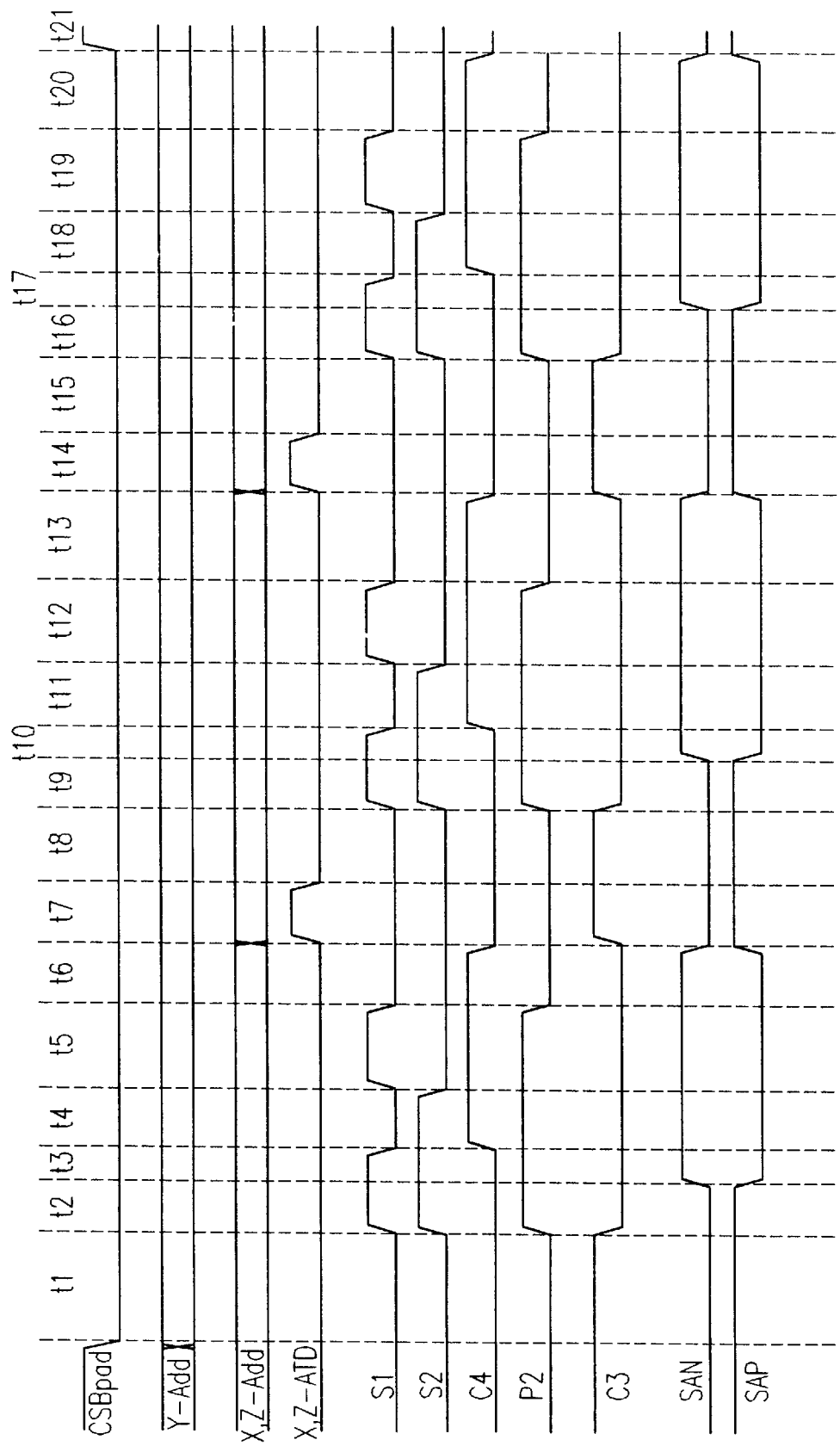

The operation of the global control pulse generator in a case when the cell array has a system as shown in FIG. 9 and a Y-address is toggled is as shown in FIG. 15. One complete cycle of operation is divided from t1 interval to t 15 interval, to explained behaviors of signals. The cell array system shown in FIG. 9 requires no C1 and C2 signals as the cell array system has bitlines and bitbarlines but without reference cells. It is assumed that the CSBpad signal is enabled to "low" from a t1 interval beginning point to a t14 interval end point and disabled to "high" from a t15 interval beginning point, and, while the CSBpad signal is enabled, though the X, Z-addresses are not transited, the Y-address is transited at t7 and t11 interval beginning points, Then, Y-ATD signal, on sensing the Y-address transition, is transited to and held at "high" from t7 interval to t8 interval and from t11 interval to t12 interval. The S1 and S2 signals being signals used for forming basic waveforms for the SWL1 and the SWL2 split wordlines of the SWL memory cell, the S1 is provided as pulses at "high" in t2–t3 intervals and t5 interval and the S2 is provided as pulses at "high" in t2–t4 intervals. Being a signal for controlling a signal transmission between a main cell bitline and an external data bus and full-up of the main cell bitline and bitbarline, C4 signal is transited from "low" to "high" at t4 interval beginning time point and transited to "low" again at a time point when the CSBpad signal is disabled(before beginning of t15), allowing the signal transmission between a main cell bitline and a dataline. Adapted to be held at "high" in t2–t5 intervals in which both the S1 and S2 signals have normal pulses(at "high"), P2 signal interlocks the S1 and S2 signals for preventing the S1 and S2 signals from interference by other signals. That is, by being held at high in intervals between t2 to t5 in which the S1 and S2 signals are normal, P2 signal protect the S1 and S2 signals being normal from interference by other signals in these intervals. Disabling pre-charge in t2–t4 intervals and enabling pre-charge in rest of the intervals, C3 signal is held at "high" until t1 interval, transited to "low" at t2 beginning time point and transited to "high" again at a time point when the CSBpad signal is disabled. SAN signal, a preliminary signal for producing an SAN_C signal which is a signal for controlling NMOS transistors for operating the sense amplifier in the sense amplifier and I/O controller, is held at "low", and transited to "high" at t3 beginning point and to "low" at a time point when the CSBpad signal is disabled. SAP signal, a preliminary signal of an SAP_P signal which controls PMOS transistors for operating the sense amplifier in the sense amplifier and I/O controller) behaves opposite to the SAN signal; held at "high" until t2 interval, transited to "low" at t3 beginning point, and transited to "high" again at a time point when the CSBpad signal is disabled. Accordingly, a logic "0" is written on a relevant cell in intervals both the S1 and S2 signals are at "high", i.e., in intervals of t2–t3. And, a logic "1" is written on a relevant cell in intervals only one of the S1 and S2 signals are at "high", i.e., in intervals of t4–t5.

The operation of the global control pulse generator in a case when the cell array has a system as shown in FIG. 9 and X, Z-addresses are toggled is as shown in FIG. 16 which is a fourth embodiment. That is, because the operation of the global control pulse generator at toggle of the X, Z-addresses is also similar to the operation of the global control pulse generator at toggle of the Y-address, portions of which operations are different will be explained.

While the Y-ATD signal is transited to "high" at a time point when the Y-address is transited in FIG. 15, the X, Z-ATD signals are transited to "high" in a case when the X, Z-addresses are transited in FIG. 16. The global control pulse generator compounds the X, Z-ATD signals with the CSBpad signal in using them when X, Z-addresses are transited. Therefore, if the X, Z-ATD signals are present at "high" (t7 and t14), the global control pulse generator senses that the CSBpad signal is enabled again in the interval. Accordingly, the global control pulse generator provides all signals again, to enable normal accesses to the X, Z-addresses. Both the S1 and S2 signals are begun after a certain interval(t1) from a transit of the CSBpad signal to "low" and also begun after a certain interval(t8 and t15) from a time point of transits of the X, Z-ATD signals to "low". C4 signal is transited from "high" to "low" at a time point when the S1 signal is transited to "low" and the S2 signal is held at "high", and transited from "high" to "low" at a time point when the X, Z-ATD signals are transited to "high". P2 signal is transited from "low" to "high" at a time point when both the S1 and S2 signals are transited to "high", and transited from "high" to "low" at a time point when the S1 and S2 signals are transited to "low". C3 signal is transited from "high" to "low" at a time point when both the S1 and S2 signals are transited to "high", and transited from "low" to "high" at a time point when the X, Z-ATD signals are transited to "high". SAN and SAP signals are transited after a predetermined delay from a time point when both the S1 and S2 signals are "high", and transited to opposite states at a time point when the X, Z-ATD signals are transited to "high". Accordingly, a logic "0" is written on a relevant cell in intervals both the S1 and S2 signals are at "high", i.e., intervals of t2–t3, t9–t10 and t16–t17. And, a logic "1" is written in a relevant cell in intervals only one of the S1 and S2 signals are at "high", i.e., in intervals of t4–t5, t11–t12 and t18–t19.

In the meantime, the systems and operations of the local control pulse generator 20 operative in response to a signal from the aforementioned global control pulse generator, the column controller 24 and the sense amplifier and I/O controller 25 will be explained. Since the systems and operations will differ depending on whether the SWL ferroelectric memory cell array has a system as shown in FIG. 8 or FIG. 9, they will be explained, separately.

Figure 17:
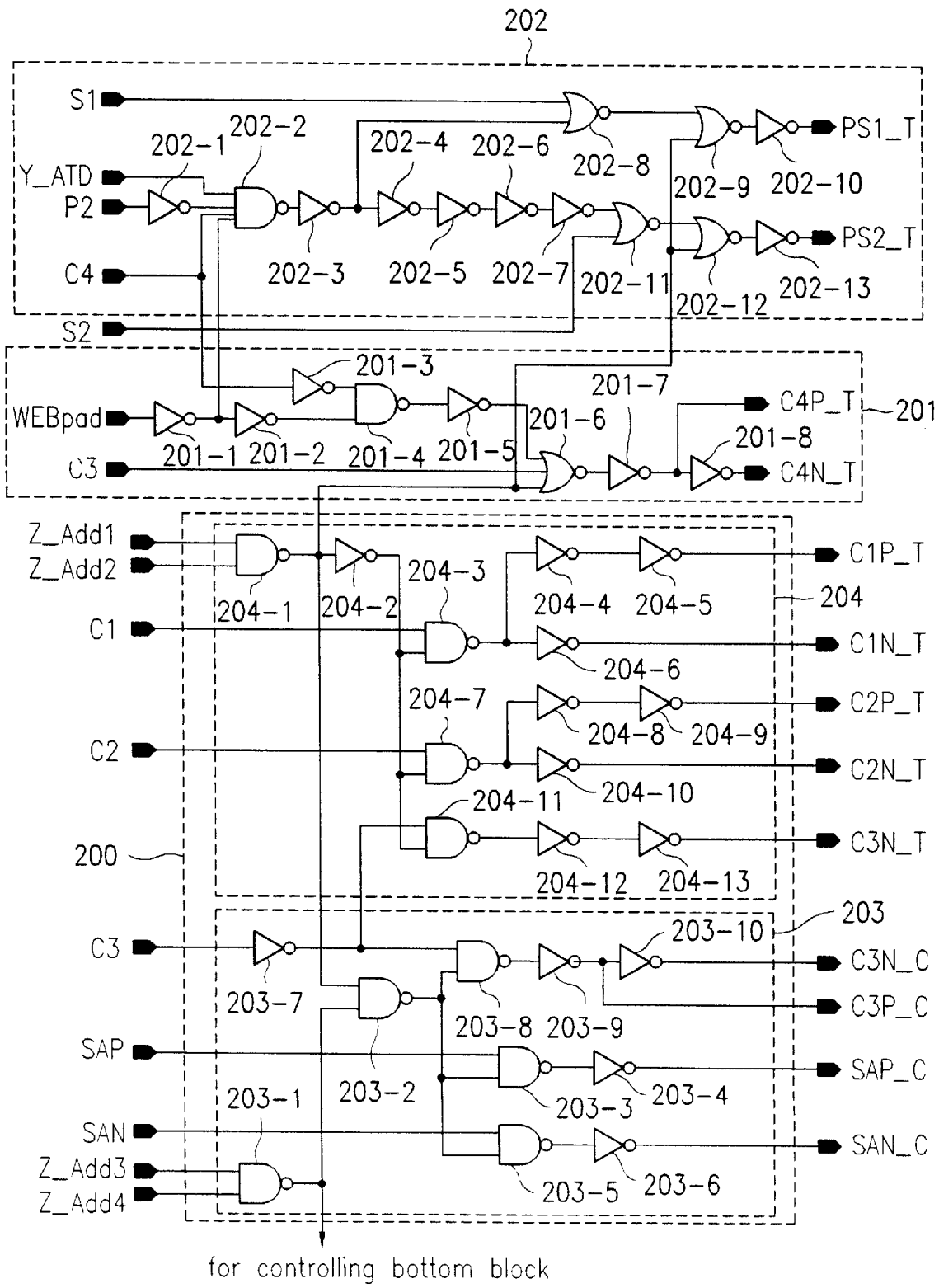
FIG. 17 illustrates a circuitry system of the local control pulse generator in accordance with the first embodiment of the present invention shown in FIG. 8.
Figure 18:
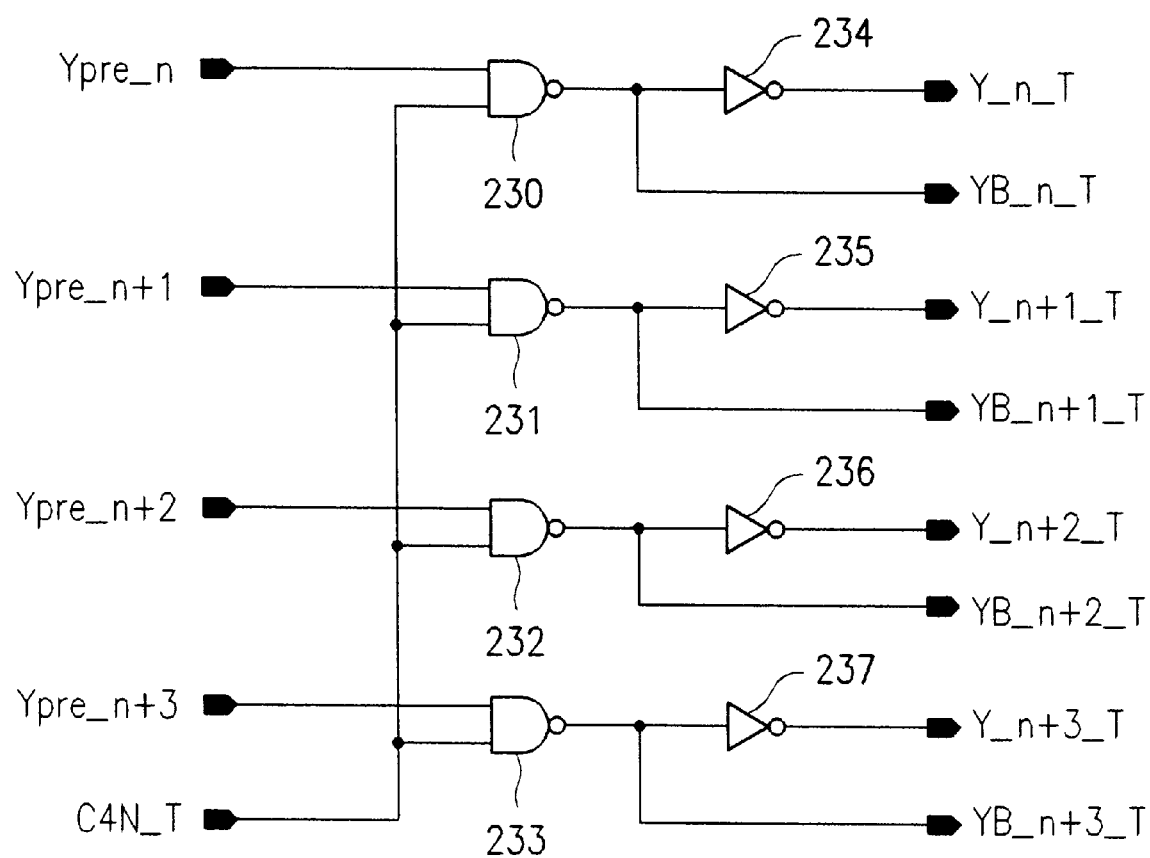
FIG. 18 illustrates a circuitry system of the column controller in accordance with the first embodiment of the present invention shown in FIG. 8.
Figure 19:
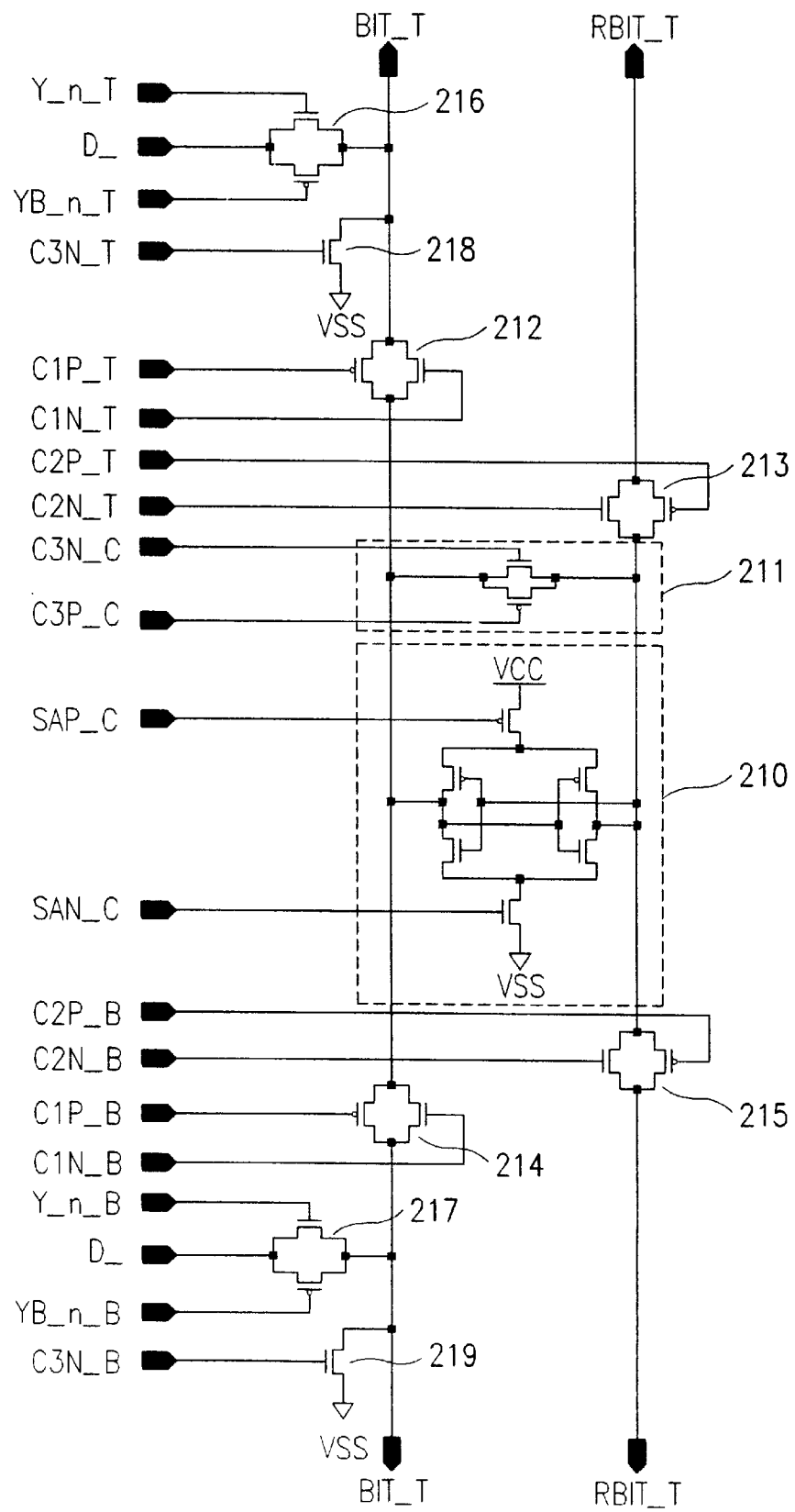
FIG. 19 illustrates a circuitry system of a first embodiment sense amplifier and input/output controller in accordance with the present invention shown in FIG. 8.
Figure 20:
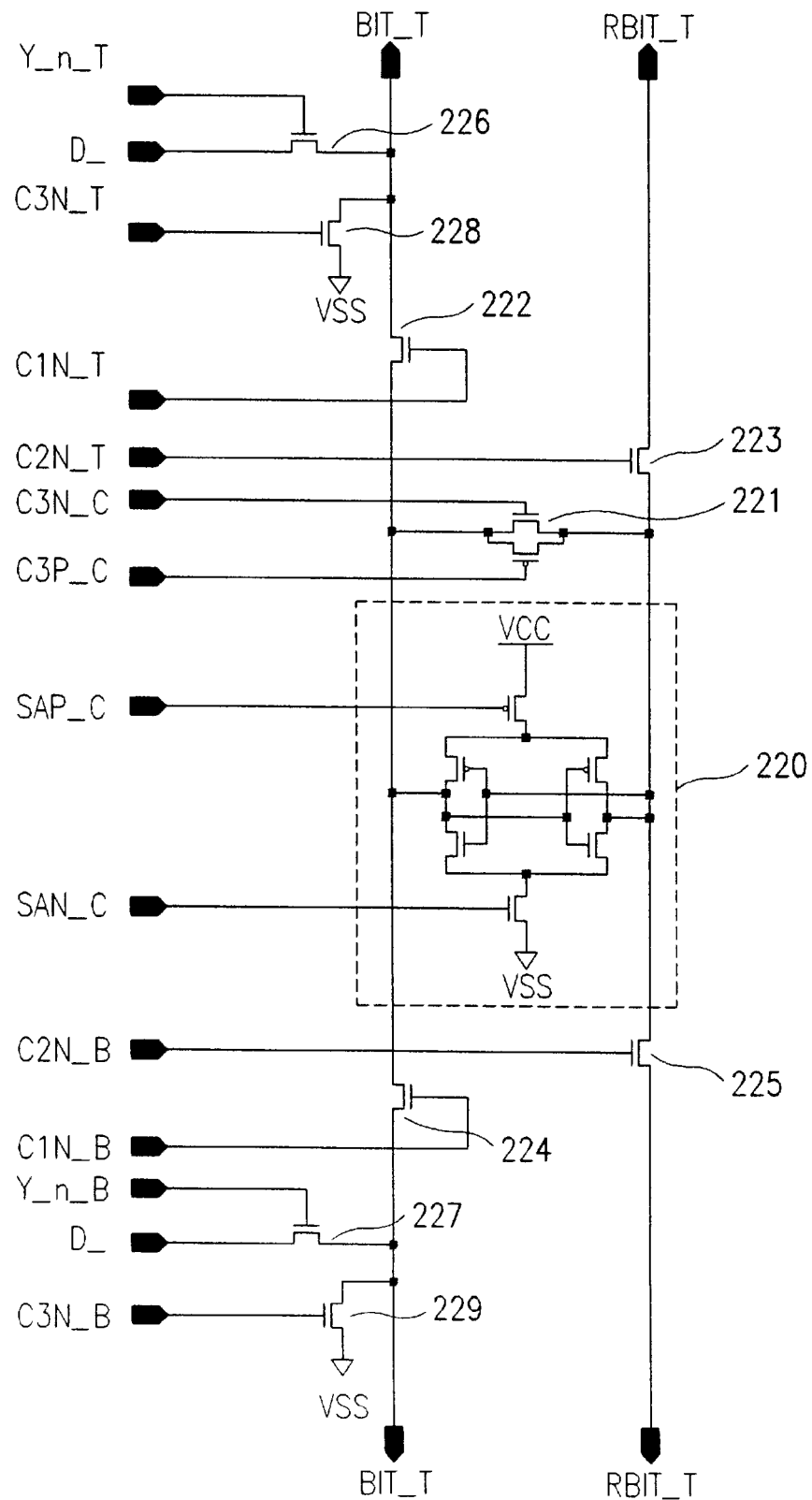
FIG. 20 illustrates a circuitry system of a second embodiment sense amplifier and input/output controller in accordance with the present invention shown in FIG. 8.
Figure 21:
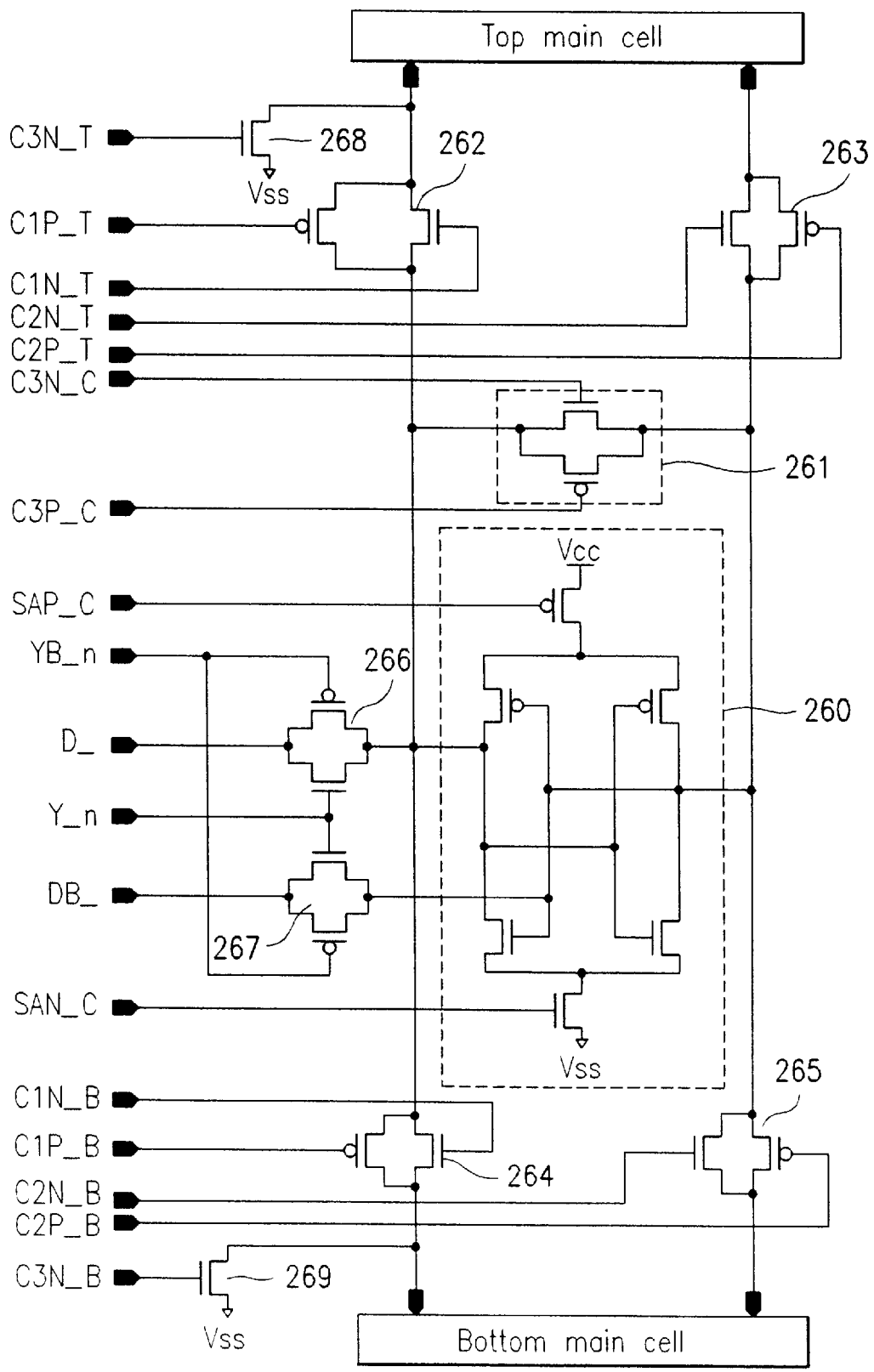
FIG. 21 illustrates a circuitry system of a third embodiment sense amplifier and input/output controller in accordance with the present invention shown in FIG. 8.
Figure 22:
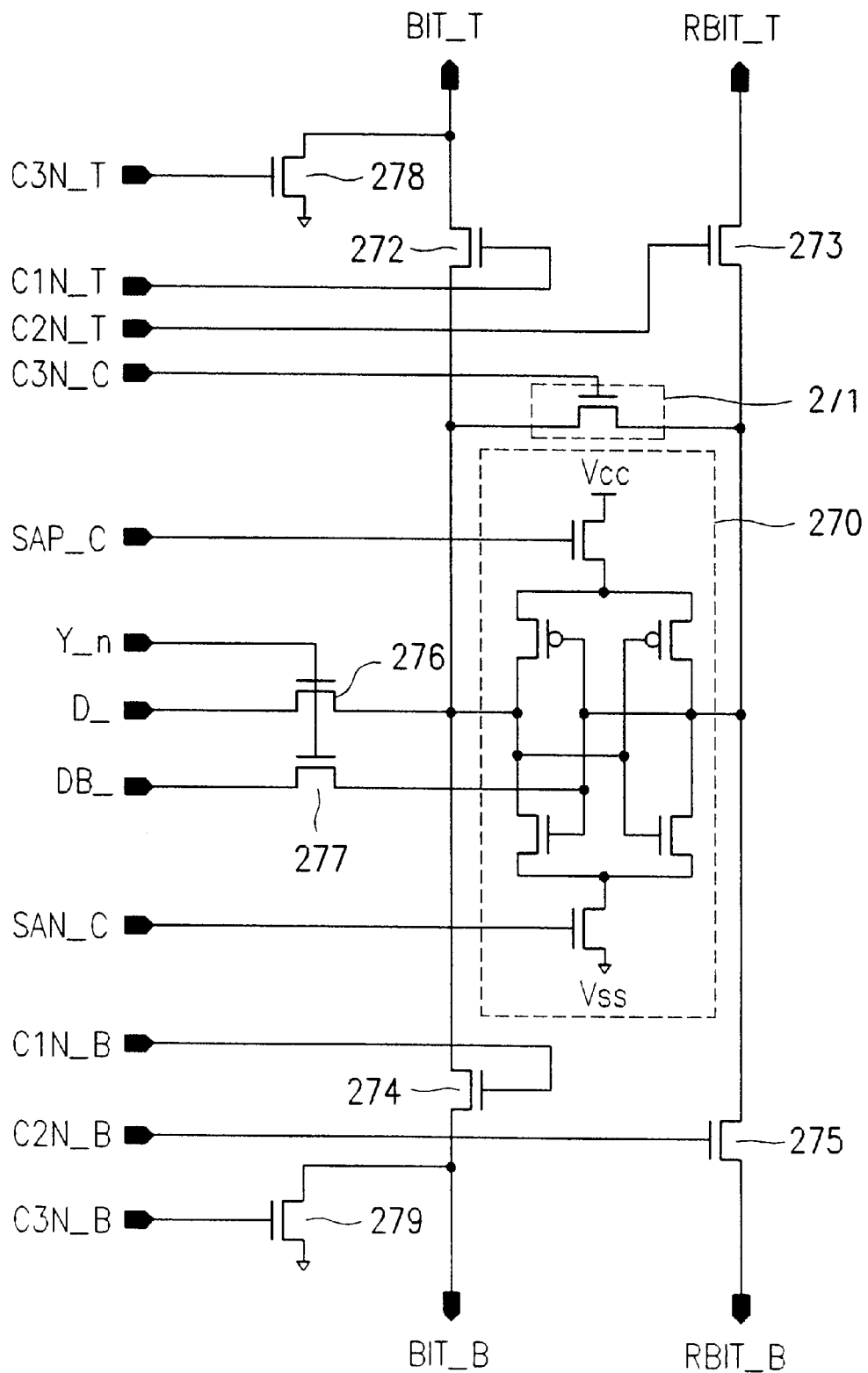
FIG. 22 illustrates a circuitry system of a fourth embodiment sense amplifier and input/output controller in accordance with the present invention shown in FIG. 8.

FIG. 17 illustrates a circuitry system of the local control pulse generator in accordance with the first embodiment of the present invention shown in FIG. 8, FIG. 18 illustrates a circuitry system of the column controller in accordance with the first embodiment of the present invention shown in FIG. 8, FIG. 19 illustrates a circuitry system of a first embodiment sense amplifier and input/output controller in accordance with the present invention shown in FIG. 8, FIG. 20 illustrates a circuitry system of a second embodiment sense amplifier and input/output controller in accordance with the present invention shown in FIG. 8, FIG. 21 illustrates a circuitry system of a third embodiment sense amplifier and input/output controller in accordance with the present invention shown in FIG. 8, and FIG. 22 illustrates a circuitry system of a fourth embodiment sense amplifier and input/output controller in accordance with the present invention shown in FIG. 8.

Signals S1, S2, P2, C1, C3, C4, SAN, SAP to the local control pulse generator are signals provided from the global control pulse generator, and, being an address transition detection signal produced when a Y-address is transited, a Y-ATD signal is a high pulse. And, being a signal of a write enable pad, the WEBpad signal defines a low state as an enabled state in a write mode. Z_Add1, Z_Add2, Z_Add3 and Z_Add4 are signals from the Z_pre-decoder 14. The local control pulse generator of the present invention shown in FIG. 17 is an example of the same that provides a signal for controlling a top block in FIG. 8. Provision of an operation control pulse for a bottom block is identical. The local control pulse generator 20 includes, at large, a first control pulse generator 200 for generating a signal to be provided to the sense amplifier and I/O controller 25, a second control pulse generator 201 for generating a signal to be provided to the column controller 24, and a third control pulse generator 202 for generating a signal to be provided to the SWL driver 22. The first control pulse generator 200 includes a first logical operator 203 for receiving SAP, SAN, Z_Add3, Z_Add4 and a third control signal in controlling a top block and a bottom block and a second logical operator 204 for receiving first and second control signals C1, C2, Z_Add1 and Z_Add2 in providing control pulses of C1P_T, C1N_T, C2P_T, C2N_T, C3N_T signals.

The system of the aforementioned local control pulse generator will be explained in more detail.

The first logical operator 203 in the first control pulse generator 200 includes a first NAND gate 203-1 for subjecting Z_Add3 and Z_Add4 signals to logical operation to provide a signal involved in production of control signals to be provided to a bottom block, a second NAND gate 203-2 for subjecting a signal from the first NAND gate 203-1 and NAND operated Z_Add1 and Z_Add2 signals to logical operation, a third NAND gate 203-3 for subjecting an external SAP signal and a signal from the second NAND gate 203-2, a first inverter 203-4 for inverting a signal from the third NAND gate 203-2 to provide an SAP_C signal, a fourth NAND gate 203-5 for subjecting an SAN signal and a signal from the second NAND gate 203-2 to logical operation, a second inverter 203-6 for inverting a signal from the fourth NAND gate 203-5 to provide an SAN_C signal, a third inverter 203-7 for inverting the third control signal C3, a fifth NAND gate 203-8 for subjecting the third control signal C3 inverted by the third inverter 203-7 and a signal from the second NAND gate 203-2 to logical operation, a fourth inverter 203-9 for inverting a signal from the fifth NAND gate 203-8 to provide a C3P_C signal and a fifth inverter 203-10 for inverting a signal from the fourth inverter 203-9 to provide a C3N__C signal.

The second logical operator 204 in the first control pulse generator 200 includes a first NAND gate 204-1 for subjecting Z__Add1 and Z__Add2 signals to logical operation in providing a signal involved in generation of control signals to be provided to the top block, a first inverter 204-2 for inverting a signal from the first NAND gate 204-1, a second NAND gate 204-3 for subjecting a signal from the first inverter 204-2 and a first control signal C1 to NAND operation, second and third inverters 204-4 and 204-5 for intensifying a signal from the second NAND gate 204-3 into a C1P__T signal, a fourth inverter 204-6 for inverting a signal from the second NAND gate 204-3 to provide a C1N__T signal, a third NAND gate 204-7 for subjecting a signal from the first inverter 204-2 and a second control signal C2 to logical operation, fifth and sixth inverters 204-8 and 204-9 for intensifying a signal from the third NAND gate 204-7 into a C2P__T signal, a seventh inverter 204-10 for inverting a signal from the third NAND gate 204-7 into a C2N__T signal, a fourth NAND gate 204-11 for subjecting a signal from the first inverter 204-2 and a third control signal C3 to logical operation, and ninth and tenth inverters 204-12 and 204-13 for intensifying a signal from the fourth NAND gate 204-11 into a C3N__T signal.

And, the second control pulse generator 201 includes a first inverter 201-1 for inverting a WEBpad signal, a second inverter 201-2 for inverting a signal from the first inverter 201-1, a third inverter 201-3 for inverting a fourth control signal, an NAND gate 201-4 for subjecting signals from the second and third inverters 201-2 and 201-3 to operation, a fourth inverter 201-5 for inverting a signal from the NAND gate 201-4, an NOR operator 201-6 for subjecting a third control signal C3, a signal from the fourth inverter 201-5 and a signal from the first NAND gate 204-1 in the second logical operator of the first control pulse generator 200 to NOR operation, a fifth inverter 201-7 for inverting a signal from the NOR operator 201-6 into a C4P__T signal and a sixth inverter 201-8 for inverting a signal from the fifth inverter 201-7 into C4N__T.

The third control pulse generator 202 includes a first inverter 202-1 for inverting a P2 signal, a first NAND gate 202-2 for subjecting a Y__ATD signal, a signal from the first inverter 202-1, a fourth control signal C4 and the inverted WEBpad signal to logical operation, a second inverter 202-3 for inverting a signal from the first NAND gate 202-2, third, fourth, fifth and sixth inverters 202-4, 202-5, 202-6 and 202-7 for delaying a signal from the second inverter 202-3, a first NOR gate 202-8 for subjecting an S1 signal and a signal from the second inverter 202-3 to operation, a second NOR gate for subjecting a signal from the first NOR gate 202-8 and a signal from the first NAND gate 204-1 in the second logical operator 204 to NOR operation, a seventh inverter 202-10 for inverting a signal from the second NOR gate 202-9 into a PS1__T signal, a third NOR gate 202-11 for subjecting a second control signal S2 and a signal from the sixth inverter 202-7 to operation, a fourth NOR gate 202-12 for subjecting a signal from the third NOR gate 202-11 and a signal from the first NAND gate 204-1 in the second logical operator 204 to NOR operation and a seventh inverter 202-13 for inverting a signal from the fourth NOR gate 202-12 into a PS2__T signal.

In the aforementioned local control pulse generator of the present invention, the first logical operator 203 in the first control pulse generator 200 is a block in which a control pulse for use for the top block and the bottom block in common is generated, and the second logical operator 204 in the first control pulse generator 200 and the second, and third control pulse generators 201 and 202 are blocks for generating a pulse for controlling the top block.

The operation of the control pulse generation in the local control pulse generator of the present invention will be explained.

First, in a write mode, as the WEBpad signal is at low, a signal passed through the first inverter 201-1 and second inverter 201-2 in the second pulse generator 201 is at low to disenable the first NAND gate 201-4, causing the first NAND gate to provide a high level signal, to enable the NOR operator 201-6. As the NOR operator 201-6 enabled, the third control signal C3 provides a C4P__T signal through the fifth inverter 201-7 and also a C4N__T through the sixth inverter 201-8. The third control signal C3 causes a state before the split wordlines SWL1 and SWL2 are enabled, i.e., a state in which all the column selection signals are disenabled in an pre-charge interval of a memory cell bitline and a reference cell bitline. The disenabled column selection signal blocks a signal flow between a data bus and a bitline, preventing collision of a data on a bitline with a data on an input/output data bus in pre-charging the bitline in a write mode. And, as the WEBpad signal is at low in the write mode, a signal from the first inverter 201-1 in the second control pulse generator 201 is at high, enabling the NAND gate 202-2 in the third control pulse generator 202. Accordingly, the NAND gate 202-2 in the third control pulse generator 202 is under the control of the Y-ATD signal, P2 and C4 signal. That is, while the S1 and S2 signals are operative in regular conditions at high of the P2 signal, the NAND gate 202-2 in the third control pulse generator 202 is disenabled for assuring the operations of the S1 and S2 signals in the regular conditions. As the P2 signal becomes low upon completion of the regular condition operations of the S1 and S2 signals, an output of the first inverter 202-1 in the third control pulse generator 202 becomes high, enabling the NAND gate 202-2 in the third control pulse generator 202 at the end. Under this condition, the NAND gate 202-2 in the third control pulse generator 202 is operated depending on a state of the Y-ATD or C4 signal. In this instance, as an output from the first inverter 202-1 in the second control pulse generator 201 is at high, if the C4 signal also becomes high, the NAND gate 202-2 in the third control pulse generator 202 is enabled, providing the Y-ATD signal to the SWL driver block 70. In detail, the S1 and S2 signals enable the first and third NOR gates 202-8 and 202-11 in the third control pulse generator 202 respectively in an interval the Y-address is transited, allowing the Y-ATD signal provided to the first NOR gate 202-8 in the third control pulse generator 202 through the NAND gate 202-2 and the second inverter 202-3 in the third control pulse generator 202 and a signal delayed by the third, fourth, fifth and sixth inverters 202-4, 202-5, 202-6 and 202-7 which are adapted to delay a signal from the second inverter 202-3 in the third control pulse generator 202 is provided to the third NOR gate 202-11. The Y-ATD signal passed through the first, and second NOR gates 202-8 and 202-9 and the seventh inverter 202-10 in the third control pulse generator 202 is an inverted low PS1__T signal. And, the delayed Y-ATD signal passed through the third, and fourth NOR gates 202-11 and 202-12 and the seventh inverter 202-13 in the third control pulse generator 202 is an inverted low PS2__T signal. Accordingly, each of the PS1__T signal and the PS2__T signal has a phase inverted from the Y-ATD signal. The overlap time period of the PS1__T signal and the PS2__T signal in low states can be adjusted by adjusting sizes of the third, fourth, fifth and sixth inverters 202-4, 202-5, 202-6 and 202-7 which delay a signal from the second inverter 202-3 in the third control pulse generator 202. And, in a read mode, the NAND gate 201-4 in the second control pulse generator 201 is enabled, to convert the C4 signal into C4P_T signal through the third inverter 201-3, the NAND gate 201-4, the fourth inverter 201-5, the NOR operator 201-6 and the fifth inverter 201-7 in the second control pulse generator 201. Then, a signal from the fifth inverter 201-7 is converted into C4N_T signal through the sixth inverter 201-8. The C4P_T and C4N_T signals provide signals amplified by the sense amplifier to data bus. In a read mode like this, a signal from the first inverter 201-1 in the second control pulse generator 201 in a low state disables the NAND GATE 202-2 in the third control pulse generator 202, blocking transmission of Y-ATD, P2 and C4 signal. And, a signal from the second inverter 202-3 in the third control pulse generator 202 is become low, to enable the first NOR gate 202-8 in the third control pulse generator 202. This foregoing operation of control pulse generation makes the PS1_T signal and the PS2_T signal to be provided to the SWL driver 22 to have waveforms which have phases opposite to phases of the S1 and S2 signals, respectively.

The system of the column controller in the SWL ferroelectric memory of the present invention will be explained.

FIG. 18 illustrates a block for controlling a top memory cell array, taken as an example. The column controller receives address and control signals from the Y-pre-decoder 18 and the local control pulse generator 20 to provide a column selection signal for selecting an arbitrary cell in a data input/output, which has the following system.

That is, the column controller includes a plurality of NAND gates 230, 231, 232 and 233 each for subjecting one of addresses Ypre_n, Ypre_n+1, Ypre_n+2 and Ypre_n+3, - - -, decoded in the Y-pre-decoder 18 and the C4N_T signal from the local control pulse generator 20 to logical operation and inverters 234, 235, 236 and 237 respectively connected to output terminals of the NAND gates 230, 231, 232 and 233. The signals from the NAND gates 230, 231, 232 and 233 are, passed through respective inverters 234, 235, 236 and 237, become Y-addresses Y_n_T, Y_n+1_T, Y_n+2_T, Y_n+3_T, - - -, and not passed through respective inverters 234, 235, 236 and 237, become reference/Y-addresses YB_n_T, YB_n+1_T, YB_n+2_T, YB_n3_T, - - - . When enabled, only any one of the Y-addresses Y_n_T, Y_n+1_T, Y_n+2_T, Y_n+3_T, - - - is enabled at high and only any one of the /Y-addresses YB_n_T, YB_n+1_T, YB_n+2_T, YB_n+3_T, - - - is enabled at low. These enabled signals controls enable/disenable of the transistors connected to data buses in the sense amplifier and input/output controller 25 or the switching blocks with transmission gates.

A first embodiment sense amplifier and input/output controller of the present invention according to the system shown in FIG. 8 will be explained in detail.

Referring to FIG. 19, in the first embodiment sense amplifier and input/output controller of the present invention, there is a sense amplifier 210 having an arbitrary bitline BIT_T connected to a top memory cell, an arbitrary bitline RBIT_T connected to a top reference cell, an arbitrary bitline BIT_T connected to a low memory cell and an arbitrary bitline RBIT_T connected to a low reference cell. That is, the first embodiment sense amplifier and input/output controller of the present invention according to the system shown in FIG. 8 includes the sense amplifier 210 for sensing and amplifying data on corresponding lines in response to sensing amplifier enable signals SAP_C and SAN_C from the local control pulse generator 20, an equalizer 211 for equalizing voltages on bitlines BIT_T and RBIT_T or BIT_B and RBIT_B in response to equalizing signals C3N_C or C3P_C, first and second transmission gates 212 and 213 each adapted to be switched in response to top cell array connection signals C1P_T and C1N_T or C2P_T and C2N_T from the local control pulse generator 20 for selective connection of the bitlines BIT_T or RBIT_T connected to the top main cell or the reference cell to an input/output line on the sense amplifier 210, third and fourth transmission gates 214 and 215 each adapted to be switched in response to bottom cell array connection signals C1P_B and C1N_B or C2P_B and C2N_B for selective connection of the bitlines BIT_B or RBIT_B connected to the bottom main cell or the reference cell to an input/output line on the sense amplifier 210, a fifth transmission gate 216 connected to a bitline BIT_T between the first transmission gate 212 and the top memory cell for controlling connection to a data bus terminal D_BUS in response to column selection signals Y_n_T and YB_n_T, a sixth transmission gate 217 connected to a bitline BIT_B between the third transmission gate 214 and the bottom memory cell for controlling connection to a data terminal D_ in response to column selection signals Y_n_B and YB_n_B, a first bitline level adjuster 218 having one electrode connected to a bitline BIT_T between the first transmission gate 212 and the fifth transmission gate 216 and the other electrode connected to the power supply terminal for adjusting a level of the bitline BIT_T in response to a pull-down control signal C3N_T applied to the gate, and second bitline level adjuster 219 having one electrode connected to a bitline BIT_B between the third transmission gate 214 and the bottom memory cell array block and the other electrode connected to the power supply terminal for adjusting a level of the bitline BIT_B in response to a pull-down control signal C3N_B applied to the gate. The data terminal D_ is used for operations both in the read mode and write mode in common. That is, the data terminal D_ is used as a transmission path of a signal from the sense amplifier in the read mode and as a transmission path of a data to be written on a memory cell.

A second embodiment sense amplifier and input/output controller of the present invention according to the system shown in FIG. 8 will be explained in more detail.

Referring to FIG. 20, the second embodiment sense amplifier and input/output controller of the present invention according to the system shown in FIG. 8 includes a sense amplifier 220 connected to bitlines BIT_T, RBIT_T, BIT_B and RBIT_B for sensing and amplifying data on corresponding lines in response to sensing amplifier enable signals SAP_C and SAN_C from the local control pulse generator 20, an equalizer 221 for equalizing voltages on bitlines BIT_T and RBIT_T or BIT_B and RBIT_B in response to equalizing signals C3N_C or C3P_C, first and second NMOS transistors 222 and 223 each adapted to be switched in response to top cell array connection signals C1N_T or C2N_T from the local control pulse generator 20 for selective connection of the bitlines BIT_T or RBIT_T connected to the top main cell or the reference cell to an input/output line on the sense amplifier 220, third and fourth NMOS transistors 224 and 225 each adapted to be switched in response to bottom cell array connection signals C1N_B or C2N_B for selective connection of the bitlines BIT_B or RBIT_B connected to the bottom main cell or the reference cell to an input/output line on the sense amplifier 220, a fifth NMOS transistor 226 connected to a bitline BIT_T between the first NMOS transistor 222 and the top memory cell for controlling connection to a data bus terminal D__ in response to column selection signals Y__n__T, a sixth NMOS transistor 227 connected to a bitline BIT__B between the third NMOS transistor 224 and the bottom memory cell for controlling connection to a data terminal D__ BUS in response to a column selection signal Y__n__B, a first bitline level adjuster 228 having one electrode connected to a bitline BIT__T between the first NMOS transistor 222 and the fifth NMOS transistor 226 for adjusting a level of the bitline BIT__T in response to a pull-down control signal C3N__T applied to the gate, and second bitline level adjuster 229 having one electrode connected to a bitline BIT__B between the third NMOS transistor 224 and the bottom memory cell array block for adjusting a level of the bitline BIT__B in response to a pull-down control signal C3N__B applied to the gate.

Different control signals provided to the sense amplifier and input/output controller will be explained controller, together with operation of blocks therein.

The SAN__C signal is provided to the NMOS transistor having one electrode connected to the sense amplifier and the other side connected to a ground terminal Vss at a gate therein, to enable the sense amplifier 210 at high and to disable the sense amplifier 210 at low. And, the SAP__C signal is provided to the PMOS transistor having one electrode connected to the sense amplifier and the other side connected to a power supply terminal Vcc at a gate therein, to enable the sense amplifier 210 at low and to disable the sense amplifier 210 at high. The equalizing signals C3N__C and C3P__C provided to the equalizer 211 equalize voltages on bitlines BIT__T, RBIT__T, BIT__B and RBIT__B on the main and reference cells and the sense amplifier 210 before the split wordlines SWL1 and SWL2 are enabled. The pull-down control signal C3N__T turns on the first bitline level adjuster 218 in selection of the top main cell column and reference cell column, to conduct a pull-down operation to make the bitlines BIT__T and RBIT__T connected to the top main memory cell and the reference cell at low. And, the pull-down control signal C3N__B turns on the second bitline level adjuster 219 in selection of the bottom main cell column and reference cell column, to conduct a pull-down operation to make the bitlines BIT__T and RBIT__T connected to the bottom main memory cell and the reference cell at low.

A third embodiment sense amplifier and input/output controller of the present invention according to the system shown in FIG. 8 will be explained in more detail.

Referring to FIG. 21, the third embodiment sense amplifier and input/output controller of the present invention according to the system shown in FIG. 8 includes a sense amplifier 260 connected to bitlines BIT__T, RBIT__T, BIT__B and RBIT__B for sensing and amplifying data on corresponding lines in response to sensing amplifier enable signals SAP__C and SAN__C from the local control pulse generator, an equalizer 261 for equalizing voltages on bitlines BIT__T and RBIT__T or BIT__B and RBIT__B in response to equalizing signals C3N__C or C3P__C, first and second transmission gates 262 and 263 each adapted to be switched in response to top cell array connection signals C1P__T and C1N__T or C2P__T and C2N__T from the local control pulse generator for selective connection of the bitlines BIT__T or RBIT__T connected to the top main cell or the reference cell to an input/output line on the sense amplifier 260, third and fourth transmission gates 264 and 265 each adapted to be switched in response to bottom cell array connection signals C1P__B and C1N__B or C2P__B and C2N__B for selective connection of the bitlines BIT__B or RBIT__B connected to the bottom main cell or the reference cell to an input/output line on the sense amplifier 260, a fifth transmission gate 266 connected to the input/output terminal on the sense amplifier 260 for controlling connection to a data terminal D__ in response to column selection signals Y__n and YB__n, a sixth transmission gate 267 connected to the input/output terminal on the sense amplifier 260 for controlling connection to a data bar terminal DB__ in response to column selection signals Y__n and YB__n, a first bitline level adjuster 268 connected to a bitline BIT__T between the first transmission gate 262 and the top memory cell for adjusting a level of the bitline BIT__T in response to a pull-down control signal C3N__T applied to the gate, and second bitline level adjuster 269 having one electrode connected to a bitline BIT__B between the third transmission gate 264 and the bottom memory cell array block for adjusting a level of the bitline BIT__B in response to a pull-down control signal C3N__B applied to the gate.

The SAN__C signal is provided to the NMOS transistor having one electrode connected to the sense amplifier and the other side connected to a ground terminal Vss at a gate therein, to enable the sense amplifier 260 at high and to disable the sense amplifier 260 at low. And, the SAP__C signal is provided to the PMOS transistor having one electrode connected to the sense amplifier and the other side connected to a power supply terminal Vcc at a gate therein, to enable the sense amplifier 260 at low and to disable the sense amplifier 260 at high. The equalizing signals C3N__C and C3P__C provided to the equalizer 261 equalize voltages on bitlines BIT__T, RBIT__T, BIT__B and RBIT__B on the main and reference cells and the sense amplifier 260 before the split wordlines SWL1 and SWL2 are enabled. The pull-down control signal C3N__T turns on the first bitline level adjuster 268 in selection of the upper main cell column and reference cell column, to conduct a pull-down operation to make the bitlines BIT__T and RBIT__T connected to the upper main memory cell and the reference cell at low. And, the pull-down control signal C3N__B turns on the second bitline level adjuster 269 in selection of the bottom main cell column and reference cell column, to conduct a pull-down operation to make the bitlines BIT__T and RBIT__T connected to the bottom main memory cell and the reference cell at low.

A fourth embodiment sense amplifier and input/output controller of the present invention according to the system shown in FIG. 8 will be explained in more detail.

Referring to FIG. 22, the fourth embodiment sense amplifier and input/output controller of the present invention according to the system shown in FIG. 8 includes a sense amplifier 270 connected to bitlines BIT__T, RBIT__T, BIT__B and RBIT__B for sensing and amplifying data on corresponding lines in response to sensing amplifier enable signals SAP__C and SAN__C from the local control pulse generator, an equalizer 271 of an NMOS transistor for equalizing voltages on bitlines BIT__T and RBIT__T or BIT__B and RBIT__B in response to equalizing signals C3N__C or C3P__C, first and second NMOS transistors 272 and 273 each adapted to be switched in response to top cell array connection signals C1N__T or C2N__T from the local control pulse generator for selective connection of the bitlines BIT__T or RBIT__T connected to the top main cell or the reference cell to an input/output line on the sense amplifier 270, third and fourth NMOS transistors 274 and 275 each adapted to be switched in response to bottom cell array connection signals C1N__B or C2N__B for selective connection of the bitlines BIT__B or RBIT__B connected to the bottom main cell or the reference cell to an input/output line on the sense amplifier 270, a fifth NMOS transistor 276 connected to the input/output terminal on the sense amplifier 270 for controlling connection to a data terminal D__ in response to a column selection signal Y__n, a sixth NMOS transistor 277 connected to the input/output terminal on the sense amplifier 270 for controlling connection to a data bar terminal DB__ in response to a column selection signal Y__n, a first bitline level adjuster 278 of an NMOS transistor having one electrode connected to a bitline BIT__T between the first NMOS transistor 272 and the memory cell block for adjusting a level of the bitline BIT__T in response to a pull-down control signal C3N__T applied to the gate, and second bitline level adjuster 279 of an NMOS transistor having one electrode connected to a bitline BIT__B between the third NMOS transistor 274 and the bottom memory cell array block for adjusting a level of the bitline BIT__B in response to a pull-down control signal C3N__B applied to the gate.

Figure 23:
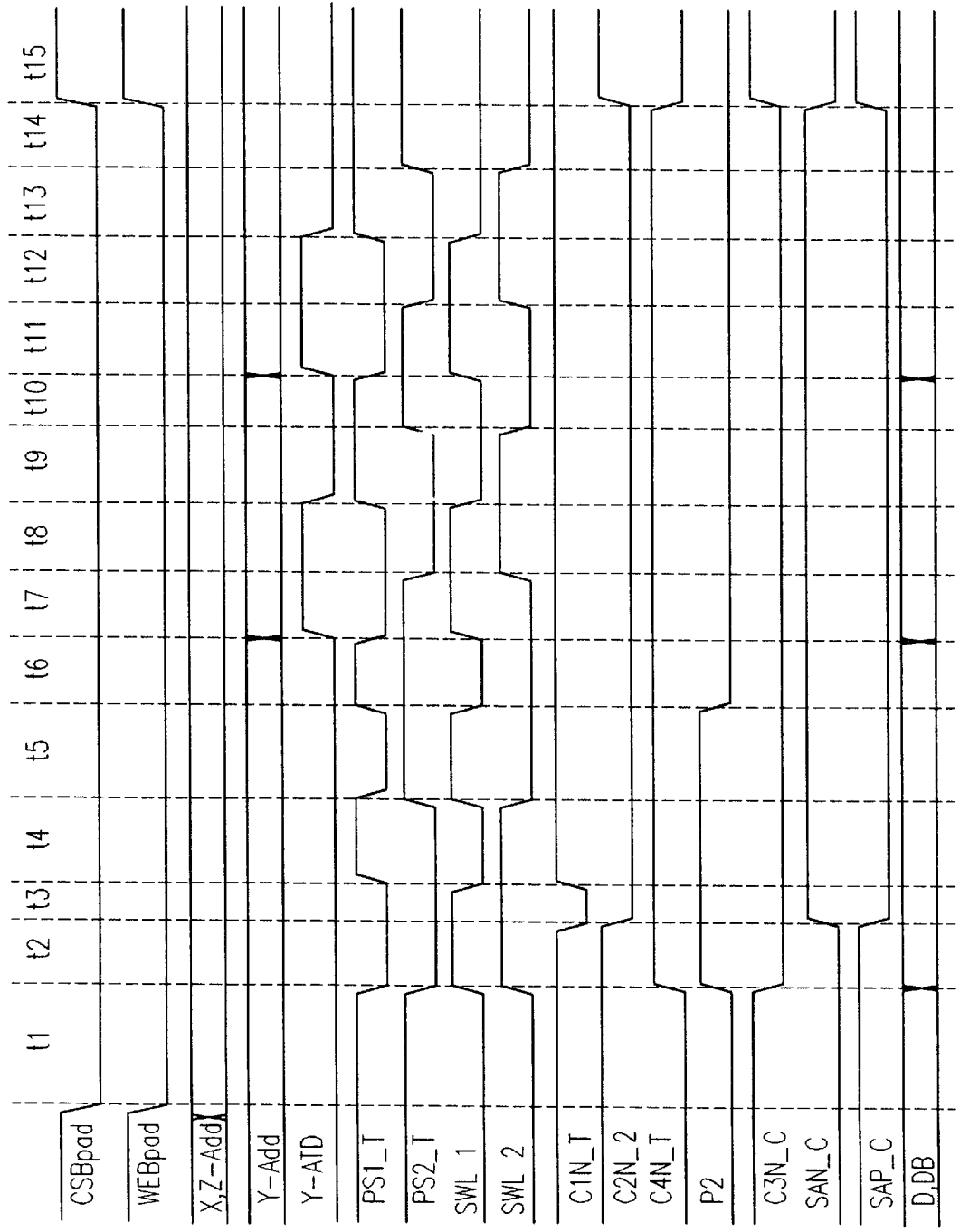
FIG. 23 illustrates a timing diagram of the local control pulse generator in a write mode when a Y-address is changed in FIG. 8.

The data input/output operation to/from the aforementioned SWL ferroelectric memory of the present invention will be explained. FIG. 23 illustrates a timing diagram of the local control pulse generator in a write mode when a Y-address is changed in FIG. 17. As a core block containing the sense amplifier and data input/output control circuit is shared by memory cell blocks adjacent to the core block in top and bottom direction, the explanation on operation will be proceeded centered on the top memory cell block. The operation timing diagram shown in FIG. 23 will be explained interval by interval, dividing a time period of the CSBpad signal, which is a chip enable signal, from being enabled at a low state to being disabled at a high state again into t1 to t15 intervals.

In the t1 interval, the CSBpad signal is enabled held at low and the WEBpad signal is enabled held at low. And, X-, Y- and Z-addresses are kept the same as before and signals of PS1__T, PS2__T, C1N__T, C2N__T, C4N__T, C3N__C, SAP__C, SAN__C, provided from the local control pulse generator, are also kept the same as before. The PS1__T signal is at high in the t1 interval, at low in t2 and t3 intervals, at high in a t4 interval, at low in a t5 interval, and at high again in a t6 interval. Then, the PS1__T signal is held at low in t8 and t9 intervals, at high in t10 and t11 intervals, at low in t12 and t13 intervals, and at high from a beginning point of t14 and onward. And, SWL1 and SWL2 signals from the SWL driver 300 are kept at low the same as before until the t1 interval transited to, and held at high at t2. The SWL1 signal has a phase opposite to the PS__T signal, but has the same transition timing, and the SWL2 signal has a phase opposite to the PS2__T signal, but has the same transition timing. And, waveform changes of each of the C1N__T and C2N__T signals, which is a control signal electrically connecting the input/output line on the sense amplifier, a bitline on a memory cell block and a bitline on a reference cell block, is as follows. While the C1N__T signal is transited to low only in t3 interval, a portion of a time period in which the SWL1 and SWL2 signals before the Y-Add signal is toggled are held at high, the C1N__T signal is held at high in rest of the intervals. The C2N__T signal is transited to, and held at low at a beginning point of the t3 interval which is a time point the C1N__T signal is transited to low and transited to high at a time point the CSBpad signal is transited to high. While the C4N__T signal is transited to high at a time point(t2) the SWL1 and SWL2 are transited to high on the same time, the C4N__T signal is transited to low again at a time point the CSBpad signal is disabled. The P2 is held at high from t2 to t5 intervals, the t2 being a time point the SWL1 and SWL2 are transited to high on the same time, and held at low in rest of the intervals. The C3N__C signal is held at high up to t1 interval as before, transited to, and held at low at a time point(t2) the SWL1 and SWL2 are transited to high on the same time, and transited to high when the CSBpad signal is disabled. That is, the C3N__C signal has a waveform having a phase opposite to the C4N__T signal. And, the SAN__C signal is transited to high at a time point(t2) the C1N__T and C2N__T are transited to low on the same time and held the high state until the CSBpad signal is disabled. The SAP__C signal has a phase opposite to the SAN__C signal, but has the same transition time. In the SWL ferroelectric memory of the present invention having the foregoing operation waveforms, when a Y-ATD signal is generated according to a change of a Y-address, the local control pulse generator generates PS1__T and PS2__T signals to cause the SWL driver block 70 to generate SWL1 and SWL2 signals. A logic '0' is caused to be written on an SWL memory cell in intervals the two signals of SWL1 and SWL2, thus generated, are held at high, i.e., in intervals t2~t3, t8 and t12. And, a logic 1 is caused to be written on the SWL memory cell in intervals only one of the two signals of SWL1 and SWL2, thus generated, are held at high, i.e., in intervals t4~t5, t7, t9, t11 and t13.

Figure 24:
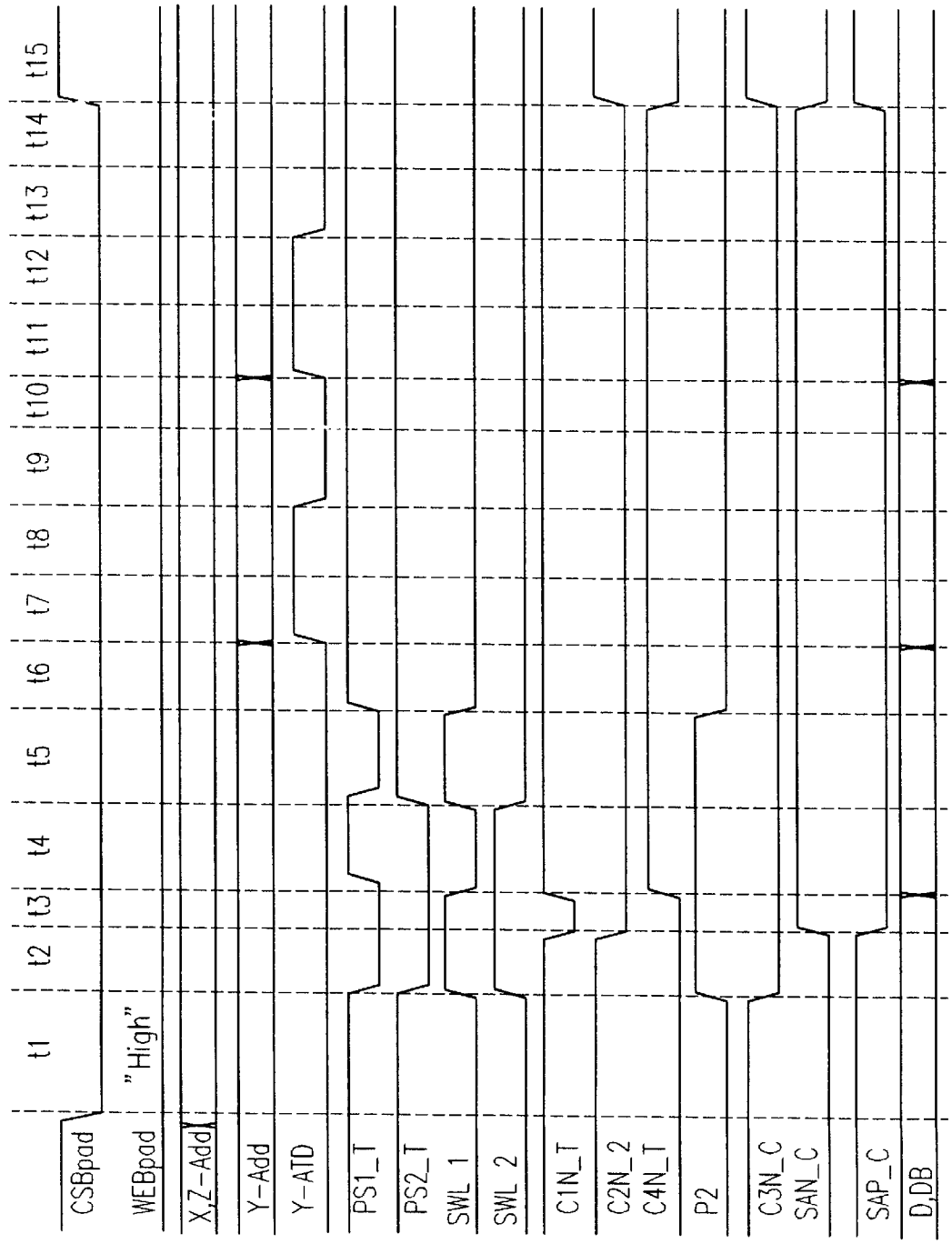
FIG. 24 illustrates a timing diagram of the local control pulse generator in a read mode when a Y-address is changed in FIG. 8.

The operation of the nonvolatile ferroelectric memory of the present invention in a read mode will be explained. FIG. 24 illustrates waveforms of the local control pulse generator in a read mode when a Y-address is changed in FIG. 17.

In the read mode, the WEDpad signal is kept disabled held at high. And, alike the write mode, the Y-ATD signal is transited to high only when the Y-address is changed. That is, when the Y-address is transited at a time point the t7 interval begins, the Y-ATD signal is held at high in t7 and t8 intervals, and, again, when the Y-address is transited at a time point the t11 begins, the Y-ATD signal is held at high from t11 to t13 intervals. The Y-ATD signal is held at low in all of the intervals other than these. The PS1__T signal is held at low in t2, t3 and t5 intervals, and held at high in intervals other than these. The PS2__T signal is held at low only from t2 to t4 intervals, and held at high in intervals other than these. The SWL1 signal has the same transition time point with the PSI__T and, but has an opposite phase, and the SWL2 signal has the same transition time point with the PS2__T and, but has an opposite phase. And, waveform changes of each of the C1N__T and C2N__T signals, which is a control signal electrically connecting the input/output line on the sense amplifier, a bitline on a memory cell block and a bitline on a reference cell block, is as follows. While the C1N__T signal is transited to low only in t3 interval, a portion of a time period in which the SWL1 and SWL2 signals before the Y-Add signal is toggled are held at high, the C1N__T signal is held at high in rest of the intervals. The C2N__T signal is transited to low at a time point the C1N__T signal is transited to low and held at low, and transited to high at a time point the WEBpad signal is transited to high. The C4N__T signal is transited to high at a time point(t4) the C1N__T signal is transited to high and transited to low again at a time point the CSBpad signal is disabled. And, while the P2 signal is transited to high at a time point(t2) the SWL1 and SWL2 are transited to high on the same time and kept in this state, the P2 signal is transited to low at a time point the SWL1 signal is transited just before the Y-Add signal is toggled. The C3N__C signal is kept high as before up to t1 interval, transited to low at a time point t2 the SWL1 and the SWL2 signals are transited to high on the same time and held at low until the CSBpad signal is disabled when the C3N_C signal is transited to high, again. And, the SAN_C signal is transited to high at a time point(t2) when both the C1N_T and C1N_T signals are transited on the same time and kept this state until the CSBpad signal is disabled. The SAP_C signal has a phase opposite to the SAN_C signal, but has the same transition time point. Thus, if only the Y-address is changed in a state the CSBpad signal is enabled at a low state, an output of the global control pulse generator shows no different as an input thereto shows no difference. The PS1_T and PS2_T signals from the local control pulse generator are adapted not to be changed in a read mode even if the Y-ATD signal is transited to high according to a change of the Y-address, for keeping the SWL1 signal and the SWL2 signal in a disabled state. Accordingly, a column decoder corresponding to a changed Y-address is enabled, to provide a data latched in the sense amplifier to a data bus. In the t7 interval a time point the Y-address is changed for the first time, a data is provided from the sense amplifier to the data bus, to carry out a read operation. And, in the t11 interval a time point the Y-address is changed for the second time, a data is also provided from the sense amplifier to the data bus, to carry out a read operation. This means that a data latched in the sense amplifier can be forwarded only by changing column gate selection in toggling the Y-address.

Figure 25:
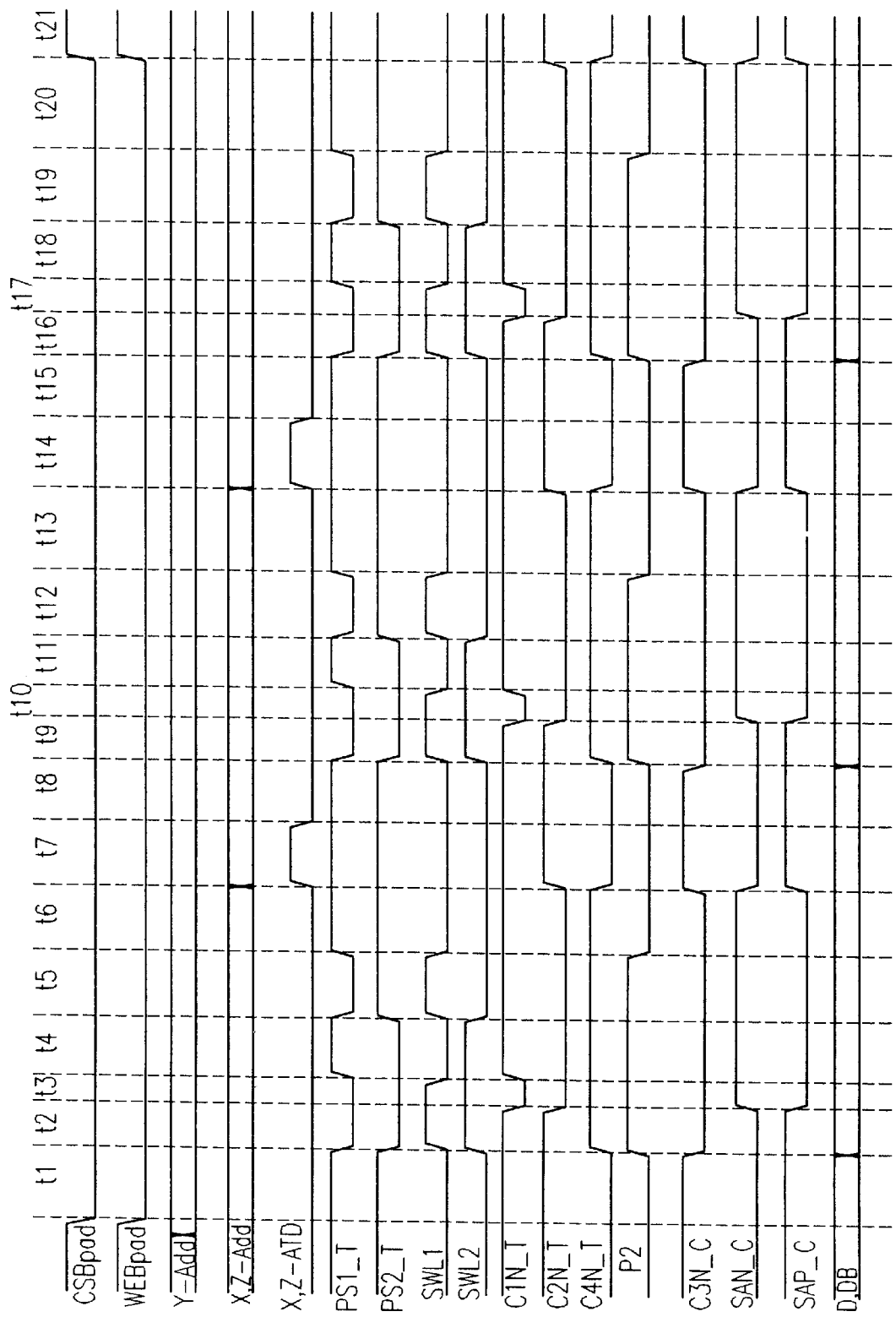
FIG. 25 illustrates a timing diagram of the local control pulse generator in a write mode when X, Z-address are changed in FIG. 8.

What is explained up to now is the data input/output operation to/from the SWL ferroelectric memory in a write mode and in a read mode in change of the Y-address only. The operation waveform when X-, and Z-addresses only are changed in a write mode and in a read mode will be explained. The operation waveform of the SWL ferroelectric memory in the write mode when X-, and Y-addresses are changed is divided into t1 to t21 intervals, for explaining interval by interval. FIG. 25 illustrates operation waveforms in a write mode of the SWL ferroelectric memory of the present invention when X, Z-address are toggled in FIG. 17.

First, the CSBpad signal is enabled transited from a previous high state to a low state at a time point the t1 begins and disabled again at a time point t21 begins. On the same time, the WEBpad signal, a write enable signal, is also enabled transited to low and disabled on the same time as the CSBpad signal is disabled. Both the CSBpad and WEBpad signals are external signals. If the X-, and Z-addresses are transited at beginning time points of t7 and t14 intervals, the X-, and Z-ATD are held at high in t8 and t14 intervals. In the t1 interval, the CSBpad signal and the WEDpad signal only are enabled while rest of the signals are kept the same as before. In the t2 interval, the CSBpad signal and the WED-pad signal are kept enabled as before and the PS1_T signal, the PS2_T signal and the C3N_C signal are transited from previous low states to high states. And, the SWL1, SWL2, C4N_T and P2 signals are transited from previous low states to high states. When the C4N_T signal is enabled transited from a low state to a high state, a data provided externally is loaded on a bitline of a memory cell and a bitline on a reference cell. In the t3 interval, all the aforementioned signals(CSBpad, WEDpad, PS1_T, PS2_T, SWL1, SWL2, C3N_C, C4N_T and P2) are kept a state of t2 as they were, the SAN_C signal is transited from a previous low state to a high state, and the SAP_C signal is transited from a high state to a low state. From this, it can be known that operation waveforms of the PS1_T and PS2_T signals repeat High(H) and Low(L) states as follows. The PS1-T signal is held at high in intervals of t1, t4, t6, t7, t8, t11, t13, t14, t15, t18 and t20 and held at low in rest of the intervals. The PS2-T signal is held at high in intervals of t1, t5~t8, t12~t15, t19~ and held at low in rest of the intervals. The SWL1 signal is transited at a time point the same as the PS1_T and has an opposite phase. The SWL2 signal is transited at a time point the same as the PS2_T and has an opposite phase. And, the C1N_T signal has low states in some of intervals(t3, t10 and t17) in which the SWL1 and SWL2 signals are held at high on the same time. The C2N_T signal is transited to low at a time point the C1N_T signal is transited to low and transited to high again at a time point the X-, and Z-ATD signals are transited to high. The C4N_T signal is transited to high at a time point the SWL1 and SWL2 signals are transited to high on the same time and transited to low again at a time point the X-, and Z-ATD signals are transited to high. The P2 signal is transited to a high state at a time point the SWL1 and SWL2 signals are transited to high on the same time and transited to a low state again at a time point the SWL1 and SWL2 signals are held at low on the same time. And, the SAN_C signal has a waveform having a phase opposite to the C2N_T signal, and the SAP_T signal has a waveform having a phase identical to the C2N_T signal.

The operation waveform will be explained interval by interval.

In the t4 interval, the PS1_T and the C1N_T signals are transited to high and the SWL1 signal is transited from high to low. In the t5 interval, the PS1_T signal is transited from a previous high state to a low state, with subsequent transition of the SWL1 signal from a low state to a high state. And, the PS2_T signal is transited from a previous low state to a high state, with subsequent transition of the SWL2 signal from a high state to a low state. When the t6 interval is begun, the PS1_T signal is transited from a low state to a high state, with subsequent transition of the SWL1 signal from a high state to a low state. And, the P2 signal is transited from a previous state, i.e., a high state to a low state. In the t7 interval, the X-, and Z-addresses are changed from low to high. And, C2N_T signal is transited from low to high, the C4N_T signal and the SAN_C signal are transited from previous high states to low states and the C3N_C signal and the SAP_C signal are transited from previous low states to high states. When the t8 is begun, only the X-, and Z-ATD signals are changed from previous high states to low states, and all signals other than the X-, and Z-ATD signals are kept states of t7 as they were. Waveform changes from a time point t9 begins is the same with the waveform changes from t2 interval~t8 interval. Finally, at a time point the t21 begins, the CSBpad signal and the WEBpad signal are transited to, and held at high, disenabling the write mode. And, the C4N_T signal is transited from a previous high state to a low state, the SAN_C signal is transited from a high state to a low state and the SAP_C signal is transited from a low state to a high state. Thus, in a write mode of the SWL ferroelectric memory of the present invention when the X-, and Z-address are changed, the C4N_T signal is enabled at a time point identical to the time point the SWL1 and the SWL2 are enabled, to provide a data to the bitline in advance before the sense amplifier is activated.

Figure 26:
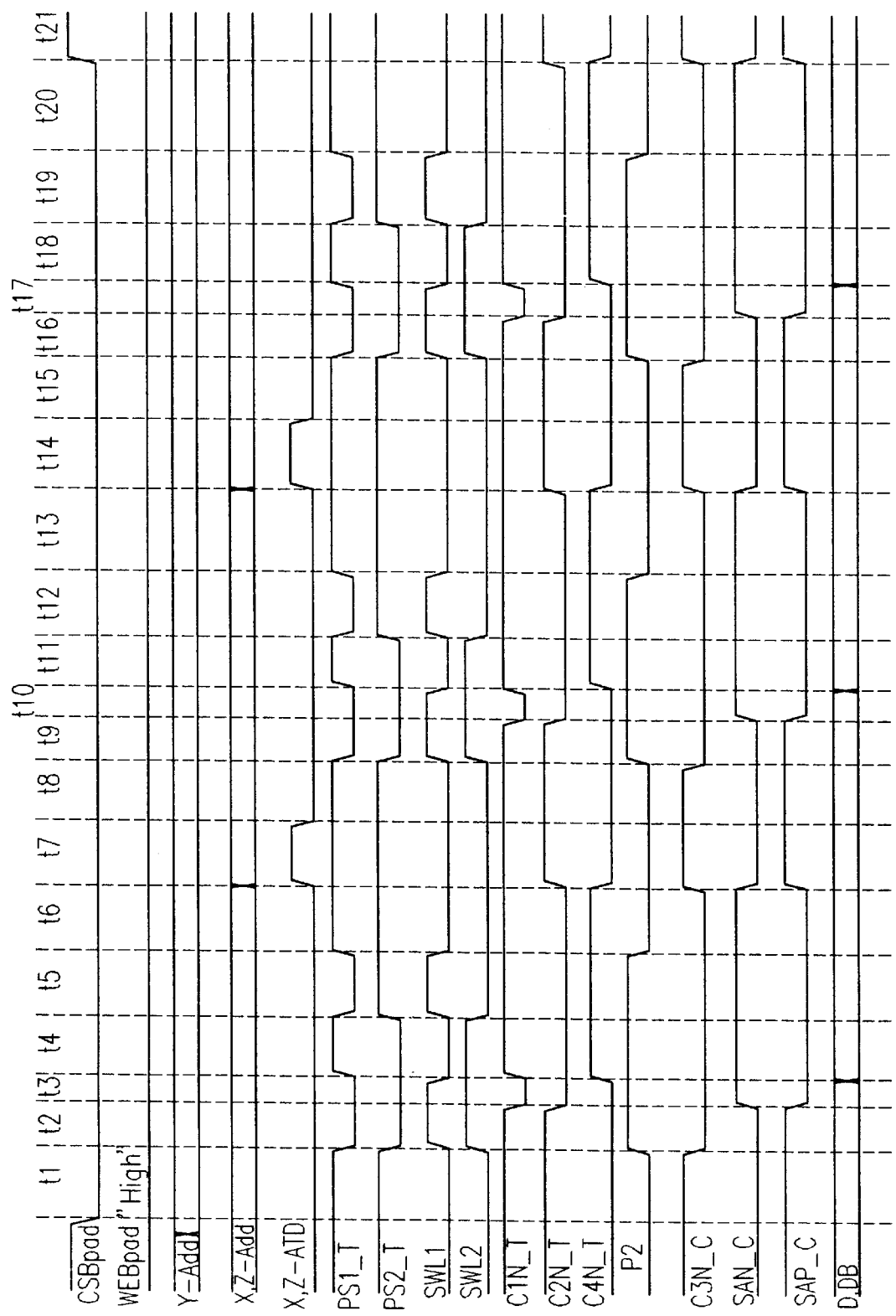
FIG. 26 illustrates a timing diagram of the local control pulse generator in a read mode when X, Z-address is changed in FIG. 8.

Operation waveforms of the SWL ferroelectric memory in a read mode when X-, and Z-addresses are changed will be explained interval by interval, dividing the waveforms into t1 to t21 intervals. FIG. 26 illustrates operation waveforms related to toggling of X-, and Z-addresses in a read mode of the SWL ferroelectric memory of the present invention shown in FIG. 17. Waveforms in the read mode are compared to that of the write mode to find that a transition time point of the C4N_T signal is differs. And, the WEBpad signal is disenabled at a high state in the read mode. The C4N_T signal is held at low from t1 interval up to t3 interval. Then, when t4 is begun, the C4N_T signal is enabled from a low state to a high state, causing a data amplified in the sense amplifier loaded on the bitline. The C4N_T signal, transited to a high state at a time point the t4 begins, is held at high until t6 interval, transited to a low state at a time point the t7 begins, held at low up to the t10 interval and transited to high at a time point the t11 begins. As the C4N_T signal is transited from a low state to a high state, a data amplified by the sense amplifier is loaded on the data input/output line. Thus, in a read mode, after the sense amplifier senses a data in advance, the C4N_T signal is enabled, to provide the sensed data to the data input/output line, thereby carrying out a reading operation.

Figure 27:
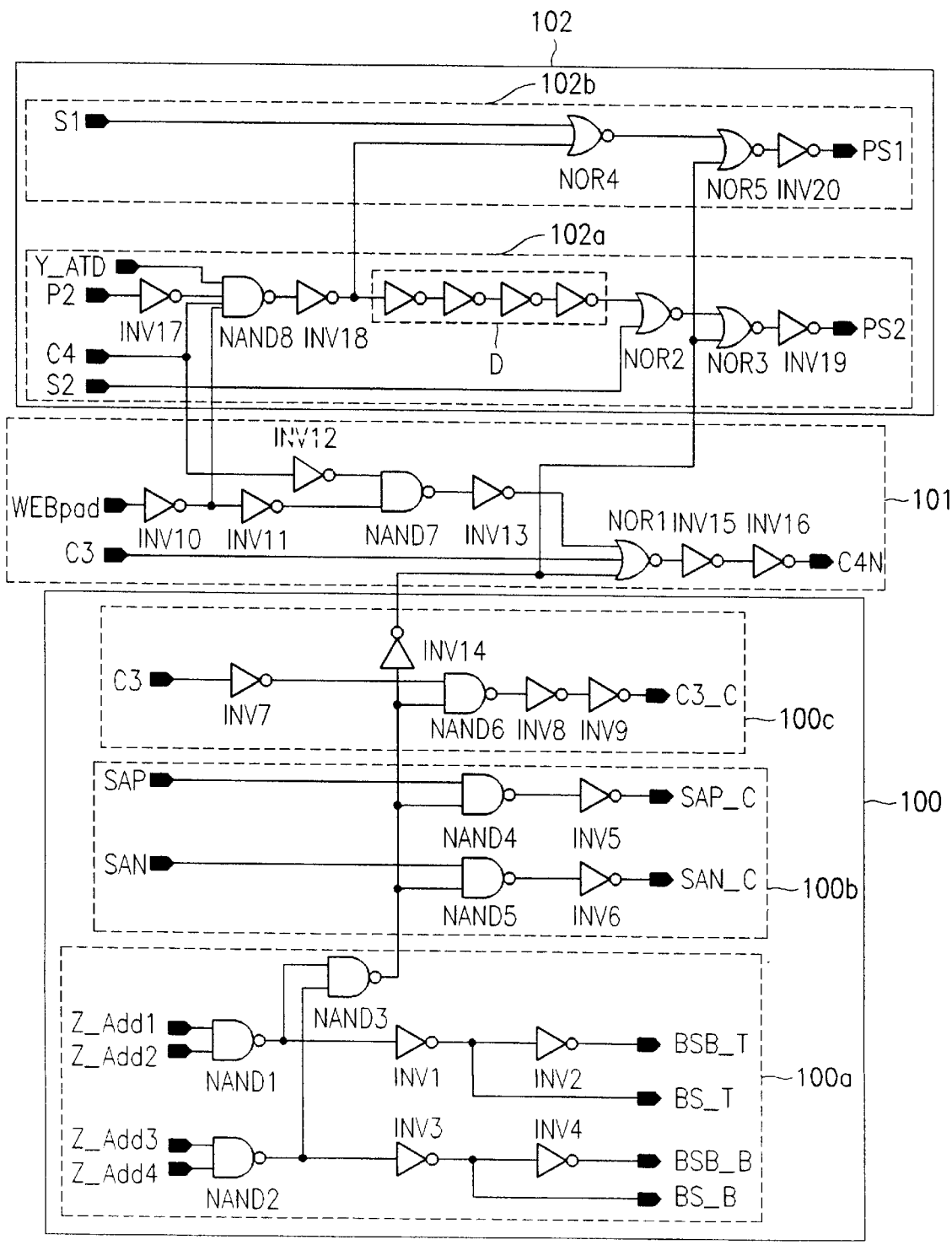
FIG. 27 illustrates a circuitry system of the local control pulse generator in accordance with the second embodiment of the present invention shown in FIG. 9.
Figure 28:
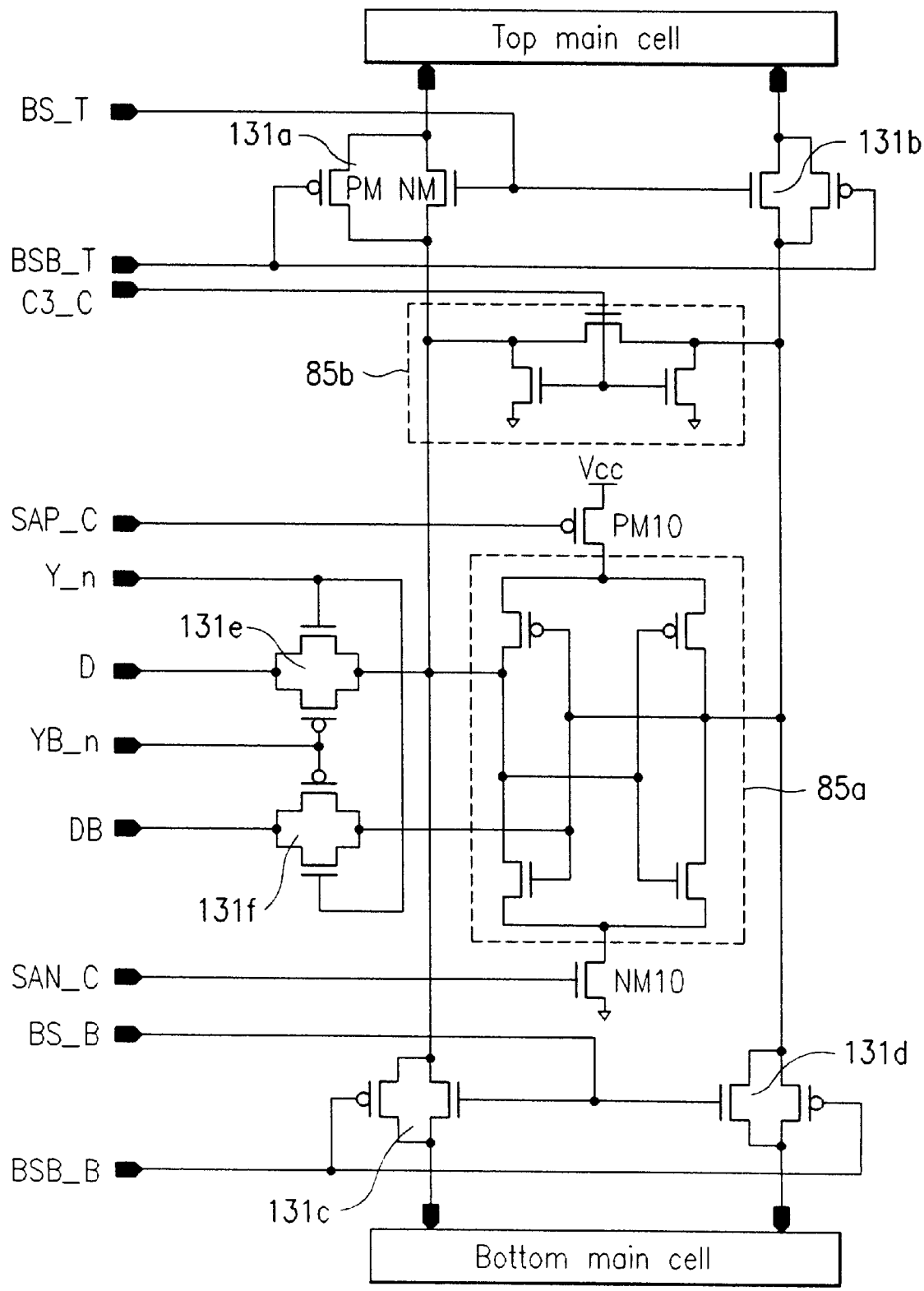
FIG. 28 illustrates a circuitry system of a first embodiment sense amplifier and input/output controller in accordance with the present invention shown in FIG. 9.
Figure 29:
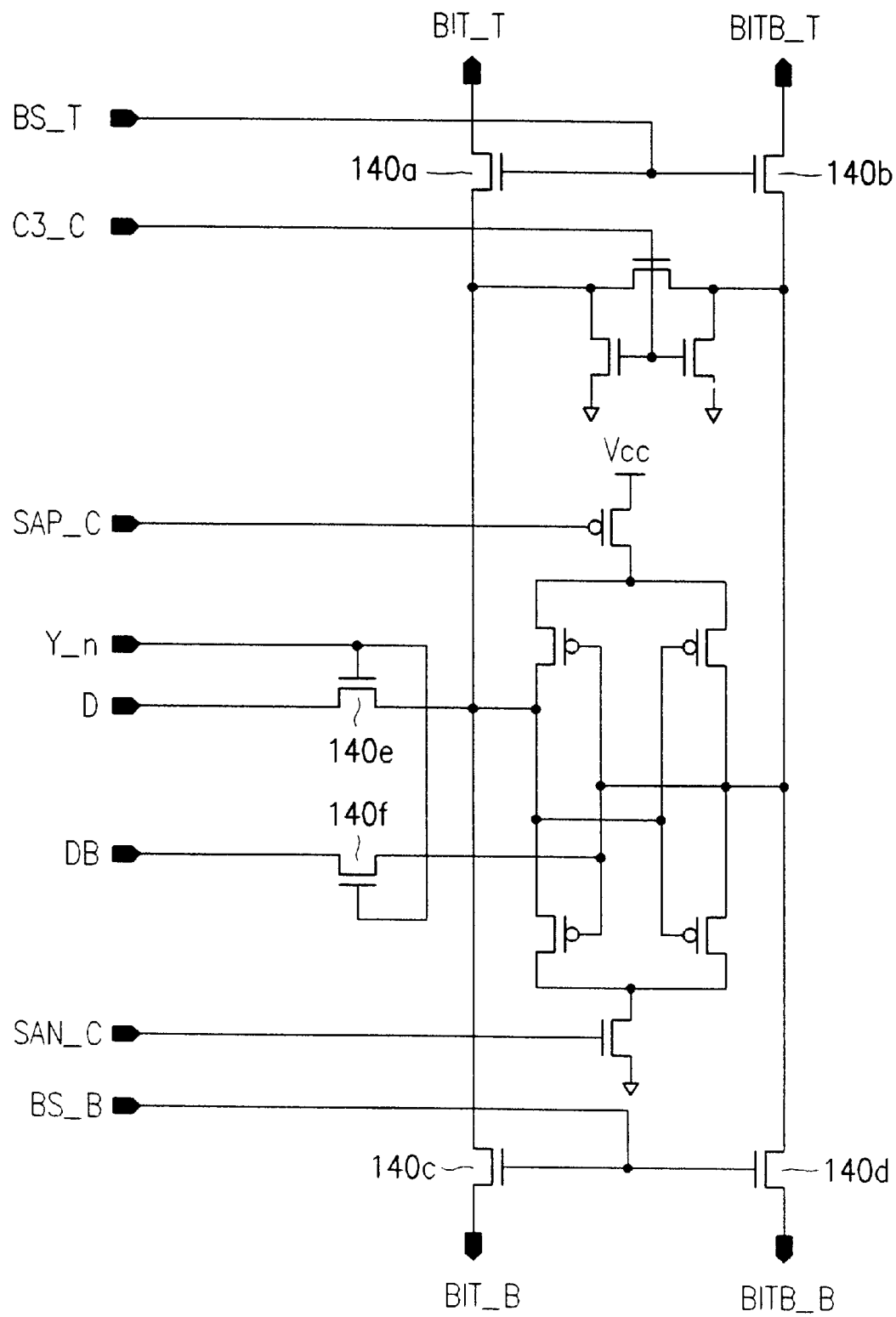
FIG. 29 illustrates a circuitry system of a second embodiment sense amplifier and input/output controller in accordance with the present invention shown in FIG. 9.
Figure 30:
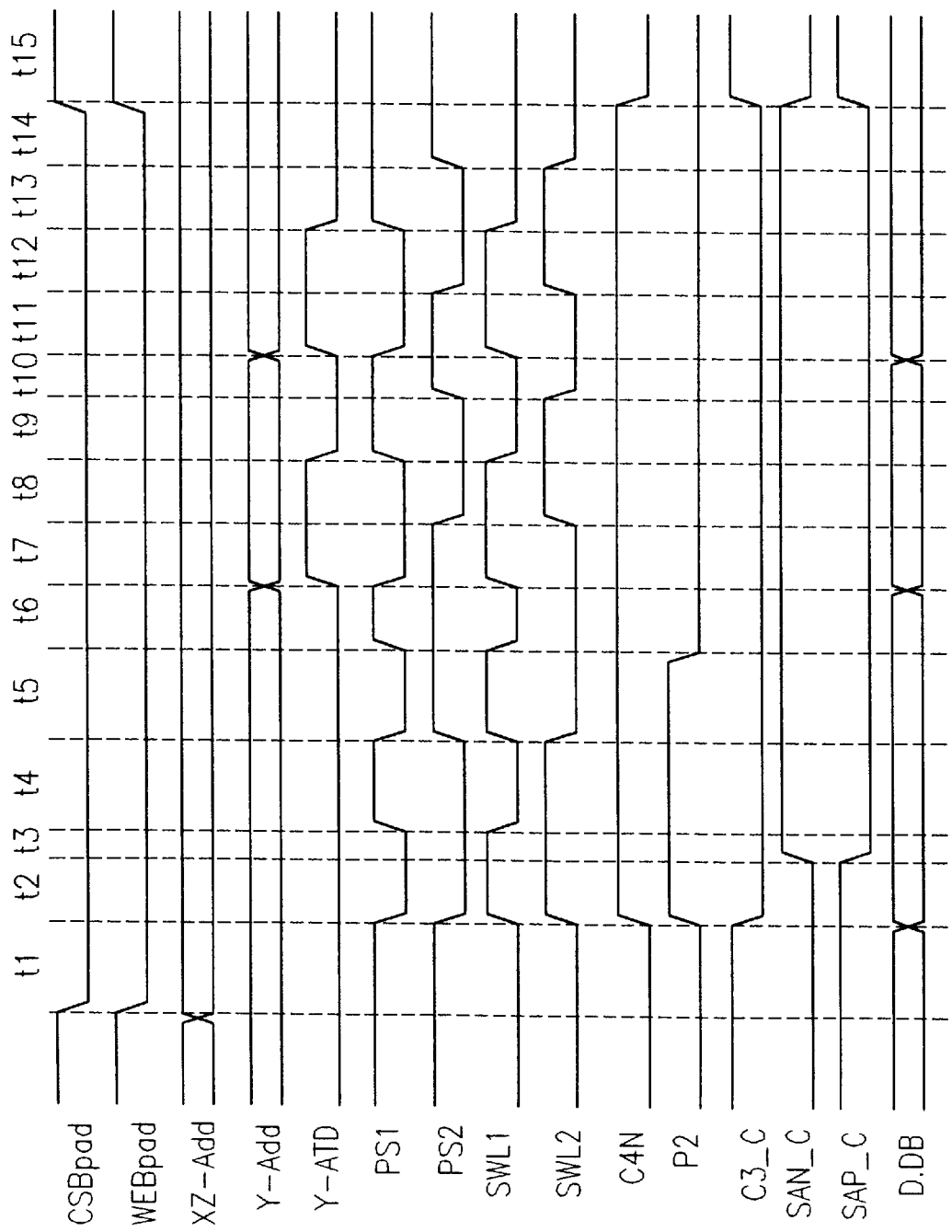
FIG. 30 illustrates a timing diagram of the local control pulse generator in a write mode when a Y-address is changed in FIG. 27.
Figure 31:
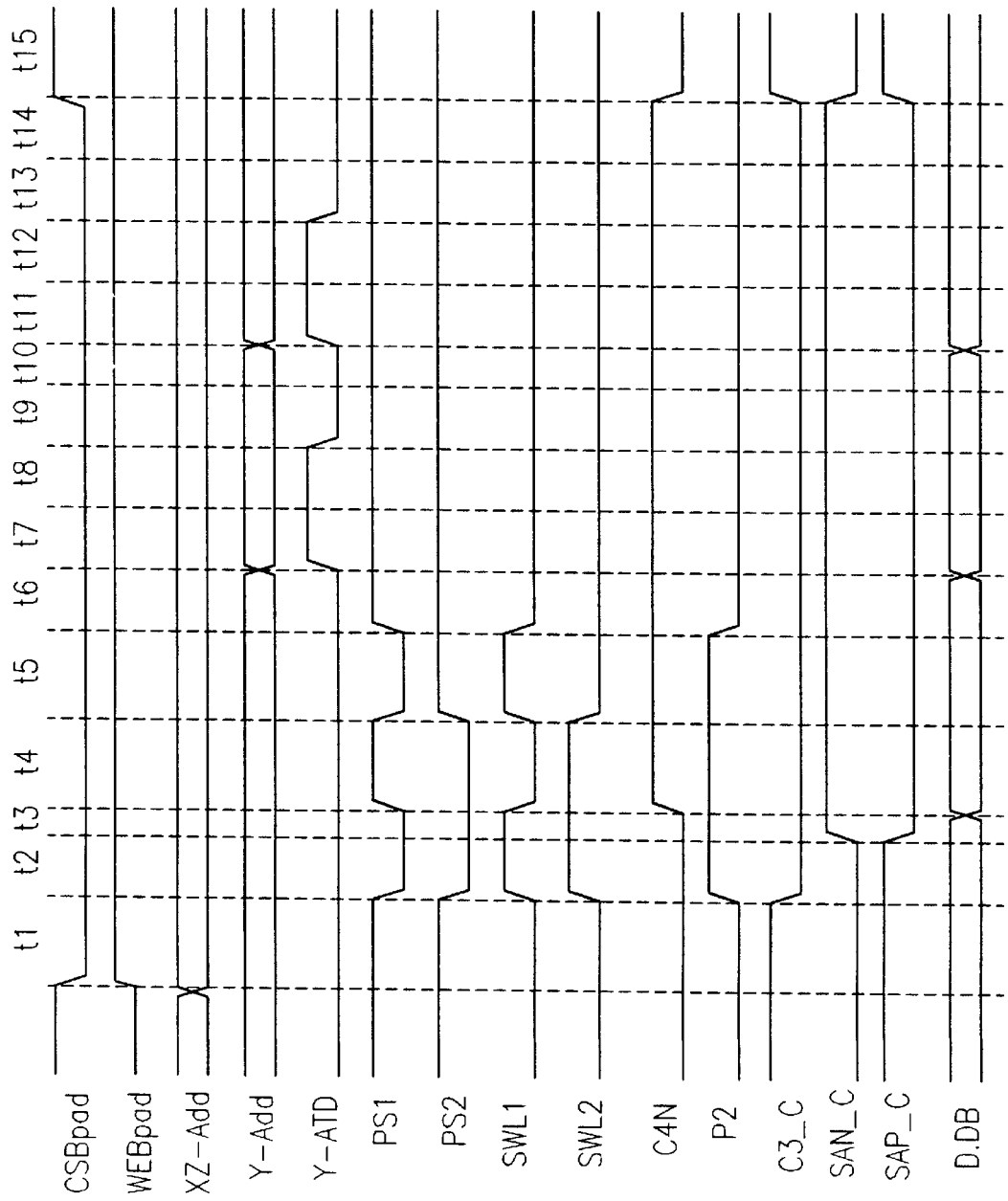
FIG. 31 illustrates a timing diagram of the local control pulse generator in a read mode when a Y-address is changed in FIG. 27.
Figure 32:
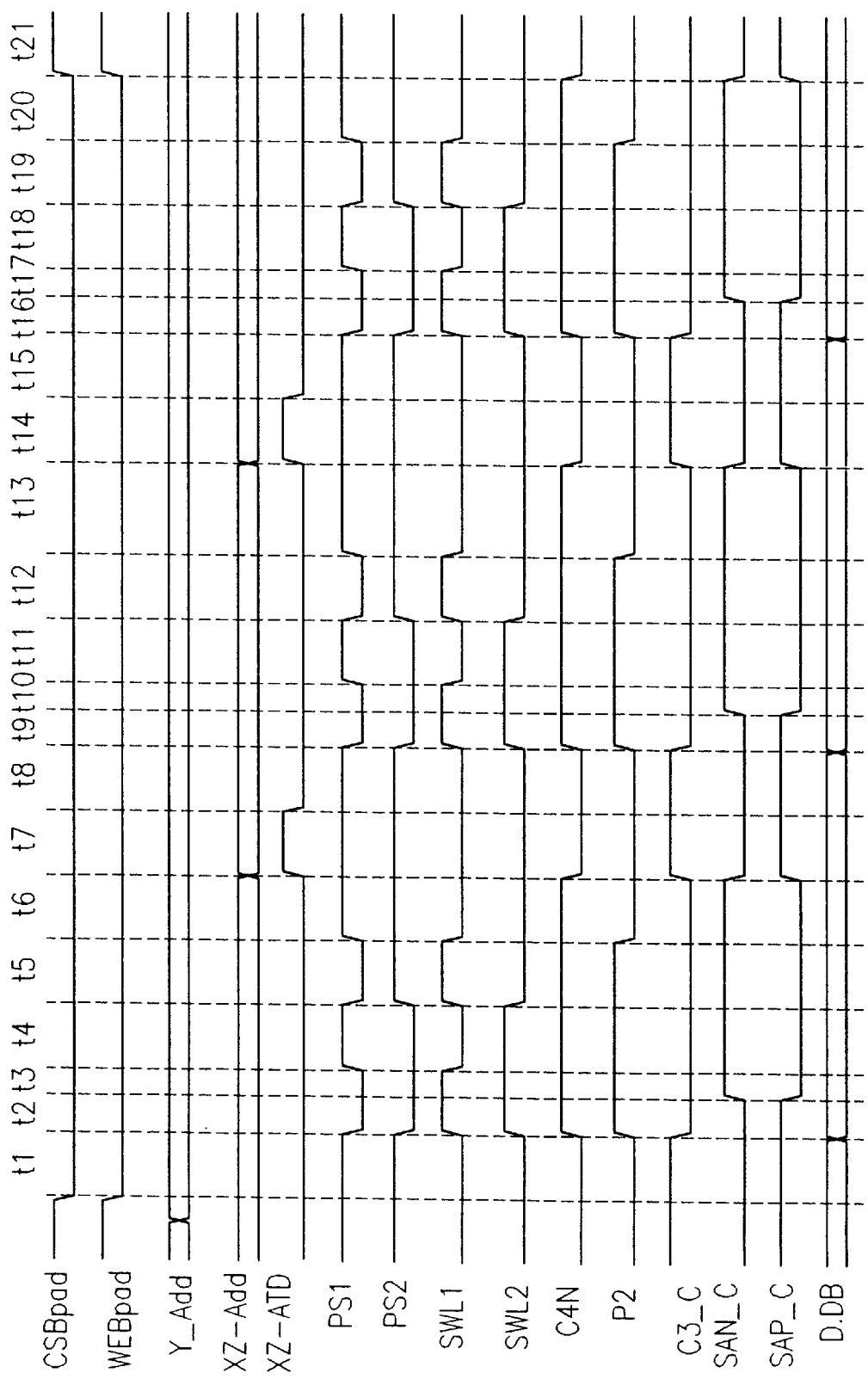
FIG. 32 illustrates a timing diagram of the local control pulse generator in a write mode when X, Z-address are changed in FIG. 27.
Figure 33:
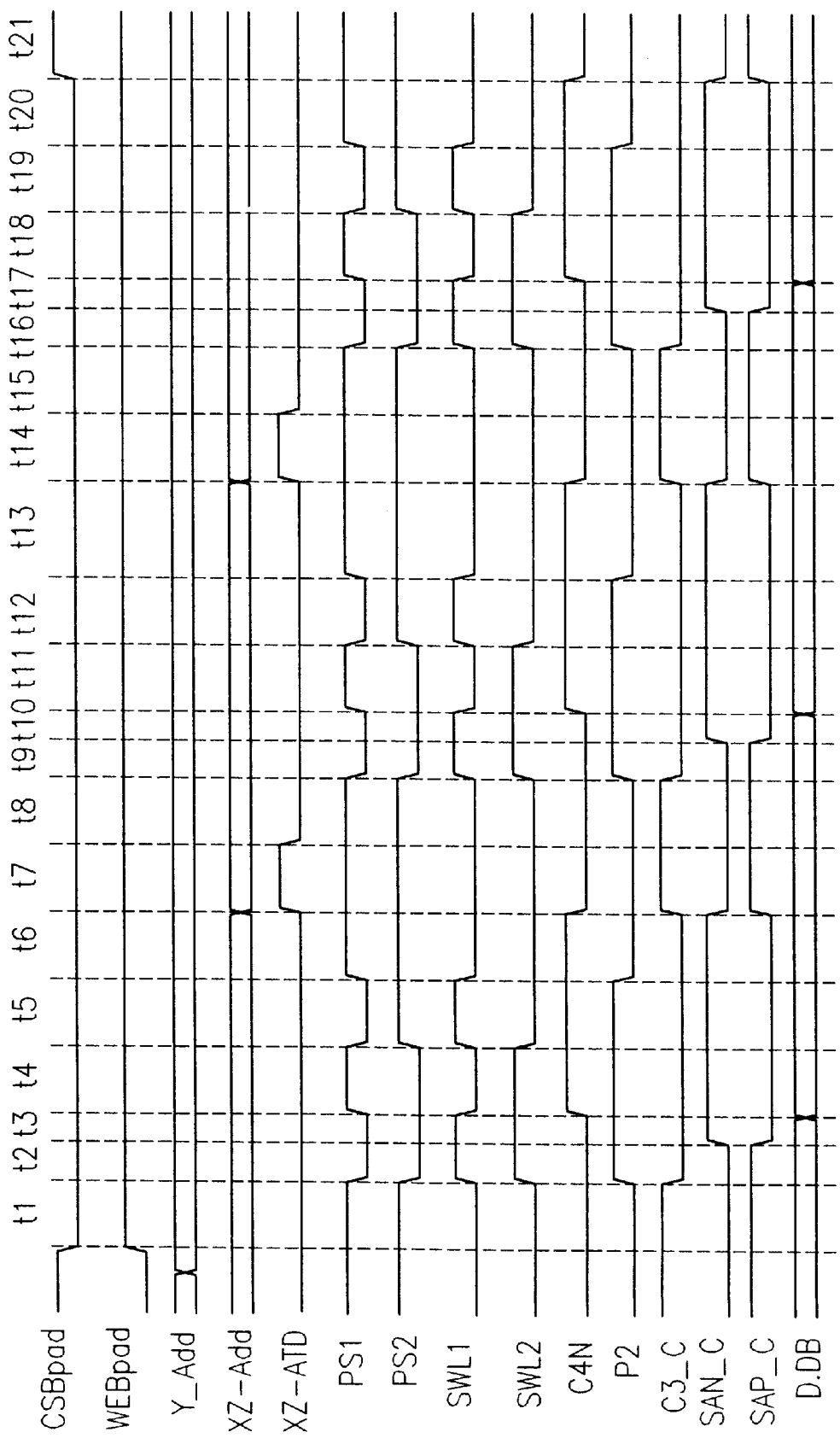
FIG. 33 illustrates a timing diagram of the local control pulse generator in a read mode when X, Z-address is changed in FIG. 27.

In the meantime, systems of the local control pulse generator, the column controller and the sense amplifier and input/output controller when the memory cell array has a system as shown in FIG. 9 will be explained. FIG. 27 illustrates a system of the local control pulse generator when the memory cell has a system as shown in FIG. 9, FIG. 28 illustrates a system of a first embodiment sense amplifier and input/output controller in accordance with the present invention shown in FIG. 9, FIG. 29 illustrates a system of a second embodiment sense amplifier and input/output controller in accordance with the present invention shown in FIG. 9, FIG. 30 illustrates a timing diagram in a write mode when a Y-address is changed in FIG. 27, FIG. 31 illustrates a timing diagram in a read mode when a Y-address is changed in FIG. 27, FIG. 32 illustrates a timing diagram in a write mode when X, Z-addresses are changed in FIG. 27, and FIG. 33 illustrates a timing diagram in a read mode when X, Z-addresses are changed in FIG. 27.

Referring to FIG. 27, the local control pulse generator in the case when the memory cell has a system as shown in FIG. 9 receives a signal from the global control pulse generator 16 and the Y-ATD signal and a signal from the Z-pre-decoder 74 and provides control signals to the split wordline driver 22, the sense amplifier and input/output controller 25 and the column controller 24. Namely, signals of S1, S2, P2, C3, C4, SAN, SAP are provided from the global control pulse generator 16, and the Y-ATD signal is, as explained before, an address transition detection signal generated when a Y-address is transited. And, the WEBpad signal, a write enable pad signal, defines a low state as an enabled state in a write mode. The local control pulse generator of the present invention shown in FIG. 27 includes a first logical circuit 100 for generating a signal to be provided to the sense amplifier and input/output controller 25, a second logical circuit 101 for generating a signal to be provided to the column controller 24 and a third logical circuit 102 for generating a signal to be provided to the split wordline driver 22. The first logical circuit 100 includes a first logical operator 100a for providing BS_T, BSB_T, BS_B and BSB_B signals, a second logical operator 100b for providing SAP_C and SAN_C signals and a third logical operator 100c for providing C3_C signal. And, the third logical circuit 102 includes a fourth logical operator 102a for providing a PS2 signal and a fifth logical operator 102b for providing a PS1 signal.

The system of the aforementioned local control pulse generator will be explained in more detail.

The first logical operator 100a, for subjecting Z-Add1, Z-Add2, Z-Add3 and Z-Add4 to logical operation, includes a first NAND gate NAND1 for subjecting the Z-Add1 and the Z-Add2 signals to logical operation, a second NAND gate NAND2 for subjecting the Z-Add3 and the Z-Add4 signals to logical operation, a third NAND gate NAND3 for subjecting signals from the first, and second NAND gates NAND1 and NAND2 to logical operation, a first inverter INV1 for inverting a signal from the first NAND gate NAND1, a second inverter INV2 for inverting a signal from the first inverter INV1, a third inverter INV3 for inverting a signal from the second NAND gate NAND2, and a fourth inverter INV4 for inverting a signal from the third inverter INV3. In this instance, the signal from the first inverter INV1 is a signal BS_T provided to the sense amplifier and input/output controller 25, and the signal from the second inverter INV2 is also a signal BSB_T provided to the sense amplifier and input/output controller 25. The BS_T signal and the BSB_T signal provided to the sense amplifier and input/output controller 25 are control signals for controlling a transmission gate which selectively connects an input/output terminal on a sense amplifier in the sense amplifier and input/output controller 25 to a bitline and a bitbarline on a top main cell block. The signals from the third inverter INV3 and the fourth inverter INV4 are provided to the sense amplifier and input/output controller 25 as a BS_B signal and BSB_B signal, respectively. The BS_B and BSB_B signals are control signals for controlling two transmission gates for connecting a bitline and a bitbarline on a bottom main block to the input/output terminal on the sense amplifier. The second logical operator 100b, for subjecting the signal from the third NAND gate NAND3 and the SAP and SAN signals from the global control signal generator 76 to logical operation to provide the signal to the sense amplifier and input/output controller 85, includes a fourth NAND gate NAND4 for subjecting the SAP signal and the signal from the third NAND gate NAND3 to logical operation, a fifth inverter INV5 for inverting the signal from the fourth NAND gate NAND4, a fifth NAND gate NAND5 for subjecting the SAN signal and the signal from the third NAND gate NAND3 to logical operation, and a sixth inverter INV6 for inverting a signal from the fifth NAND gate NAND5. The signal from the fifth inverter INV5 is the SAP_C signal and the signal from the sixth inverter INV6 is the SAN_C signal. The third logical operator 100c, for subjecting the signal from the third NAND gate NAND3 and the C3 signal from the global control signal generator 76 to provide the C3_C signal to the sense amplifier and input/output controller 25, includes a seventh inverter INV7 for inverting the C3 signal, a sixth NAND gate NAND6 for subjecting the signal from the third NAND gate NAND3 and the signal from the seventh inverter INV7 to logical operation, an eighth inverter INV8 for inverting the signal from the sixth NAND gate NAND6, and a ninth inverter INV9 for inverting the signal from the eighth inverter INV8. The C3_C signal is a control signal for the sense amplifier and input/output controller 25 to pull-down the bitline and the bitbarline and controlling the equalizer(not shown), used in common for the plurality of bitlines and bitbarlines.

The second logical circuit 101, for subjecting the C4 signal from the global control pulse generator 16, WEBpad signal and the signal from the third NAND gate NAND3 to logical operation to provide a signal C4N to the column controller 24, includes a tenth inverter INV10 for inverting the WEBpad signal, an eleventh inverter INV11 for inverting the signal from the tenth inverter INV10, a twelfth inverter INV12 for inverting the C4 signal, a seventh NAND gate NAND7 for subjecting the signal from the eleventh inverter INV11 and the signal from the twelfth inverter 12 to logical operation, a thirteenth inverter INV13 for inverting a signal from the seventh NAND gate NAND7, a fourteenth inverter INV14 for inverting a signal from the third NAND gate NAND3, a first NOR gate NOR1 for subjecting a signal from the fourteenth inverter INV14 and a signal from the thirteenth inverter INV13 to logical operation, a fifteenth inverter INV15 for inverting a signal from the first NOR gate NOR1, and a sixteenth inverter INV16 for inverting a signal from the fifteenth inverter INV15. The C4N signal from the second logical circuit 101 is a signal to be superposed with a plurality of pre-decoded Y-address signals from the Y-predecoder 78.

The third logical circuit part 102 includes a fourth logical operator 102a and a fifth logical operator 102b. The fourth logical operator 102a, for generating the PS2 signal provided to the SWL driver 22, includes a seventeenth inverter INV17 for inverting the P2 signal from the global control pulse generator 16, an eighth NAND gate NAND8 for subjecting the Y-ATD signal, the C4 signal and the signal from the tenth inverter INV 10 to logical operation, an eighteenth inverter INV18 for inverting a signal from the eighth NAND gate NAND8, a delay D for delaying a signal from the eighteenth inverter INV18 for a time period, a second NOR gate NOR2 for subjecting a signal from the fourteenth inverter INV14, the S2 signal and a signal from the delay D to logical operation, a third NOR gate NOR3 for subjecting a signal from the second NOR gate NOR2 and a signal from the fourteenth inverter INV14 to logical operation, and a nineteenth inverter INV19 for inverting a signal from the third NOR gate NOR3. The delay D has an even number of inverters. The fifth logical operator 102b, for generating the PSI signal provided to the SWL driver 22, includes a fourth NOR gate NOR4 for subjecting the S1 signal from the global control pulse generator 16 and a signal from the eighteenth inverter INV18 to logical operation, a fifth NOR gate NOR5 for subjecting a signal from the fourteenth inverter INV14 and a signal from the fourth NOR gate NOR4 to logical operation, and a twentieth inverter INV20 for inverting a signal from the fifth NOR gate NOR5. In the aforementioned local control pulse generator 20, the signals of S1, S2, P2, C4, C3, SAN and SAP provided thereto are provided from the global control pulse generator 16. The Z-Add1, Z-Add2, Z-Add3 and Z-Add4 signals are provided form the Z-predecoder 14. The BS_T signal and the BSB_T signal provided to the sense amplifier and input/output controller 25 are signals for accessing to bitlines and bitbarlines on the top main cell block, respectively. And, the BS_B signal and the BSB_B signal are signals for accessing to bitlines and bitbarlines on the bottom main cell block, respectively.

The operation of the aforementioned local control signal generator will be explained, taking a read mode and a write mode, as examples.

First, in the write mode, since the WEBpad signal passed through the tenth inverter INV10 and the eleventh inverter INV11 and provided to the seventh NAND gate NAND7 is at low, to disable the seventh NAND gate NAND7, the seventh NAND gate NAND7 provides a signal at high. This signal in a high state enables the first NOR gate NOR1, to permit the C3 signal to pass the fifteenth inverter INV15 and the sixteenth inverter INV16 in succession to become the C4N. The C3 signal causes the C4N signal to be in a low state in intervals the bitline and bitbarline are precharged before the SWL1 and SWL2 are enabled. That is, since all the column selection signals are disabled during the C4N signal is in the low state, signal flow between the output data bus and the bitlines are cut off, which permits to avoid collision of the data on the bitline with the data on the output data bus in precharge of the bitline in the write mode. And, in the write mode, as the signal from the tenth inverter INV10 is at high, the eighth NAND gate NAND8 is enabled. Therefore, the eighth NAND gate NAND8 is under the control of the Y-ATD signal, P2 and C4 signals. That is, while the S1 and S2 are enabled to be active in regular conditions with the P2 in a high state, the eighth NAND gate NAND8 are disabled, to assure regular operations of the S1 and S2 signals. Upon completion of the regular operations of the S1 and S2 signals, since the P2 signal is transited to low, transiting the signal from the seventeenth inverter INV17 to high to enable the eighth NAND gate NAND8 an the end, the operation of the eighth NAND gate NAND8 is dependent on states of the Y-ATD or C4. If the C4 signal is also transited to high while the signal from the tenth inverter INV10 is at high, the eighth NAND gate NAND8 is enabled at the end, to provide the Y-ATD signal to the SWL driver 82. In other words, as the S1 and S2 signals enable the second NOR gate NOR2 and the fourth NOR gate NOR4 in an interval the Y-address is transited, the Y-ATD signal is provided to the fourth NOR gate NOR4 through the eighth NAND gate NAND8 and the eighteenth inverter INV18 and the signal delayed by the delay D is provided to the second NOR gate NOR2. The Y-ATD signal passes through the fourth NOR gate NOR4, the fifth NOR gate NOR5 and the twentieth inverter INV20 to become an inverted low state PS1 signal. The delayed Y-ATD signal passed through the second NOR gate NOR2, the third NOR gate NOR3 and the nineteenth inverter INV19 becomes an inverted low state PS2 signal. Accordingly, each of the PS1 and PS2 signals has a phase inverted from the Y-ATD signal. Sizes of the inverters in the delay D may be adjusted for adjusting a duration of overlap of the PS1 and PS2 signals at low.

In the read mode, the seventh NAND gate NAND7 is enabled so that the C4 signal passes through the twelfth inverter INV12, the seventh NAND gate NAND7, the thirteenth inverter INV13, the first NOR gate NOR1, the fifteenth inverter INV15 and the sixteenth inverter INV16 in succession to become the C4N of a same waveform. Therefore, the C4N signal serves to provide a signal amplified by the sense amplifier to the data bus. And, in such a read mode, since the signal from the tenth inverter INV10 at a low state disables the eighth NAND gate NAND8, cutting off transmission of the Y-ATD signal, P2 and C4 signals and causing the signal from the eighteenth inverter INV18 to be at low, the fourth NOR gate NOR4 is always enabled. Therefore, the PS1 signal and the PS2 signal have waveforms opposite to the S1 and S2 signals, respectively.

The column controller has a system as shown in FIG. 18 even if the local control pulse generator has a system as shown in FIG. 27.

A system of a first embodiment sense amplifier and input/output controller in the case when the local control pulse generator has a system as shown in FIG. 27 will be explained.

Referring to FIG. 28, the first embodiment sense amplifier and input/output controller in the case when the local control pulse generator has a system as shown in FIG. 27 includes a bitline and bitbarline BIT_T and BITB_T respectively connected to the top main cell block and a bitline and a bitbarline BIT_B and BITB_B respectively connected to the bottom main cell block. Though not shown, there are a plurality of bitlines and bitbarlines formed in a column direction. The first embodiment sense amplifier and input/output controller further includes a sense amplifier 85a for sensing and amplifying data on the bitline and the bitbarline and providing to a dataline and a databarline, a pull-down and equalizer 85b for pulling down and equalizing voltages of the bitline and bitbarline, first and second transmission gates 131a and 131b for selective connection of the bitline and the bitbarline on the top main cell to the input/output terminals on the sense amplifier, third and fourth transmission gates 131c and 131d for selective connection of the bitline and the bitbarline on the bottom main cell to the input/output terminals on the sense amplifier, and fifth and sixth transmission gates 131e and 131f for selective connection of the dataline and the databarline to the input/output terminals on the sense amplifier. The sense amplifier 85a may further includes a PMOS transistor PM10 and an NMOS transistor NM10 for enable and disable control. The SAP_C signal and the SAN_C signal for controlling the PMOS transistor PM10 and the NMOS transistor NM10 are provided from the local control pulse generator 20 and used for the plurality of bitlines and bitbarlines in common. In the aforementioned sense amplifier and input/output controller 25, when the sense amplifier 85a should sense a data of the top main cell, the first and second transmission gates 131a and 131b are turned on and the third and fourth transmission gates 131c and 131d are turned off. Opposite to this, when the sense amplifier 85a should sense a data of the bottom main cell, the first and second transmission gates 131a and 131b are turned off and the third and fourth transmission gates 131c and 131d are turned on. Each of the transmission gates 131a, 131b, 131c and 131d are arranged in parallel to the PMOS transistors PM and the NMOS transistors, and the BS_T signal and BSB_T signal for controlling turning on/off of the first and second transmission gates 131a and 131b respectively are provided from the local control signal generator 20. And, the BS_B signal and BSB_B signal for controlling turning on/off of the third and fourth transmission gates 131c and 131d respectively are also provided from the local control signal generator 20. The Y-address signal and the Y-address bar signal selectively provided from the column controller 24 are used as the Y-n signal and YB_n signal, both of which are control signals for controlling turning on/off of the fifth and sixth transmission gates 131e and 131f, respectively.

In the meantime, FIG. 29 illustrates a system of a second embodiment sense amplifier and input/output controller in the case when the local control pulse generator has a system as shown in FIG. 27, wherein NMOS transistors 140a, 140b, 140c, 140d, 140e and 140f are provided in places of the transmission gates 131a, 131b, 131c, 131d, 131e and 131f shown in FIG. 28. The sense amplifier and input/output controller 25 with the transmission gates shown in FIG. 28 is favorable in view of a low voltage operation in comparison to the sense amplifier and input/output controller 25 with the NMOS transistors shown in FIG. 29. The aforementioned sense amplifier and input/output controller 25 receives signals from the local control pulse generator 20 and the column controller 24, to sense and provide a data in the memory cell to databusline and databarbusline in a read mode and to store a data received through databusline and databarbusline in a write mode.

FIG. 30 illustrates input/output waveforms for explaining operation of the local control pulse generator when the memory cell array has a system as shown in FIG. 9, i.e., a timing diagram in a write mode when a Y-address is transited under a state the CSBpad signal is enabled at a low state. In this instance, a time period in which the CSBpad signal, a chip enable signal, is enabled at low and then disable at high again is divided into t1~t15 intervals and the explanation will be proceeded interval by interval.

In the t1 interval, the CSBpad signal is enabled at low, and the WEBpad signal is enabled at low. In this instance, X-, Y- and Z-addresses are kept the same state as before, and the PS1 and PS2 signals, and the C4N, C3_C, SAP_C, SAN_C signals are also kept the same state as before. The PS1 signal is held at high in t1 interval, at low from a time point t2 begins to t3 interval, at high in t4 interval, at low in t5 interval, at high in t6 interval again, then, at low from t7 to t8 intervals again, at high from t9 to t10 intervals, at low from t11 to t13 intervals again and at high from a time point t13 begins and onward. And, the PS2 signal is held at high up to t1 interval, at low from a time point t2 begins to t4 and at high from t5 to t7 intervals. And, the PS2 signal is held at low from t8 to t9 intervals, at high from t10 to t11 intervals, at low from t12 to t13 and at high from a time point t14 begins and onward. The SWL1 and SWL2 signals from the SWL driver 22 are also kept at low the same state as before and transited to high from t2 time point. In this instance, the SWL1 signal has a phase opposite to the PS1 signal, but has the same transition timing. And, the SWL2 signal has a phase opposite to the PS2 signal, but has the same transition timing, too. The C4N signal from the local control pulse generator 20 is transited to high at a time point t2 begins and to low again at a time point the CSBpad signal is disabled. The P2 signal is transited from a previous low to high at a time point t2 begins, held at high until t5 interval and transited to low again at a time point t6 begins. The C3_C signal is held at high as before until t1, transited to low at a time point t2 begins and held at low until the CSBpad signal is disabled when the C3_C signal is transited to high again. The SAN_C signal is held at low until t2 interval, transited to high at a time point t3 begins and held at high until the CSBpad signal is disabled. The SAP_C and SAN_C signals have phases opposite to each other, but the same transition timing. As shown in the foregoing operaton timing diagram and the input/output timing diagram of the local control pulse generator in FIG. 13, if only the Y-address is changed while the CSBpad signal is enabled at a low state, there will be no change in the signal provided to the global control pulse generator 16, also with no change in a signal provided from the global control pulse generator 16, eventually. In a write mode, if the Y-ATD signal is generated by change of the Y-address, the PS1 and PS2 are provided from the local control pulse generator 22 to generate the SWL1 and SWL2 signal in the SWL driver 22. As shown in the timing diagram shown in FIG. 30, when the Y-address starts to be changed for the first time from a time point t7 begins, i.e., in t7 and t9 intervals, a logic "1" (high) is written on the memory cell and, in t8 interval, a logic "0" (low) is written on the memory cell. And, when the Y-address starts to be changed for the second time from a time point t11 begins, i.e., in t11 and t13 intervals, a high data is written on the memory cell and, in t12 interval, a low data is written on the memory cell.

The operation timing diagram in a read mode of the local control signal generator of the present invention will be explained. Alike in the write mode, explanation will be proceeded interval by interval, dividing a time duration from t1 to t15 intervals. FIG. 31 illustrates a timing diagram of the local control pulse generator in a read mode when only a Y-address is changed in a memory cell array system shown in FIG. 9.

Referring to FIG. 31, different from the write mode, the WEBpad signal is held at high while the CSBpad signal is kept enabled, because the present mode is read mode. In the meantime, alike the write mode, the Y-ATD signal is transited to high only when the Y-address is changed. That is, when the Y-address is transited at a time point t7 begins, the Y-ATD signal is held at high from t7 to t8, and, when the Y-address is transited at a time point t11 begins, the Y-ATD signal is held at high from t11 to t13 and the Y-ATD signal is held at low in all of the intervals other than these. The PS1 signal is held at low from t2 to t3 and in t5 intervals only and held at high in intervals other than these. The PS2 signal is held at low from t2 to t4 intervals and held at high in rest of the intervals. The SWL1 signal has a transition timing identical to the PS1 signal, but has an opposite phase. The C4N signal is held at high from t4 to a time point t15 begins at which the CSBpad signal is disabled and held at low in rest of the intervals. As the P2 signal, C3_C signal, SAN_C signal and SAP_C signal have transition timings and phases the same with the write mode, explanations of those will be omitted. As shown in the foregoing timing diagram, since there is no change in an input to the global control signal generator when only the Y-address is changed while the CSBpad signal is enabled, there is also no change in an output from the global control signal generator. The PS1 signal and the PS2 signal from the local control pulse generator 20 are designed not to be changed in a read mode even if the Y-ATD signal is transited to high by change of the Y-address so that the SWL1 and SWL2 signals are kept disabled. Therefore, the column controller 24 corresponding to the changed Y-address is enabled, to provide the data latched at the sense amplifier to the data bus. First, in t7 interval a time point the Y-address is changed, the data in the sense amplifier is provided to the data bus, to carry out a read. And, second, also in t11 interval a time point the Y-address is changed, the data in the sense amplifier is provided to the data bus, to carry out a read.

What are explained up to now are timing diagrams of a nonvolatile ferroelectric memory in a write mode and in a read mode when only Y-address is changed, and timing diagrams of a nonvolatile ferroelectric memory in a write mode and in a read mode when only X-, and Z-address are changed will be explained. FIG. 32 illustrates an operation timing diagram of the local control pulse generator in a write mode when only X, and Z-addresses are changed. Referring to FIG. 32, the operation of the local control pulse generator of the present invention will be explained interval by interval, dividing a time duration from t1 to t21.

First, the CSBpad signal is enabled transited from a previous high to low at a time point the t1 begins and disabled again transited at a time point t21 begins. And, on the same time, the WEBpad signal, a write enable signal, is also transited and kept enabled until the CSBpad signal is disabled when the WEBpad signal is disabled on the same time. Both the CSBpad signal and the WEBpad signal are external signals. As shown, in t1 interval, only the CSBpad signal and the WEBpad signal are enabled, while rest of the signals have states kept the same as before. In t2 interval, the CSBpad signal and the WEBpad signal are kept enabled as before, and the PS1 signal, PS2 signal and the C3_C signal are transited from previous high states to low states. And, SWL1, SWL2, C4N and P2 signals are transited from previous low states to high states. As the C4N signal is enabled, transited from low to high, a data provided externally is loaded on the bitline BL and bitbarline BBL. In t3 interval, all the signals of CSBpad, WEDpad, PS1, PS2, SWL1, SWL2, C3_C, C4N and P2 are kept states the same as the states in t2, the SAN_C signal is transited from a previous low state to a high state and the SAP_C signal is transited from a high state to a low state. In this instance, the SAN_C signal and SAP_C signal are respectively transited to high and low. In t4 interval, only the PS1 signal and SWL1 signal are changed from previous states; the PS1 signal is transited from a previous low state to a high state and the SWL1 signal is transited from a previous high state to a low state. In t5 interval, only the signals of PS1, PS2, SWL1 and SWL2 are transited, while the rest of the signals are kept the states in t4 interval. That is, the PS1 signal is transited from a previous high state to a low state, subsequent with an SWL1 signal transition from a low state to a high state. And, the PS2 signal is transited from a previous low state to a high state, subsequent with an SWL2 signal transition from a high state to a low state. When a t6 interval begins, signals except the PS1, SWL1 and P2 signals are kept states the same as before; the PS1 signal is transited from a low state to a high state, subsequent with an SWL1 signal transition from a high state to a low state and a P2 signal transition from a previous high state to a low state. In t7 state, X-, and Z-addresses are begin to change. Accordingly, X-, and Z-ATD signals are transited from previous low states to high states. And, the C4N signal and the SAN_C signal are transited from previous high states to low states, and the C3_C signal and the SAP_C signal are transited from previous low states to high states. When t8 begins, only the X-, and Z-ATD signals are transited from previous high states to low states, while all the signals except the X-, and Z-ATD signals are kept the states in t7 interval as they were. At a time point t9 begins, only the X-, and Z-ATD signals, SAN_C and SAP_C signals are kept the state as they were, rest of all the signals are changed. That is, the PS1 and PS2 signals are transited from previous high states to low states, and the SWL1 and SWL2 signals are transited from previous low states to high states. And, the C4N signal and the P2 signal are transited from previous low states to high states, and the C3N signal is transited from previous high state to a low state. As the C4N signal is enabled, transited from a low state to a high state, a data provided externally is loaded on the bitline BL and the bitbarline BBL. At a time point t10 begins, the SAN_C signal is transited from a low state to a high state, the SAP_C signal is transited from a high state to a low state, and all the rest of signals are kept the states in t9 as they were. When t11 begins, the PS1 signal is transited from the previous low state to a high state and the SWL1 signal is transited from a high state to a low state. Signals other than these are kept states in t10 interval as they were. When t12 begins, the PS1 signal is transited from a previous high state to a low state and the PS2 signal is transited from a previous low state to a high state, leading the SWL1 signal to transit from a low state to a high state and the SWL2 signal to transit from a high state to a low state, with signals other than these kept the states in t11 interval as they were. When t13 begins, only the PS1, SWL1 and P2 are changed, with signals other than these kept the states in t12 interval as they were. That is, the PS1 signal is transited from a previous low state to a high state and the SWL1 signal is transited from a high state to a low state. And, the P2 signal is transited from a previous high state to a low state. Then, at a time point t14 begins, the X-, and Z-addresses are changed for the second time. Accordingly, the X-, and Z-ATD signals are transited from previous.low states to high states, the C4N signal and the SAN_C signal are transited from previous high states to low states, and C3_C signal and the SAP_C signal is transited form previous low state to high states. At a time point t15 begins, only the X-, and Z-ATD signals are transited from previous high states to low states, and rest of the signals are kept previous states in t14 interval as they were. When t16 begins, the PS1 and PS2 signals are transited from previous high states to low states, leading the SWL1 and SWL2 signals to be transited from previous low states to high states. Because phases and transition timings from t17 interval to t20 interval are identical to the same from t10 to t13, explanations on those will be omitted. Finally, at a time point t21 begins, the CSBpad signal and the WEBpad signal kept held at low states from t1 are transited to high states, disenabling the write mode. And, the C4N signal is transited from a previous high state to a low state, the SAN_C signal is transited from a high state to a low state and the SAP_C signal is transited from a low state to a high state. Thus, when X-, and Z-addresses are changed in a write mode, the local control signal generator of the present invention is enabled at the same instant of time as the SWL1 and SWL2 are enabled, providing a data to the bitline in advance before the sense amplifier is enabled.

The operation timing of the local control signal generator of the present invention when the X-, and Z-addresses are changed in a read mode will be explained. FIG. 33 is a timing diagram of the local control pulse generator in a read mode when only the X, Z-address is changed, wherein it can be known that a transition timing of the C4N signal in the timing diagram in the read mode shown in FIG. 33 are different from the same shown in FIG. 32. It can also be known that, as the timing diagram shown in FIG. 32 is on a write mode, the WEBpad signal is enabled at low and, as the timing diagram shown in FIG. 33 is on a read mode, the WEBpad signal is enabled at high. Since all the signals except the C4N signal in FIG. 33 have operation timings the same as the operation timings in a write mode when X-, and Z-addresses are changed, the C4N signal only will be explained interval by interval.

Referring to FIG. 33, the C4N signal is held in the low state from t1 to t3 intervals. When t4 begins, the C4N signal is enabled from a low state to a high state, to load data amplified in the sense amplifier on the dataline and the databarline. The C4N signal transited to a high state at an instant of time t4 begins is kept held at a high state until t6 and transited to a low state at an instant of time t7 begins. After transited to a low state, the C4N signal is kept held at low until t10 interval and transited to a high state at a time point t11 begins. As the C4N signal is transited from a low state to a high state, data amplified by the sense amplifier are loaded on the bitline and the bitbarline. Thus, in the read mode, after the sense amplifier is made to sense data in advance, the C4N signal is enabled to provide the sense data to the dataline and the databarline, to carry out the read operation.

Figure 34:
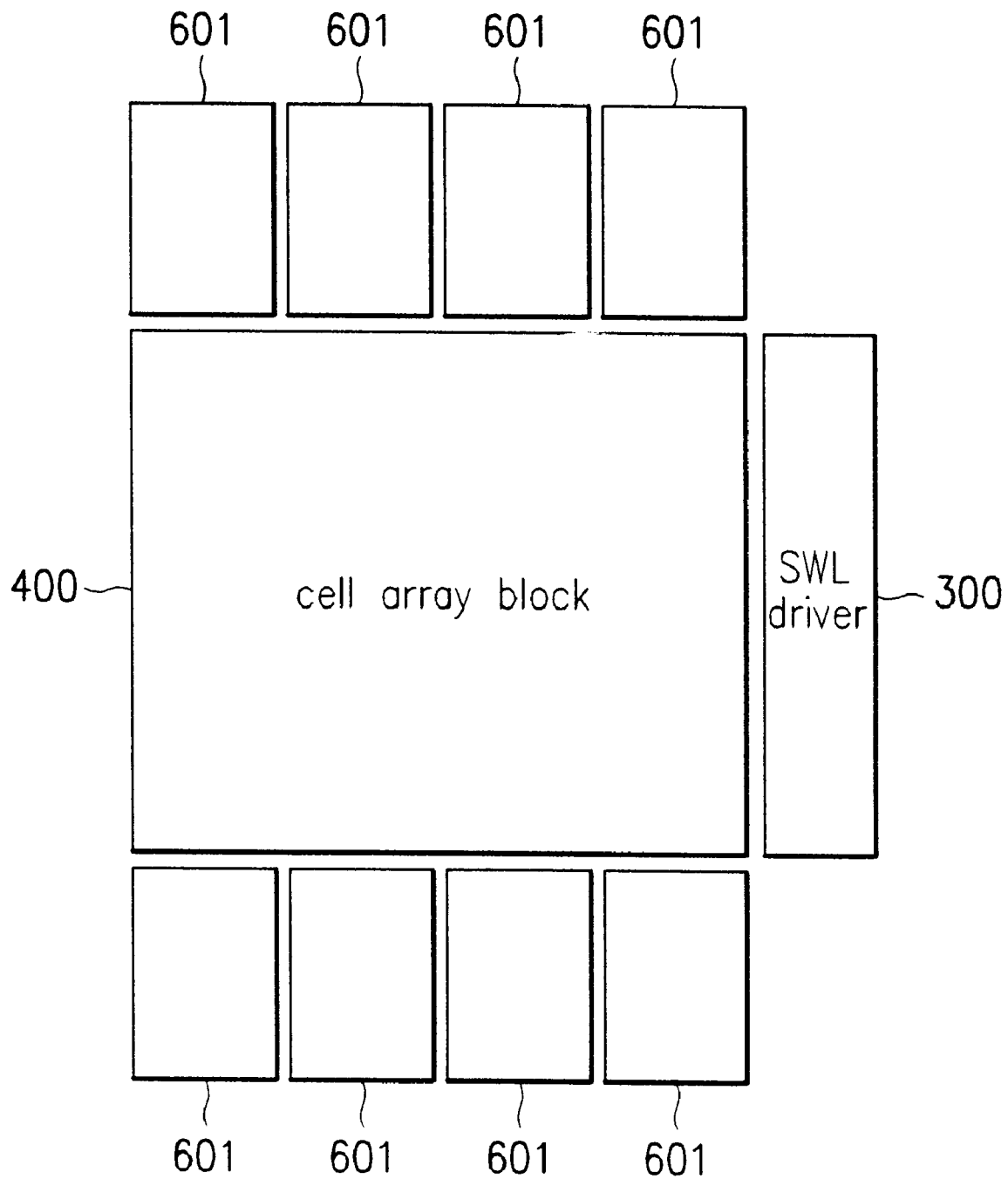
FIG. 34 illustrates a system block diagram of an input/output array of an SWL ferroelectric memory in accordance with a preferred embodiment of the present invention.
Figure 35:
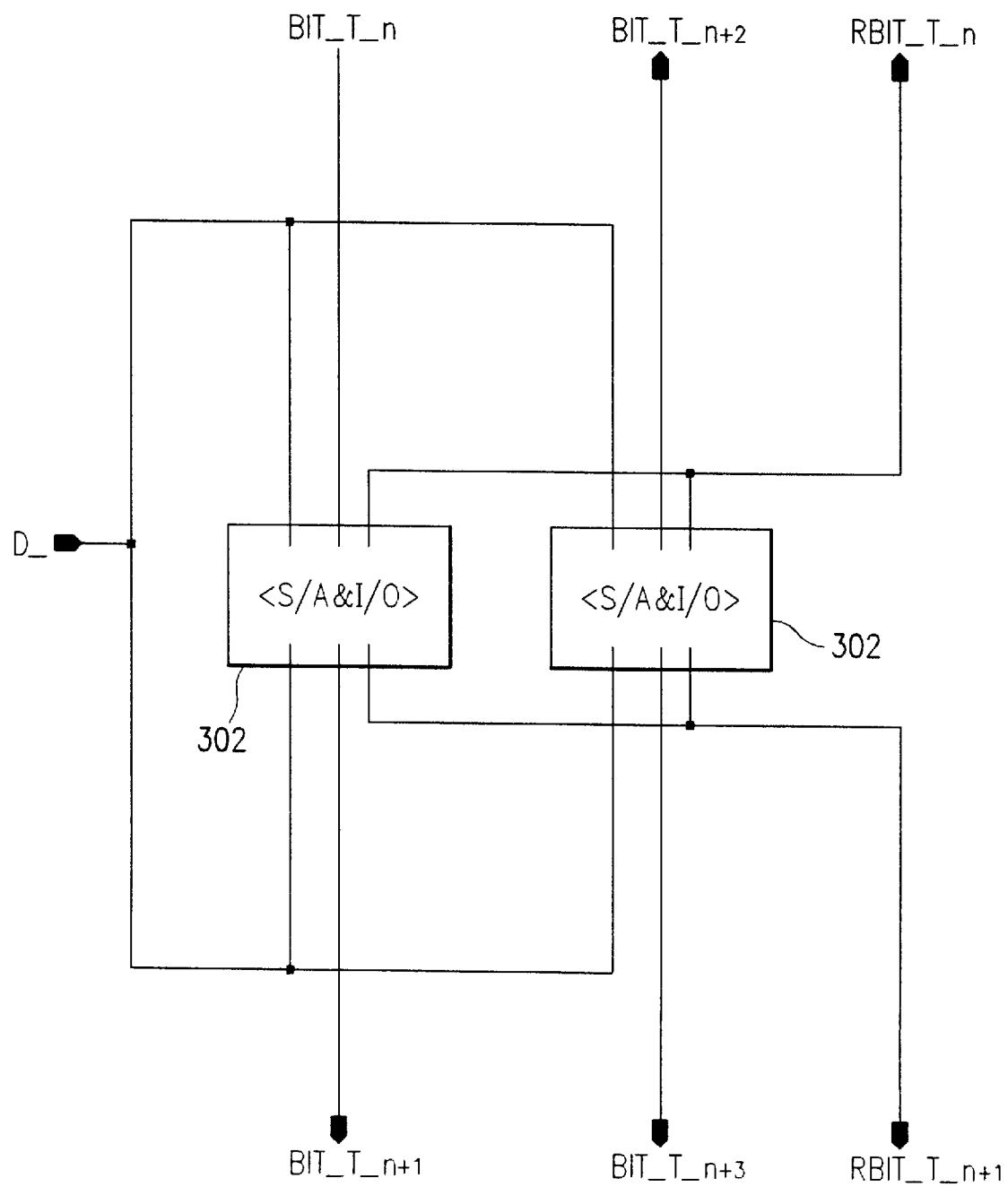
FIG. 35 illustrates a system block diagram of a first embodiment sense amplifier in an SWL ferroelectric memory in accordance with the present invention.
Figure 36:
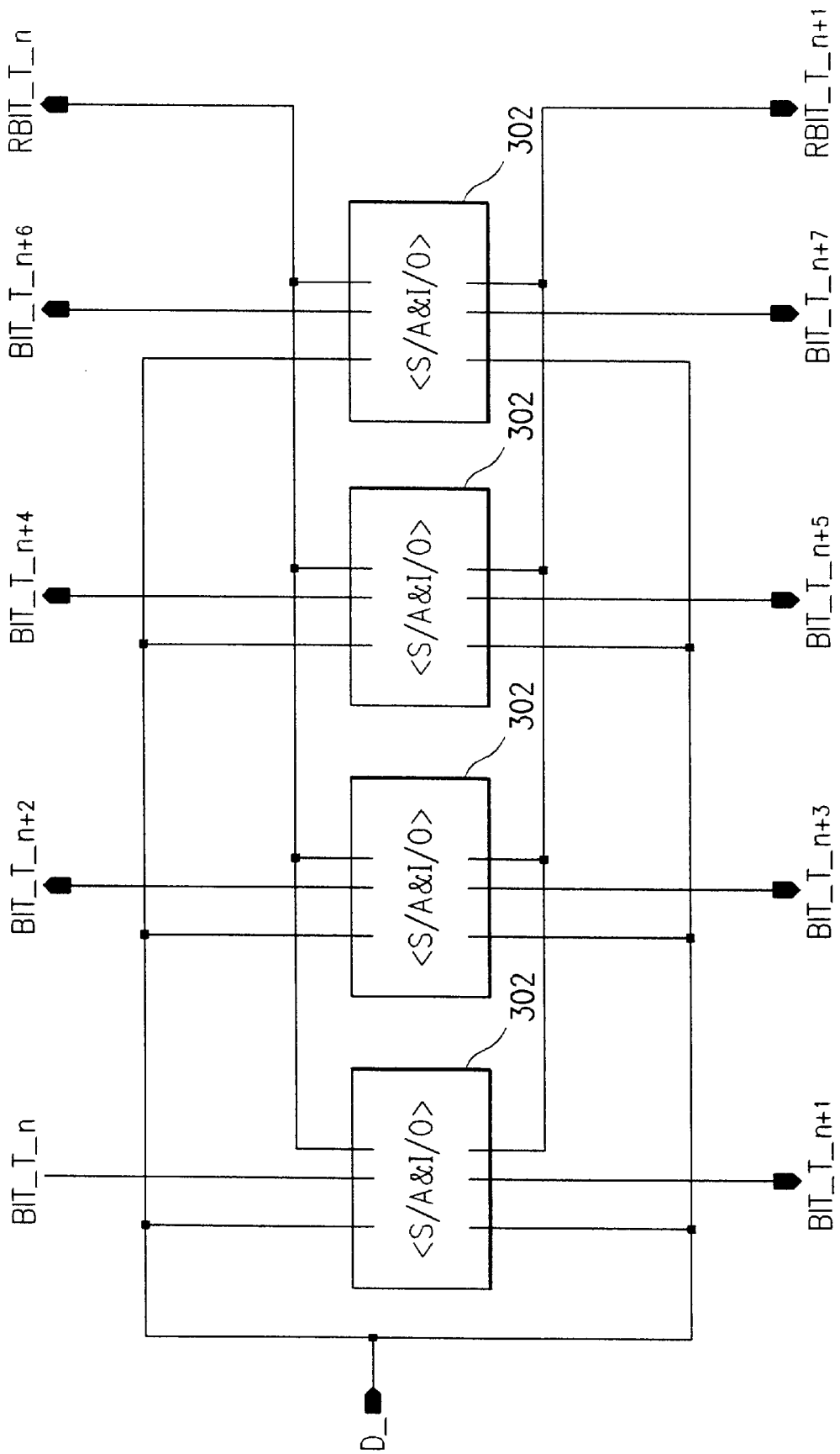
FIG. 36 illustrates a system block diagram of a second embodiment sense amplifier in an SWL ferroelectric memory in accordance with the present invention.
Figure 37:
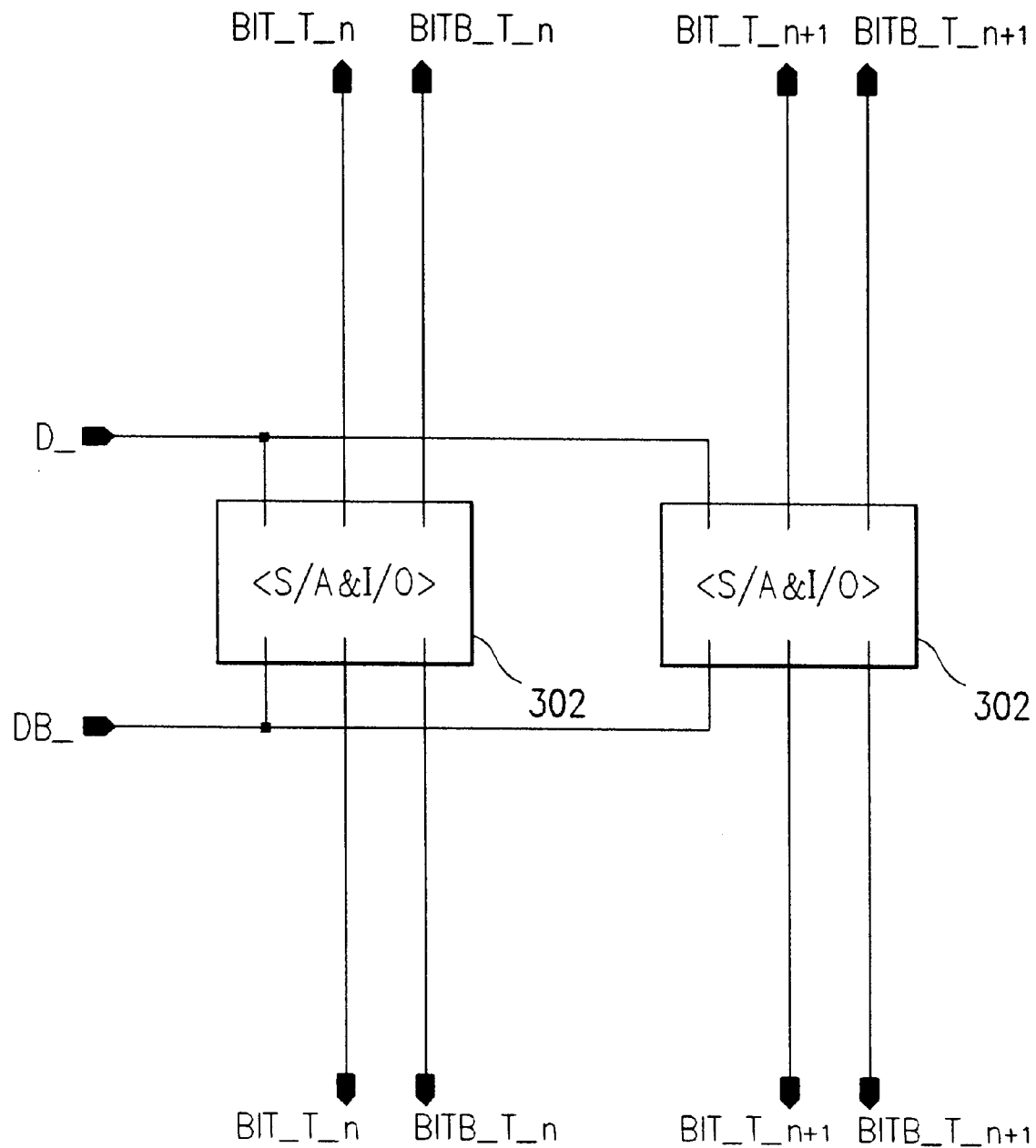
FIG. 37 illustrates a system block diagram of a third embodiment sense amplifier in an SWL ferroelectric memory in accordance with the present invention.
Figure 38:
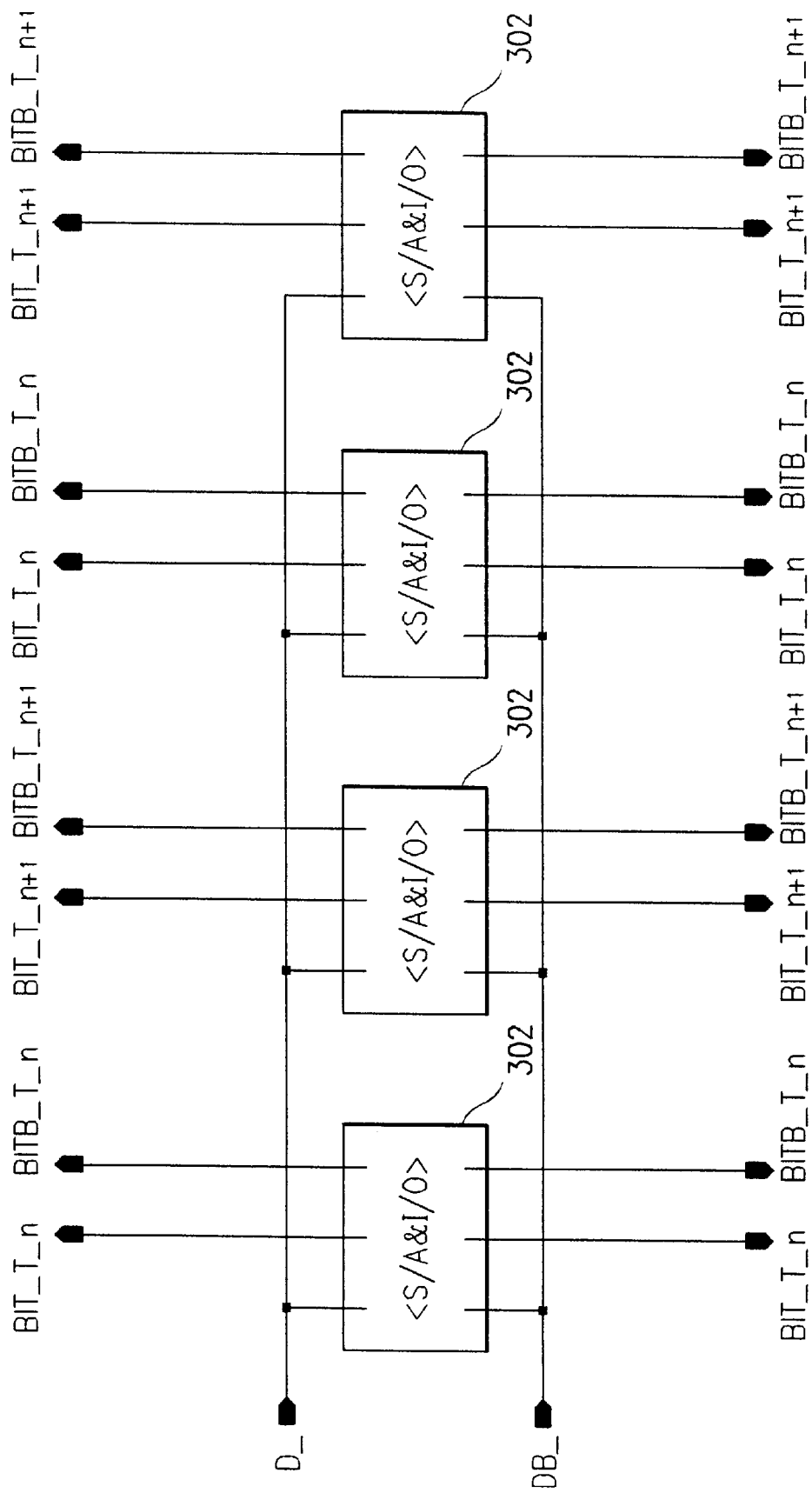
FIG. 38 illustrates a system block diagram of a fourth embodiment sense amplifier in an SWL ferroelectric memory in accordance with the present invention.

The sense amplifier and input/output controller 25 having the foregoing system and operation and the input/output bus controller 26 for interfacing an external data bus, both are shown in FIG. 10, will be explained in detail. FIG. 34 illustrates a cell array block system diagram shown in light with cores of an SWL ferroelectric memory in accordance with a preferred embodiment of the present invention, identical to the cell array shown in FIG. 7, but in detail; while FIGS. 19–22 and 28–29 show one sense amplifier, FIG. 34 shows a plurality of core blocks 601 provided as many as external data buses, with each of the core blocks 601 having a plurality of sense amplifiers. FIG. 35 illustrates a system block diagram of a first embodiment sense amplifier in accordance with the present invention, FIG. 36 illustrates a system block diagram of a second embodiment sense amplifier in accordance with the present invention, FIG. 37 illustrates a system block diagram of a third embodiment sense amplifier in accordance with the present invention, and FIG. 38 illustrates a system block diagram of a fourth embodiment sense amplifier in accordance with the present invention. That is, FIGS. 35 and 36 respectively show a system of sense amplifier when one memory cell sub-block has a main memory cell and a reference memory cell as shown in FIG. 8, and FIGS. 37 and 38 respectively show a system of sense amplifier when one memory cell sub-block has a bitline and a bitbarline. Each of the sense amplifier blocks 301 of the present invention has a system provided to include a sense amplifier corresponding to a system of column of a sub-memory cell block shown in FIGS. 8 or 9. Though each of the sense amplifier has a system as shown in FIGS. 19–22 and 28–29, for simplicity, main cell bitlines BIT_T_n, BIT_T_n+1, BIT_T_n+2, BIT_Tn+3 and bitbarlines BITB_T_n, BITB_T_n+1, BITB_T_n+2, BITB_T_n+3, or reference cell bitlines RBIT_T_n and RBIT_T_n+1 and data terminal D_ or databar terminal DB_ only are shown. The first embodiment sense amplifier block 301 of the present invention includes two sense amplifiers 302, provided for a case when there are four columns of main memory cell blocks as shown in FIG. 8. That is, in FIG. 8, since there are four columns of main memory cell blocks and two columns of reference memory cell, a number of the sense amplifiers required for the four columns of the main memory cell blocks are four. However, since the sense amplifiers are provided both on top and bottom of the main memory cell block, two each on top and bottom, one sense amplifier block 301 has a system as shown in FIG. 35. The second embodiment sense amplifier block 301 of the present invention has a system identical to the first embodiment, but with four sense amplifiers 302 as shown in FIG. 36. This is provided for a case when there are eight columns of main memory cells and two columns of reference memory cells. The third embodiment sense amplifier block of the present invention is provided for a case when the memory cell has bitlines and bitbarlines without any reference memory cell as shown in FIG. 9, and includes two sense amplifiers as shown in FIG. 37. The fourth embodiment sense amplifier block of the present invention has a system identical to the third embodiment, but includes four sense amplifiers as shown in FIG. 38. The first to fourth embodiment sense amplifier blocks respectively have bitlines and bitbarlines connected in top and bottom directions for sensing memory cells in top and bottom directions, and the data terminals D_ in FIGS. 35 and 36 are respectively connected to each of the sense amplifiers 302 in top and bottom directions for sensing the memory cells in top and bottom directions. And, in FIGS. 37 and 38, the data terminal D_ and data bar terminal DB_ are connected to the sense amplifiers 302.

Figure 39:
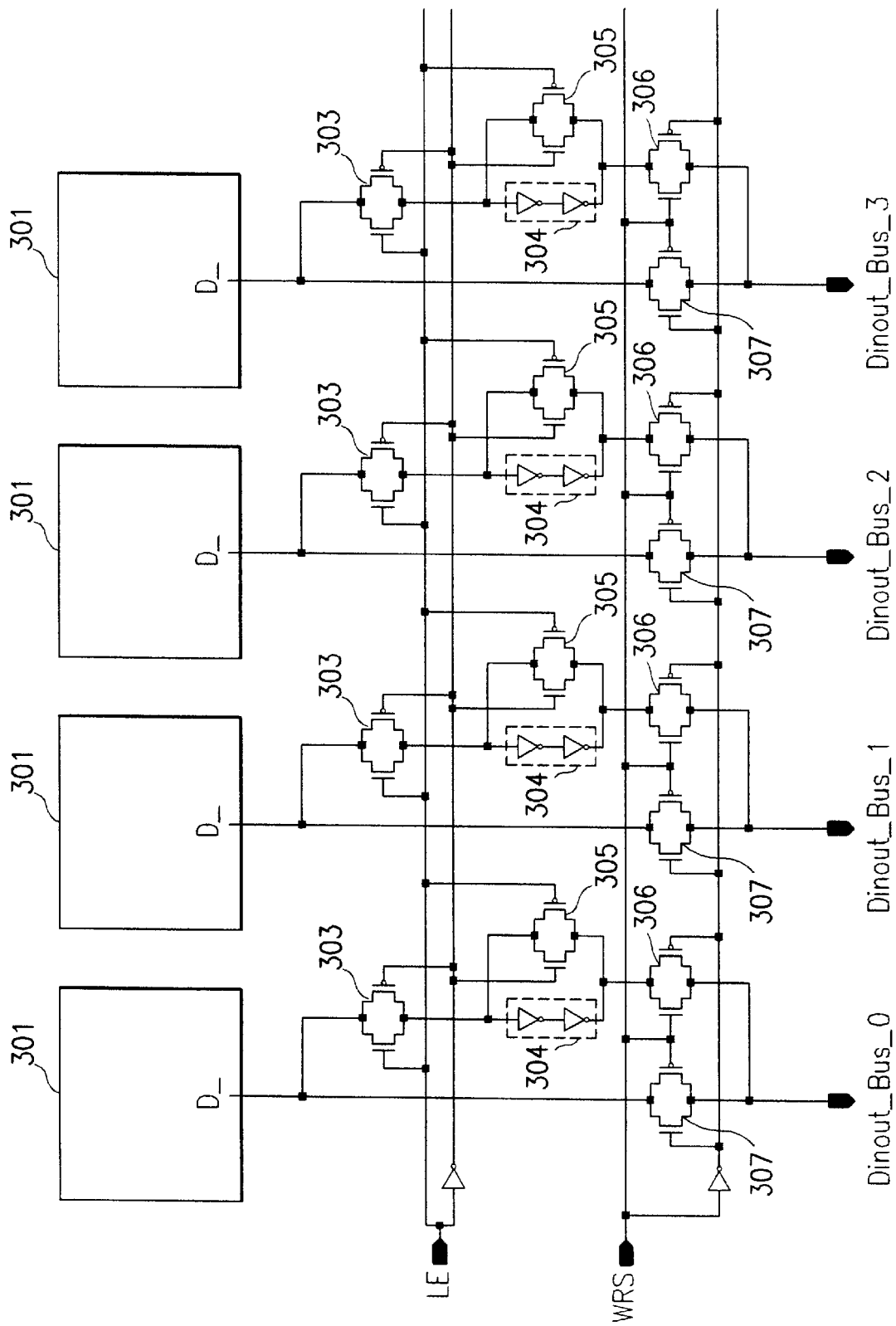
FIG. 39 illustrates a circuitry system of a first embodiment input/output bus controller in an SWL ferroelectric memory in accordance with the present invention.
Figure 40:
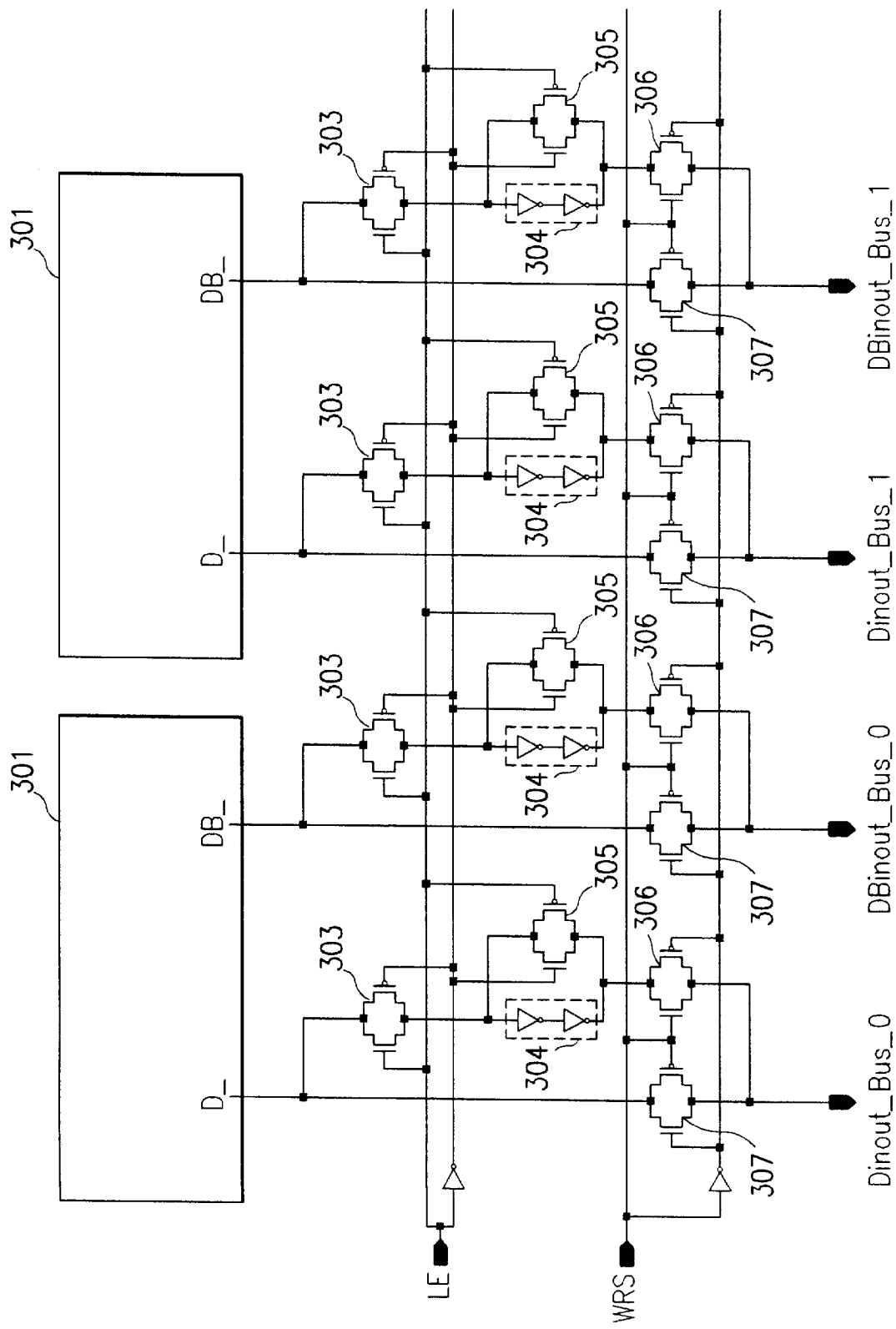
FIG. 40 illustrates a circuitry system of a second embodiment input/output bus controller in an SWL ferroelectric memory in accordance with the present invention.
Figure 41:
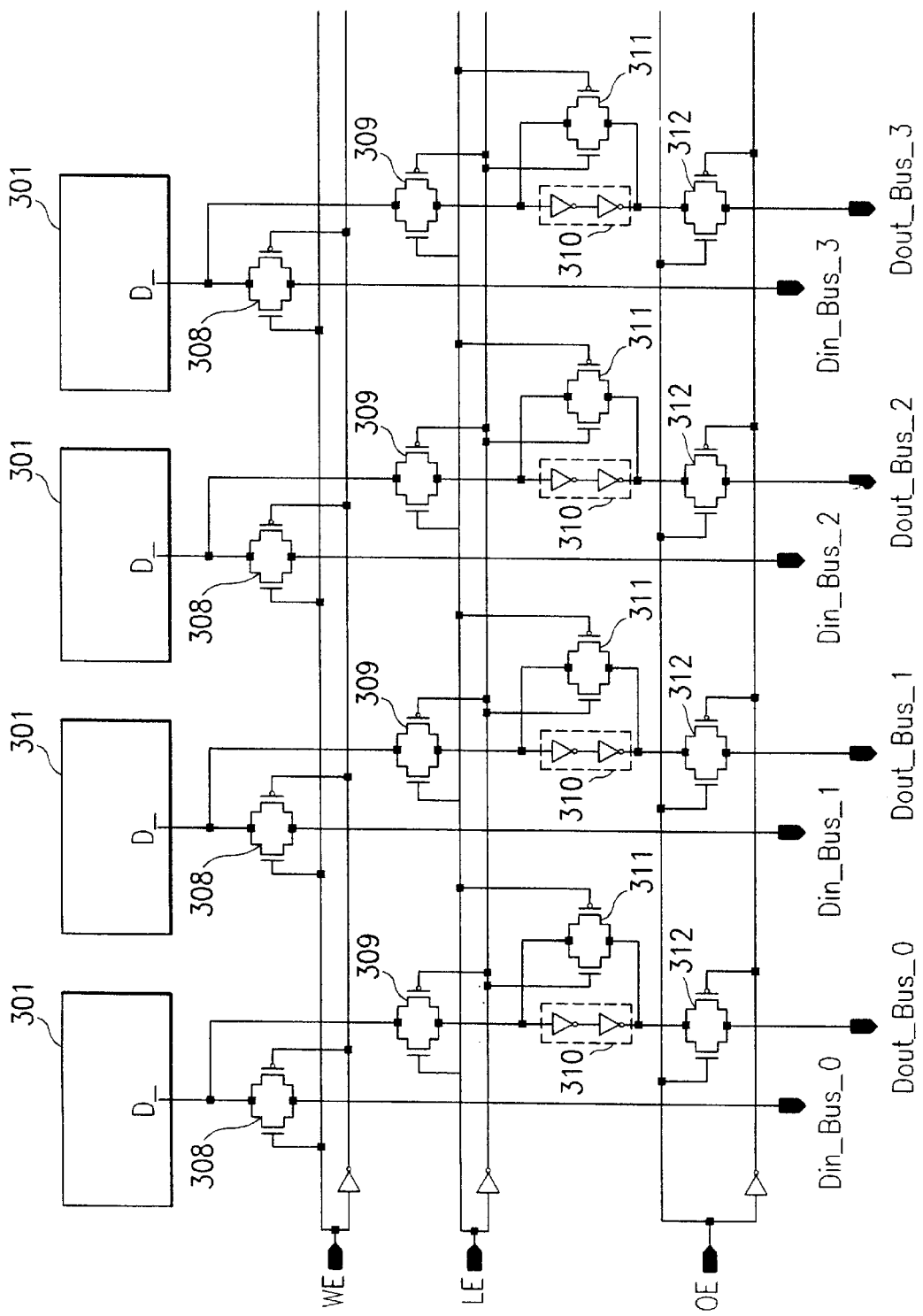
FIG. 41 illustrates a circuitry system of a third embodiment input/output bus controller in an SWL ferroelectric memory in accordance with the present invention.
Figure 42:
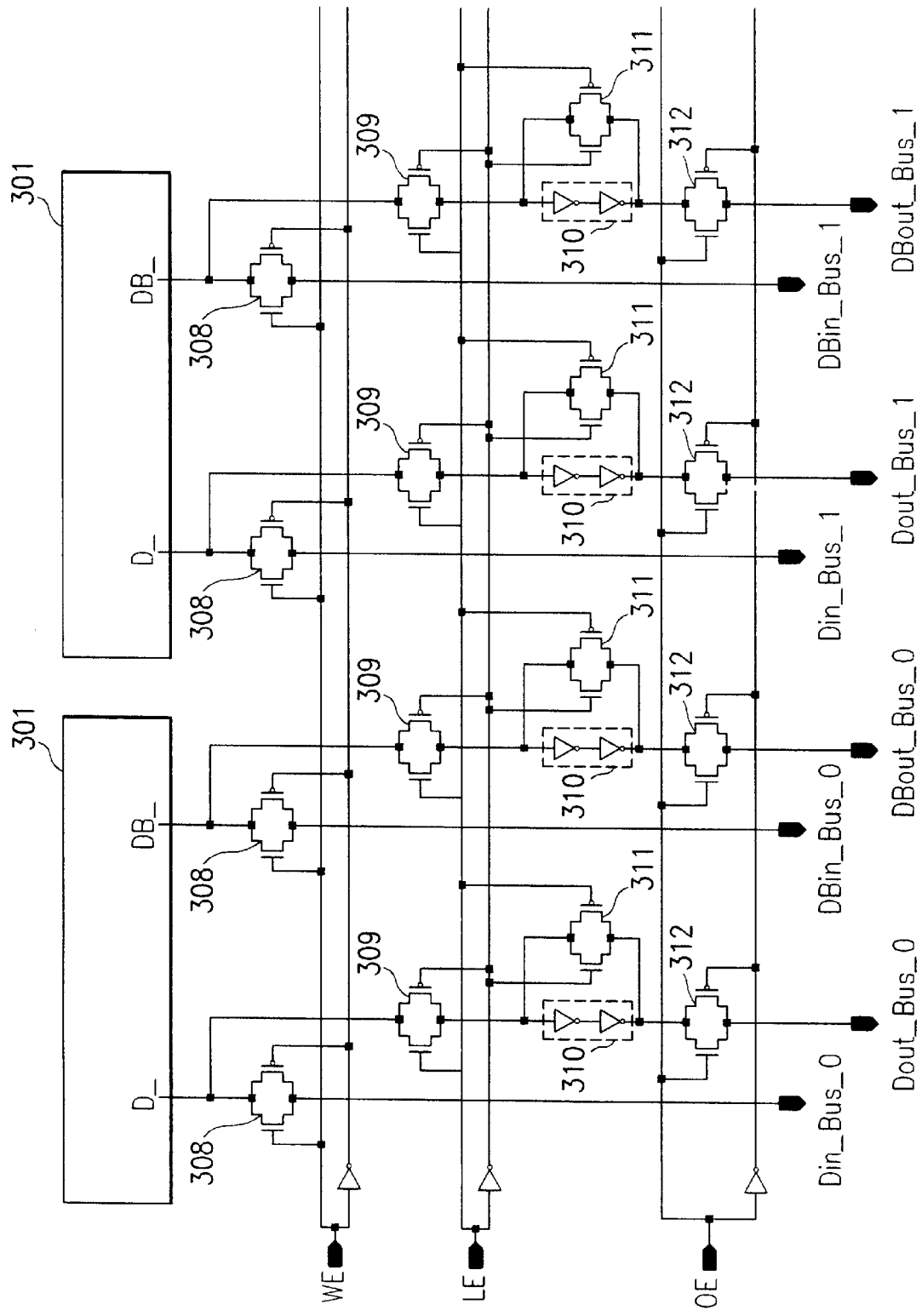
FIG. 42 illustrates a circuitry system of a fourth embodiment input/output bus controller in an SWL ferroelectric memory in accordance with the present invention.
Figure 43:
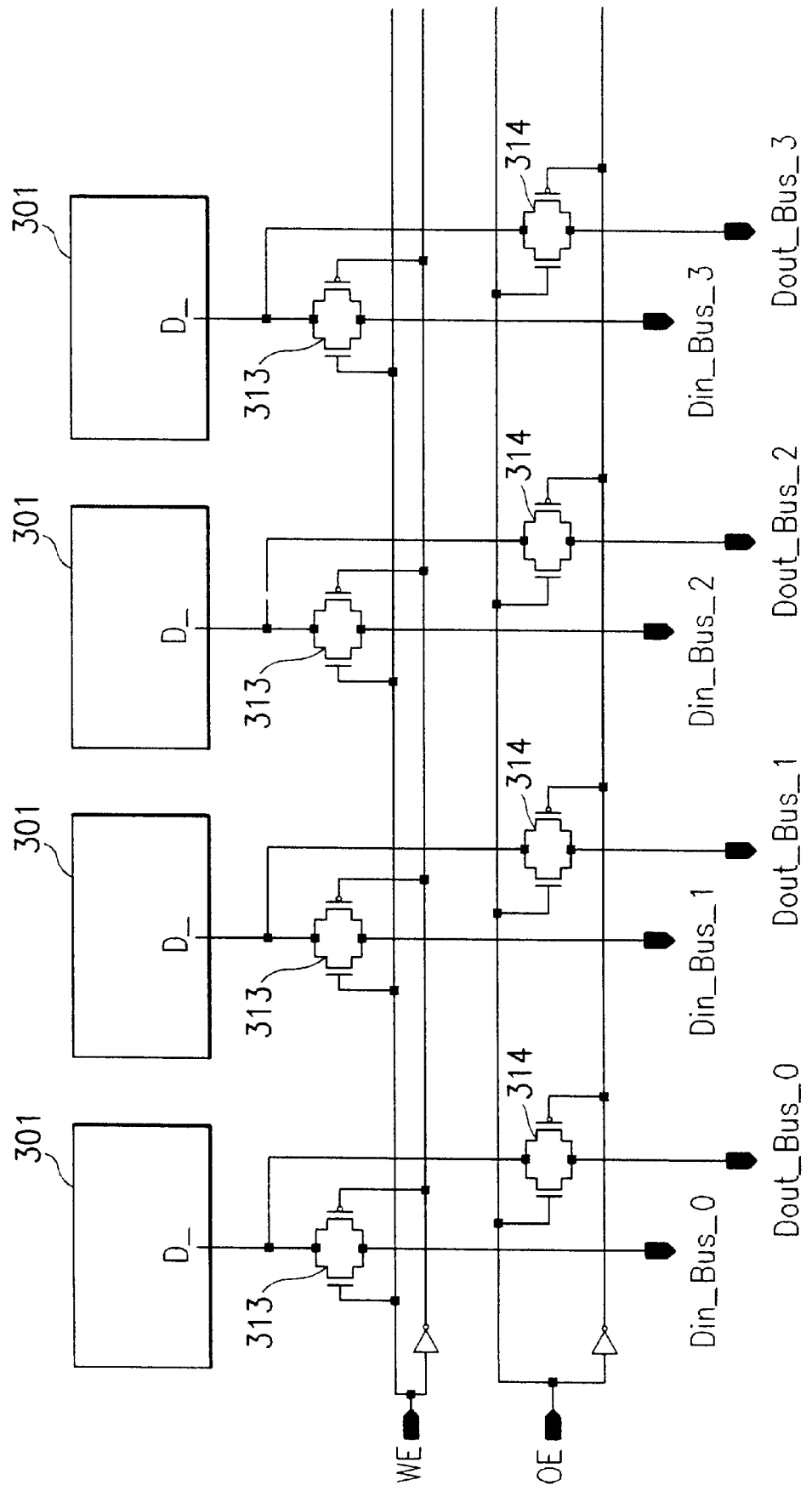
FIG. 43 illustrates a circuitry system of a fifth embodiment input/output bus controller in an SWL ferroelectric memory in accordance with the present invention.
Figure 44:
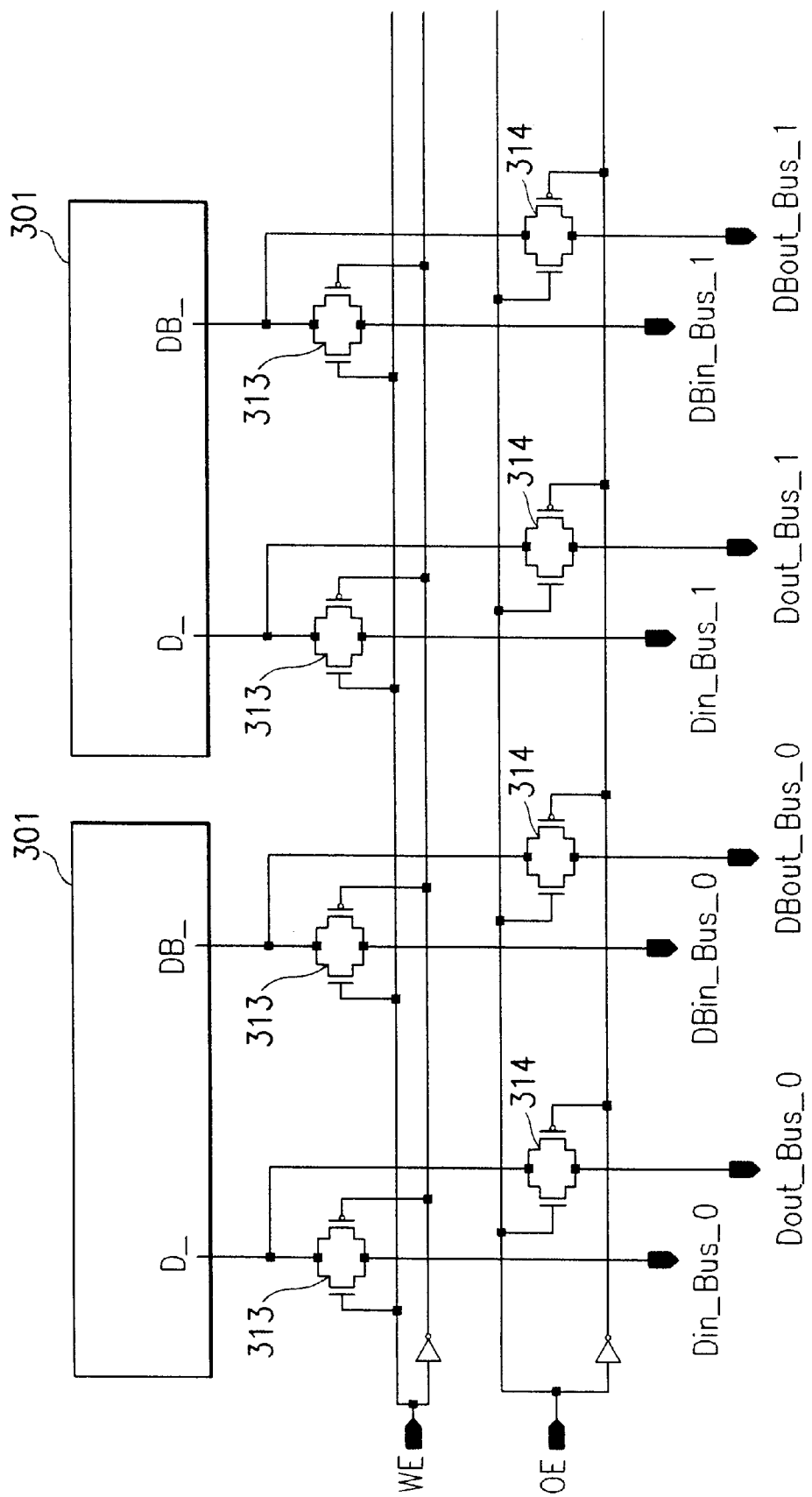
FIG. 44 illustrates a circuitry system of a sixth embodiment input/output bus controller in an SWL ferroelectric memory in accordance with the present invention.

An input/output bus controller in the aforementioned sense amplifier block will be explained with reference to the attached drawings. FIG. 39 illustrates a circuitry system of a first embodiment input/output bus controller in an SWL ferroelectric memory in accordance with the present invention, FIG. 40 illustrates a circuitry system of a second embodiment input/output bus controller in an SWL ferroelectric memory in accordance with the present invention, FIG. 41 illustrates a circuitry system of a third embodiment input/output bus controller in an SWL ferroelectric memory in accordance with the present invention, FIG. 42 illustrates a circuitry system of a fourth embodiment input/output bus controller in an SWL ferroelectric memory in accordance with the present invention, FIG. 43 illustrates a circuitry system of a fifth input/output bus controller in an SWL ferroelectric memory in accordance with the present invention, and FIG. 44 illustrates a circuitry system of a sixth input/output bus controller in an SWL ferroelectric memory in accordance with the present invention. The data bus and the input/output bus controller have different systems depending on whether data input/output of a sense amplifier is made through the same data bus(FIGS. 39 and 40) or not(FIGS. 41, 42, 43 and 44) and whether the memory cell array has main cell sub-blocks and reference cell sub-blocks(FIGS. 39, 41 and 43) or bitlines and bitbarlines (FIGS. 40, 42 and 44).

The first embodiment input/output bus controller of the present invention is assumed to have four sense amplifier blocks in each of the cell array blocks, with a cell array system as shown in FIG. 8, and data input/output of a sense amplifier being made through the same data bus. That is, as shown in FIG. 39, the first embodiment input/output bus controller includes four first switching parts 303 for switching data from data terminals D__ on sense amplifier blocks in response to latch enable signal LED, four buffer parts 304 for buffering the data from the first switching parts 303 in response to the latch enable signal LED, four second switching parts 305 for feeding the data buffered in the buffering parts 304 back to and storing in the buffering parts 304 in response to the latch enable signal LED, four third switching parts 306 for providing data stored in the buffering parts 304 to external data buses Dinout_Bus_0, Dinout_Bus_1, Dinout_Bus_2 and Dinout_Bus_3 in response to write/read signals WRS, and four fourth switching parts 307 for providing data from the external data buses Dinout_Bus_0, Dinout_Bus_1, Dinout_Bus_2 and Dinout_Bus_3 to respective data terminals D__ on the sense amplifier blocks in response to write/read signals WRS. Each of the first, second, third and fourth switching parts 303, 305, 306 and 307 has one transmission gate, the buffering part 304 has more than two even number of inverters, and output data is latched by the buffering part 304 and the second switching part 305.

The second embodiment input/output bus controller of the present invention has a system as shown in FIG. 40. The second embodiment input/output bus controller is provided for a case identical to the first embodiment except that the cell array has a system including bitlines and bitbarlines as shown in FIG. 9 and the bus line has a system including databus Dinout_BUS_0 and Dinout_BUS_1 and data bar bus DBinout_BUS_0 and Dbinout_BUS_1. Accordingly, if one cell array block has four sense amplifier blocks each having a data terminal and a data bar terminal, the first, second, third and fourth switching parts 303, 305, 306 and 307 and the buffering parts 304 will have a system identical to the first embodiment except that eight of them are respectively required because they should be connected to the data terminal and data bar terminal on each of the sense amplifier blocks.

In the meantime, the third embodiment input/output bus controller of the present invention has a system as shown in FIG. 41. The third embodiment input/output bus controller is provided for a case when the cell array has a system as shown in FIG. 8, each of the cell array blocks has four sense amplifier blocks and input and output data buses are provided separately. That is, the third embodiment input/output bus controller of the present invention includes four fifth switching part 308 for providing data from external data buses Din_BUS_0, Din_BUS_1, Din_BUS_2 and Din_BUS_3 to the sense amplifier blocks 301 in response to a write enable signal WE, four sixth switching parts 309 for providing data from data terminals D__ on the sense amplifier blocks 301 in response to a latch enable signal LED, four buffering parts 310 for buffering data from the sixth switching parts 309 in response to the latch enable signal LED, four seventh switching parts 311 for feeding back the data buffered in the buffering parts 310 and storing in the buffering parts 309 in response to the latch enable signal LED, and four eighth switching parts 312 for finally providing data stored in the buffering parts 309 to the external data buses Dout_BUS_0, Dout_BUS_1, Dout_BUS_2 and Dout_BUS_3 in response to an output enable signal OE. The fifth, sixth, seventh and eighth switching parts 308, 309, 311 and 312 respectively have one transmission gate, and the buffering part 310 has more than two even number of inverters.

The fourth embodiment input/output bus controller of the present invention has a system as shown in FIG. 42. The fourth embodiment input/output bus controller is provided for a case when the cell array has a system as shown in FIG. 9 and data input, and output buses are separated. That is, though the fourth embodiment input/output bus controller has a system identical to FIG. 41, since each of the sense amplifier blocks 301 in the fourth embodiment has a data terminal D__ and a data bar terminal DB__, the fourth embodiment input/output bus controller has switching parts two times more than the third embodiment because each of the data bar terminal and the data bar terminal should be provided with switching parts for controlling a data on each of the terminals.

The fifth embodiment input/output bus controller of the present invention has a system as shown in FIG. 43. The fifth embodiment input/output bus controller is provided for a case when the cell array has a system as shown in FIG. 8 and data input, and output buses are separated for simple data input and output. That is, the fifth embodiment input/output bus controller includes ninth switching parts 313 for providing data from data bus Din_BUS 0, Din_BUS_1, Din_BUS_2 and Din_BUS_3 to a data terminal D__ on each of the sense amplifier blocks in response to a write enable signal WE, when there are an external write enable signal and an output enable signal available, and tenth switching parts 314 for providing data from data terminal D__ on each of the sense amplifiers to the data buses Dout_BUS_0, Dout_BUS_1, Dout_BUS_2 and Dout_BUS_3 in response to the output enable signal OE.

The sixth embodiment input/output bus controller of the present invention has a system as shown in FIG. 44. The sixth embodiment input/output bus controller has a system identical to the fifth embodiment except that the cell array has a system as shown in FIG. 9 including bitlines and bitbarlines. That is, as a data terminal D__ and data bar terminal DB__ are provided on each of the sense amplifier blocks, a switching part for data input/output from/to each of the terminals are provided.

Figure 45:
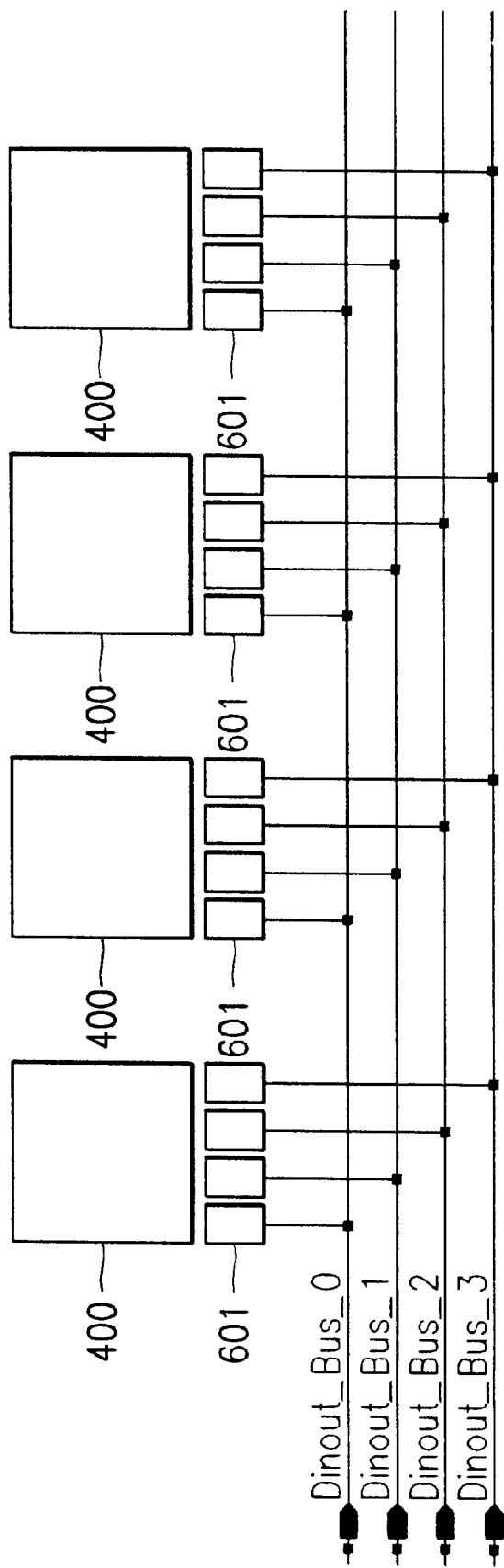
FIG. 45 illustrates a system of a firs t embodiment data bus in accordance with the present invention.

Systems of the data buses according to the aforementioned embodiments will be explained. FIG. 45 illustrates a system of a first embodiment data bus in accordance with the present invention, FIG. 46 illustrates a system of a second embodiment data bus in accordance with the present invention, FIG. 47 illustrates a system of a third embodiment data bus in accordance with the present invention, and FIG. 48 illustrates a system of a fourth embodiment data bus in accordance with the present invention.

Referring to FIG. 45, the first embodiment data bus in accordance with the present invention is provided for a case when data input/output is done through the same bus as shown in FIG. 39. That is, in a case when one cell array block has four core blocks 601, four common input/output data buslines are required. At the end, if a cell array block has four main cell sub-blocks, each sense amplifier block will include two sense amplifiers and data input/output to/from a sense amplifier in each of the sense amplifier blocks will be carried out through a data bus.

Figure 46:
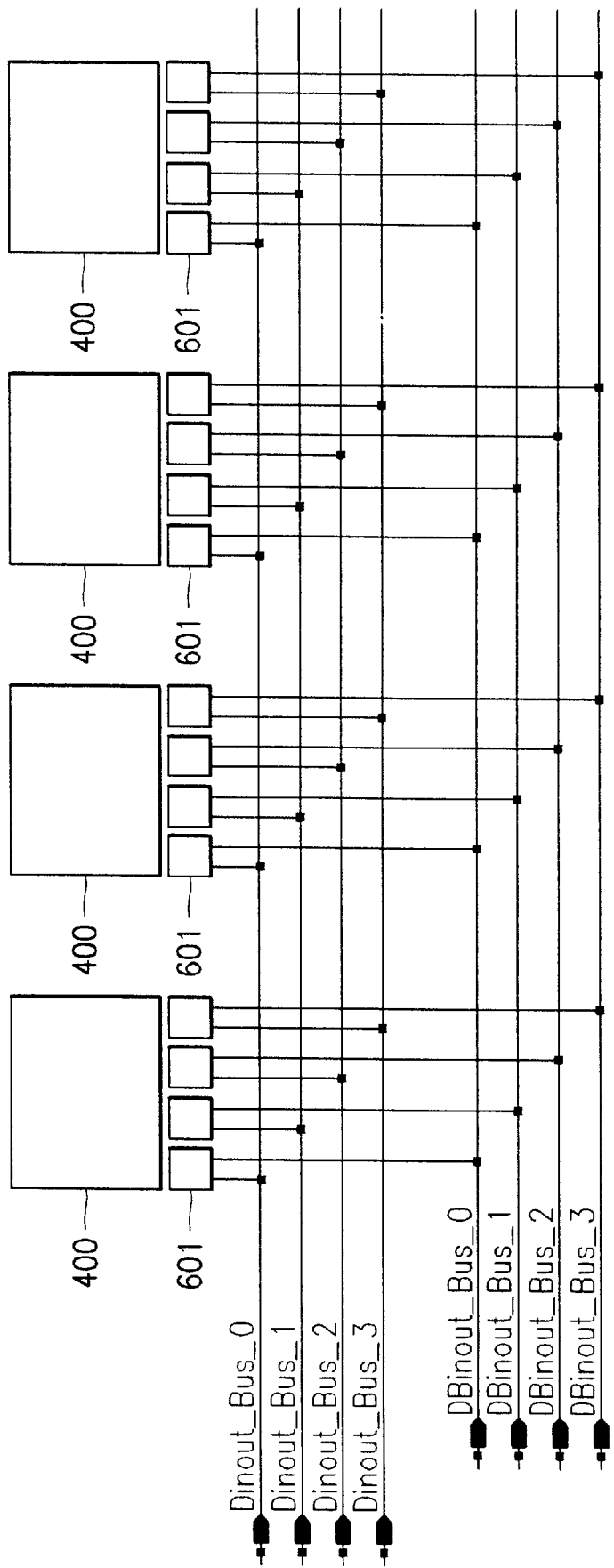
FIG. 46 illustrates a system of a second embodiment data bus in accordance with the present invention.

Referring to FIG. 46, the second embodiment data bus in accordance with the present invention is provided for a case when data input/output is done through the same bus, but with separate dada buses and data bar buses as shown in FIG. 40.

Figure 47:
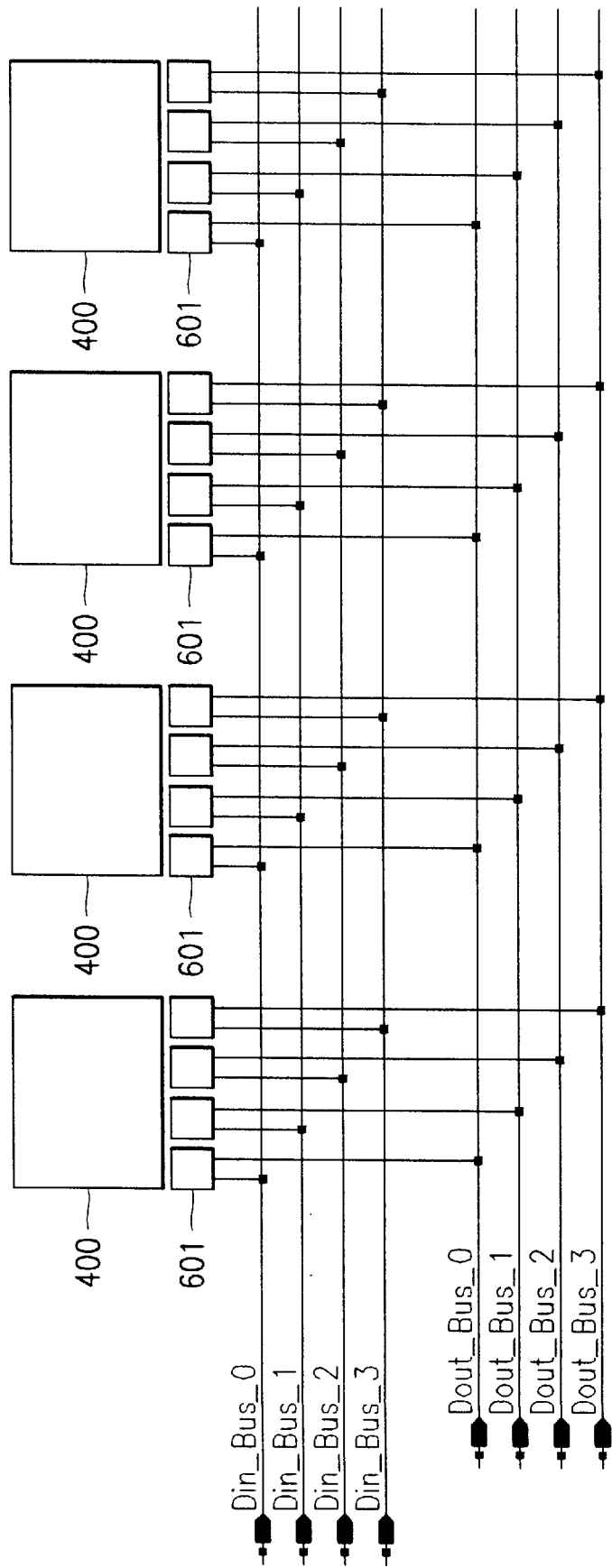
FIG. 47 illustrates a system of a third embodiment data bus in accordance the present invention.
Figure 48:
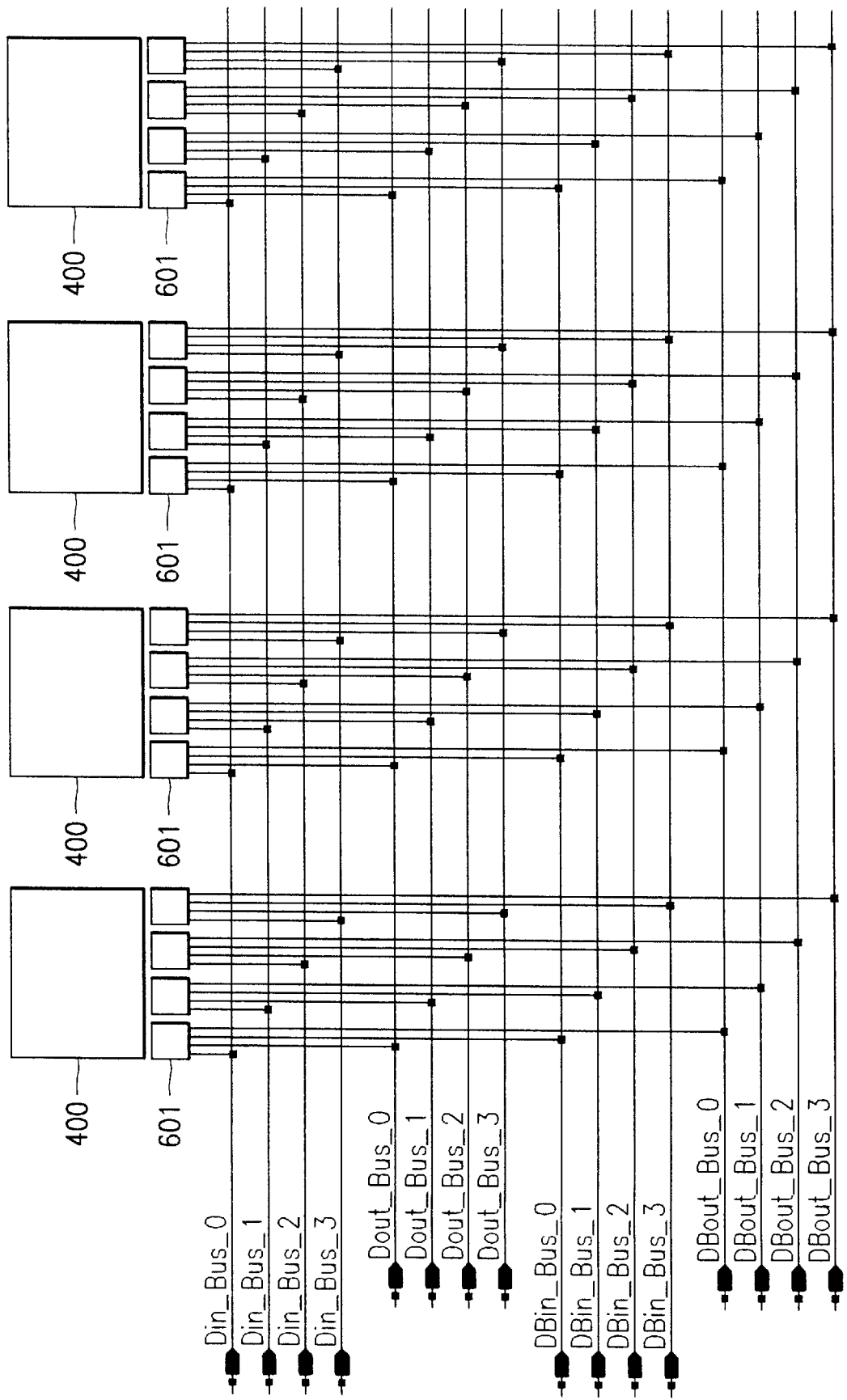
FIG. 48 illustrates a system of a fourth embodiment data bus in accordance with the present invention.

Referring to FIG. 47, the third embodiment data bus in an SWL ferroelectric memory in accordance with the present invention is provided for a case when data input/output is done through separate buses as shown in FIGS. 41 and 43.

Referring to FIG. 48, the fourth embodiment data bus in an SWL ferroelectric memory in accordance with the present invention is provided for a case when data input/output is done through separate data input buses Din_BUS and DBin_BUS and data output buses Dout_BUS and DBout_BUS as shown in FIGS. 42 and 44.

Figure 49:
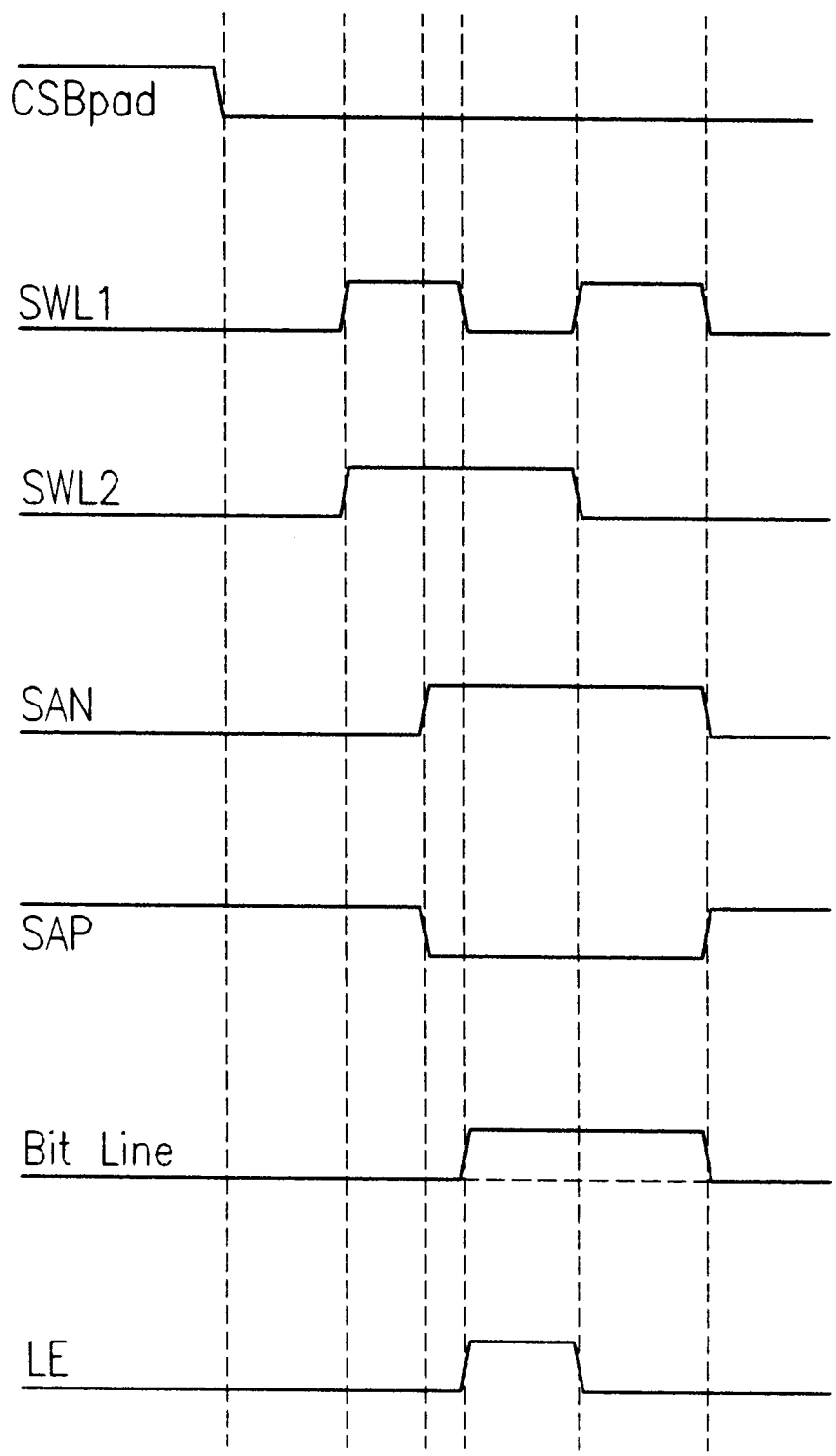
FIG. 49 illustrates an operation timing diagram of the input/output bus controller in accordance with a first preferred embodiment of the present invention.
Figure 50:
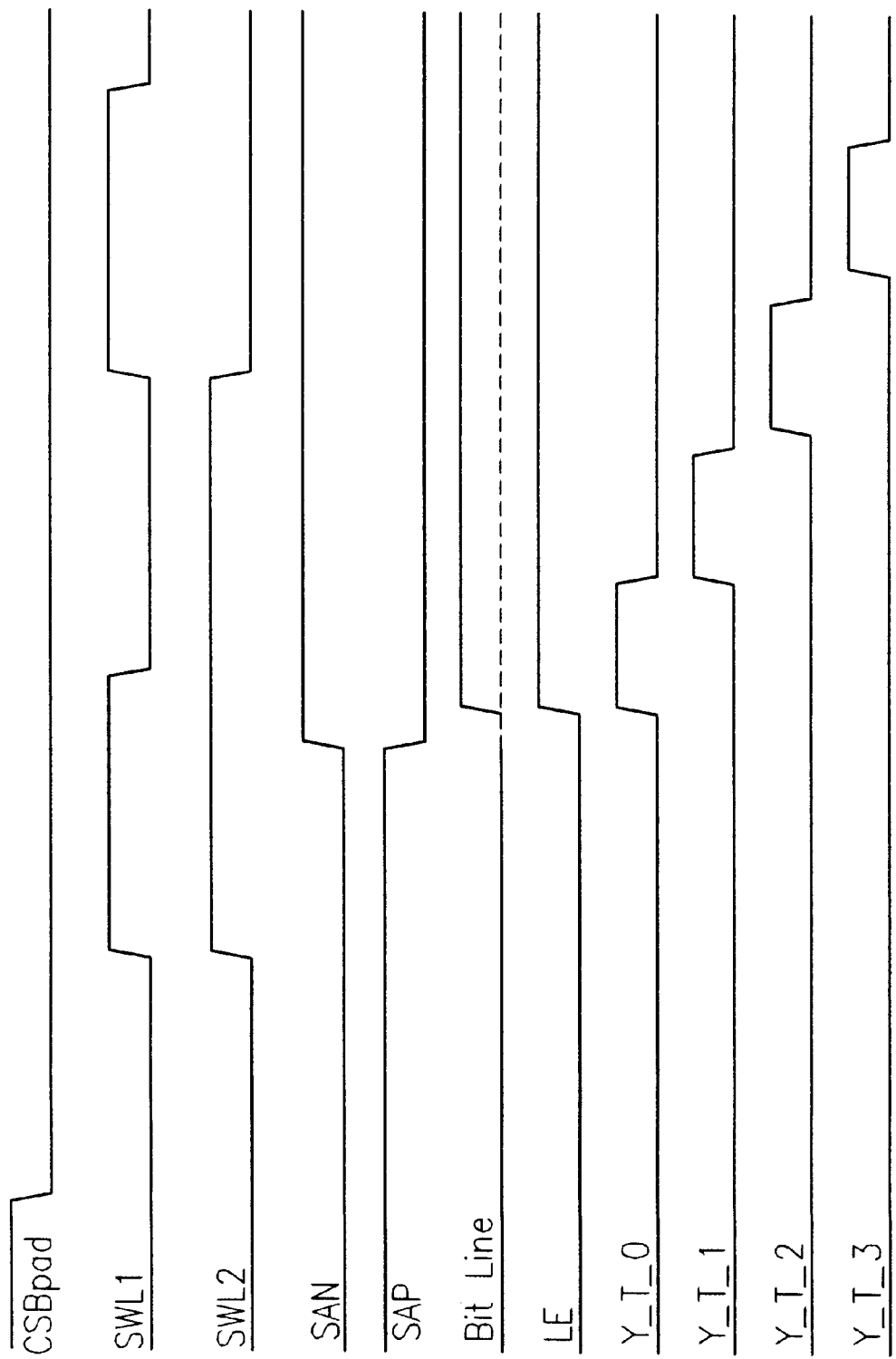
FIG. 50 illustrates an operation timing diagram of the input/output bus controller in accordance with a second preferred embodiment of the present invention; and, FIG. 51 illustrates an operation timing diagram of the input/output bus controller in accordance with a third preferred embodiment of the present invention.
Figure 51:
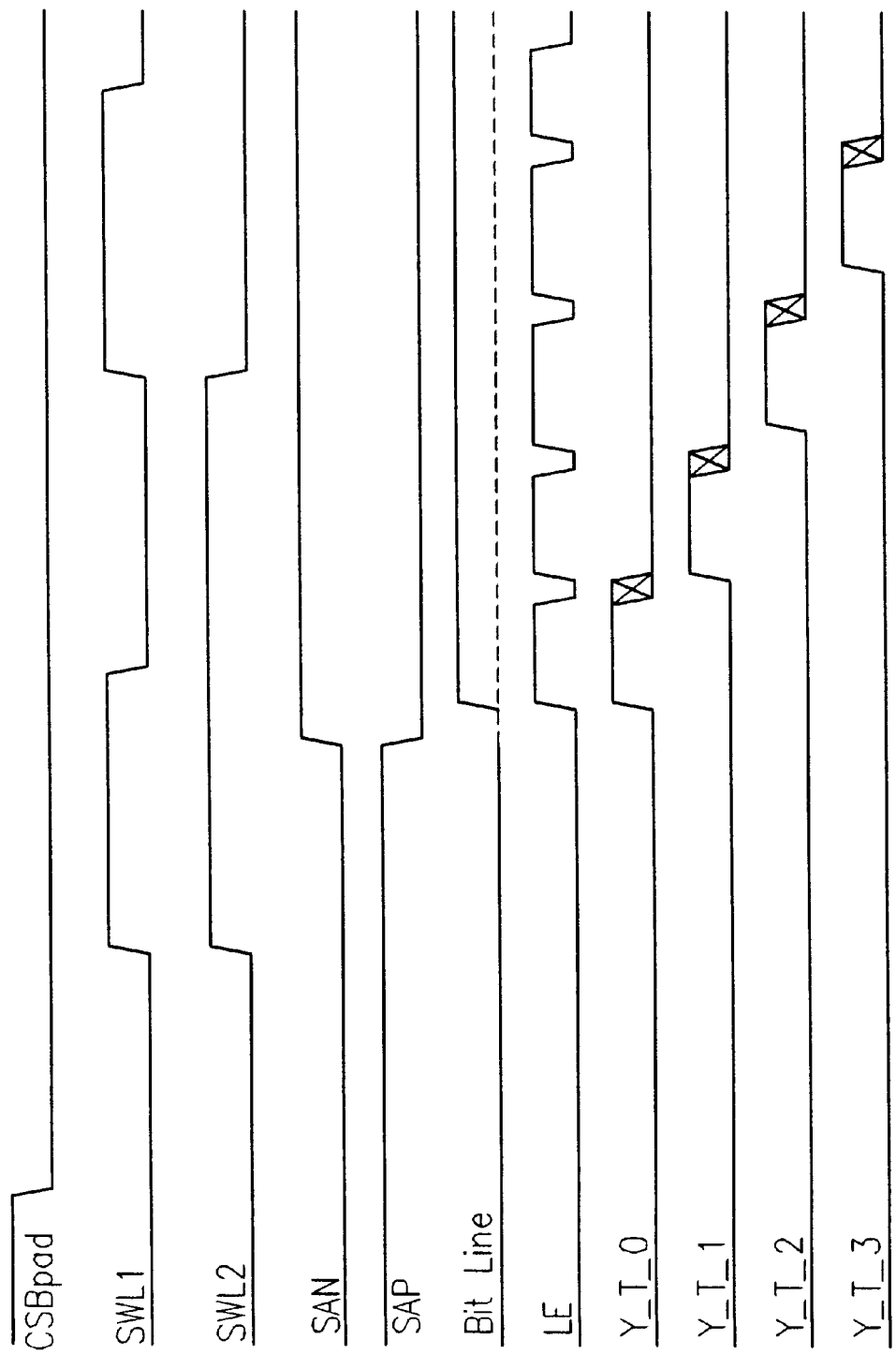

The operation of the aforementioned input/output bus controller of the present invention will be explained. FIG. 49 illustrates an operation timing diagram of the input/output bus controller in accordance with a first preferred embodiment of the present invention, FIG. 50 illustrates an operation timing diagram of the input/output bus controller in accordance with a second preferred embodiment of the present invention, and FIG. 51 illustrates an operation timing diagram of the input/output bus controller in accordance with a third preferred embodiment of the present invention. In general, in a system employing a cache memory, a random access by a CPU to a main memory used in association with such cache memory is mostly processed by the cache memory receiving information in block units from a RAM. In order to transmit data in block units, data may be accessed varying a column address while fixing a row address, or at a few bits of the column addresses in succession, in most of the cases. Therefore, a fast column access function is paid attention, in which a data is accessed at a fast speed, varying a column address while a row address is fixed. There are "m" bitlines each having a sense amplifier; during the SAN and SAP signal, sense amplifier enabling signals, are enabled, m bits of data are amplified and latched by sense amplifiers connected thereto. That is, because the greatest time taking operation in a read mode, from row address application to data sensing, is already completed as "m" bits are sensed already at a time, if the data is read while only changing a column address, an access time period can be reduced significantly, that allows a fast operation. In other words, the operation of data reading after enabling a column selection line of a certain address and data reading another data at another address while a row address is fixed can be made up to "m" bits of data.

FIG. 49 illustrates waveforms in a case when only one column is selected in one row.

When data is loaded on data buses D_BUS_0, D_BUS_1, D_BUS_2 and D_BUS_3 from sense amplifiers upon finish of the sense amplifier operation, a "high" pulse is applied to an output latch signal LED to enable the output latch signal, thereby latching the sense amplifier data at the latching part, making the data stay there even if the sense amplifiers are disabled.

The operation timing diagram of the input/output bus controller in FIG. 50 shows enabling of column address signals Y_T_0, Y_T_1, Y_T_2 and Y_T_3 in succession after extending an enabling time period of the sense amplifier in a read mode. In this instance, the row address signal is fixed to one and the output latch signal LED is kept enabled.

The operation timing diagram of the input/output bus controller in FIG. 51 shows enabling of column address signals Y_T_0, Y_T_1, Y_T_2 and Y_T_3 in succession after extending an enabling time period of the sense amplifier in a read mode, when the output latch signal LED is enabled for only a time period enough to stored data in the latch buffering part in the core block 601 and enabled until a following data is provided. Therefore, following column address signals Y_T_0, Y_T_1, Y_T_2 and Y_T_3 can be enabled quickly, allowing a fast column access speed.

The aforementioned SWL ferroelectric memory and a circuit for driving the same has the following advantages.

First, the provision of split wordlines which also serves as cell plate in a ferroelectric memory allows improvement in a device packing density and an efficiency as a memory because no separate plate line control signal is required in data read and write operations.

Second, though in the system of the background art ferroelectric memory, one reference cell is adapted to be involved in operation of a few hundreds of main memory reading while ferroelectric properties are not assured, requiring a lot more frequent operation of reference cell compared to the main memory cell, that results in a rapid degradation of the properties of the reference cell which causes the reference voltage unstable, since a ratio of a number of the reference cell to that of main memory cell is lowered significantly, the degradation of the reference cell can be prevented.

Third, though, in general, a CSBpad signal only is used as a signal for enabling a ferroelectric memory, as the present invention uses the X-, Y- and Z-ATD signals together with the CSBpad signal, the present invention allows an effective management of memory operation, such as improvements in chip access speed and performance by activating the fast column access mode. That is, in changing addresses, at large, either only the X- and Z-addresses, or only the Y-address is changed, and when operation is still going on upon reception of the CSBpad signal, the X-, Y- and Z-ATD signals are suppressed even if they are received. And, in a case only the X- and Z-addresses are changed, an operation as if the CSBpad signal is enabled can be implemented using the X- and Z-ATD signals because there is no valid data latched at the sense amplifiers, in a case only the Y-address is changed, data latched at the sense amplifiers can be read because split wordlines SWL1 and SWL2 for the row address is fixed, and a regular write operation can be made using the Y-ATD signal in a write mode.

Fourth, the feasibility of plural column data input/output through the same data bus allows the fast column access function in which data is accessed at a fast speed while fixing a row address and changing a column address.

Fifth, the feasibility of plural column data input/output through the same data bus allows a reduction of a chip layout area.

Sixth, since data from the sense amplifier is provided, not to a data bus connected in common with other various cell array blocks directly, but adapted to pass through the core block 601, reducing an output load at the output terminal on the sense amplifier, input/output rates can be improved.

It will be apparent to those skilled in the art that various modifications and variations can be made in the SWL ferroelectric memory and the circuit for driving the same of the present invention without departing from the spirit or scope of the invention. Thus, it is intended that the present invention cover the modifications and variations of this invention provided they come within the scope of the appended claims and their equivalents.

What is claimed is:

1. An SWL(split wordline) ferroelectric memory, comprising:

a cell array having a plurality of split wordlines and a plurality of bitlines for storing a data;

an SWL driver for driving each of the split wordlines in the cell array;

a plurality of sense amplifier blocks for sensing the data on each of the bitlines in the cell array; and, an input/output bus controller for interfacing the sense amplifier blocks and data buses for outputting the data in each of the sense amplifier blocks and inputting the data intended to write.

2. An SWL ferroelectric memory as claimed in claim 1, wherein the input/output bus controller includes, a plurality of first switching parts for switching data from data terminals on the sense amplifier blocks in response to a latch enable signal, a plurality of buffering parts for buffering the data from the first switching parts, a plurality of second switching parts for feeding back and storing the data buffered at the buffering parts in response to the latch enable signal, a plurality of third switching parts for finally forwarding data stored by the second switching parts and the buffering parts to an external data bus in response to a write/read signal, and a plurality of fourth switching parts for providing a data from the external data bus to a data terminal on each of the sense amplifiers in response to the write/read signal.

3. An SWL ferroelectric memory as claimed in claim 2, wherein each of the first, second, third and fourth switching parts includes a transmission gate.

4. An SWL ferroelectric memory as claimed in claim 2, wherein each of the buffering parts includes two or more than two even number of inverters.

5. An SWL ferroelectric memory as claimed in claim 2, wherein the latch enable signal enables column address signals in succession after extending an enabling time period of the sense amplifier in a read mode.

6. An SWL ferroelectric memory as claimed in claim 1, wherein the input/output bus controller includes, a plurality of first switching parts for switching data from data terminals and data bar terminals on the sense amplifier blocks in response to a latch enable signal, a plurality of buffering parts for buffering the data from the first switching parts, a plurality of second switching parts for feeding the data buffered at the buffering parts back to, and storing in the buffering parts in response to the latch enable signal, a plurality of third switching parts for finally forwarding data stored by the second switching parts and the buffering parts to an external data bus and data bar bus in response to a write/read signal, and a plurality of fourth switching parts for providing a data from the external data bus and the data bar bus to a data terminal and a data bar terminal on each of the sense amplifiers in response to the write/read signal.

7. An SWL ferroelectric memory as claimed in claim 1, wherein the input/output bus controller includes, a plurality of fifth switching parts for providing data from an external data bus to a data terminal on each of the sense amplifier blocks in response to a write enable signal, a plurality of sixth switching parts for forwarding data on the data terminals on the sense amplifier blocks in response to a latch enable signal, a plurality of buffering parts for buffering the data from the sixth switching parts, a plurality of seventh switching parts for feeding the data buffered at the buffering parts back to, and storing in the buffering parts in response to the latch enable signal, and a plurality of eighth switching parts for finally forwarding data stored in the seventh switching parts and the buffering parts to an external data bus in response to an output enable signal.

8. An SWL ferroelectric memory as claimed in claim 1, wherein the input/output bus controller includes, a plurality of fifth switching parts for providing data from an external data bus and a data bar bus to a data terminal and a data bar terminal on each of the sense amplifier blocks in response to a write enable signal, a plurality of sixth switching parts for forwarding data on the data terminals and on the data bar terminals on the sense amplifier blocks in response to a latch enable signal, a plurality of buffering parts for buffering the data from the sixth switching parts, a plurality of seventh switching parts for feeding the data buffered at the buffering parts back to, and storing in the buffering parts in response to the latch enable signal, and a plurality of eighth switching parts for finally forwarding data stored in the seventh switching parts and the buffering parts to an external data bus and a data bar bus in response to an output enable signal.

9. An SWL ferroelectric memory as claimed in claim 1, wherein the input/output bus controller includes, a plurality of ninth switching parts for providing a data from an external data bus to a data terminal on the sense amplifier block in response to a write enable signal, and a plurality of tenth switching parts for finally forwarding the data from the data terminal on each of the sense amplifier blocks to an external data bus in response to an output enable signal.

10. An SWL ferroelectric memory as claimed in claim 1, wherein the input/output bus controller includes, a plurality of ninth switching parts for providing a data from external data bus and data bar bus to a data terminal and a data bar terminal on the sense amplifier block in response to a write enable signal, and a plurality of tenth switching parts for finally forwarding the data from the data terminal and the data bar terminal on each of the sense amplifier blocks to an external data bus and a data bar bus in response to an output enable signal.

11. An SWL ferroelectric memory as claimed in claim 1, wherein, when the cell array includes "m" cell array blocks each having "n" sense amplifier blocks each for data input/output, "n" datalines are provided such that the same dataline is connected to the same numbered sense amplifiers in the cell array blocks in common for data transmission.

12. An SWL ferroelectric memory as claimed in claim 11, wherein the datalines include "n" exclusive input datalines and "n" exclusive output datalines.

13. An SWL ferroelectric memory as claimed in claim 11, wherein the datalines include "n" input/output datalines and "n" input/output databar lines.

14. An SWL ferroelectric memory as claimed in claim 11, wherein the datalines include "n" exclusive input datalines and "n" exclusive output datalines and "n" exclusive input databarlines and "n" exclusive output databarlines.

15. An SWL ferroelectric memory as claimed in claim 1, wherein, if the data from the sense amplifiers are loaded on each of the data buses upon completion of a sense amplifier operation, the input/output bus controller keeps latching data even if the sense amplifiers are disabled in response to a latch enable signal.

16. An SWL ferroelectric memory as claimed in claim 1, wherein the input/output bus controller enables column address signals in succession after extending an enabling time period of the sense amplifier in a read mode.

17. An SWL ferroelectric memory as claimed in claim 16, wherein the output latch signal is kept enabled while a row signal is fixed.

18. An SWL ferroelectric memory as claimed in claim 1, wherein, when the input/output bus controller enables column address signals in succession after extending an enabling time period of the sense amplifier in a read mode, the input/output bus controller enables column address signals only for a time period enough to store data in latch buffering parts in a core block until a following data is provided.

* * * * *